(12) United States Patent
Sato

(10) Patent No.: US 8,325,777 B2
(45) Date of Patent: Dec. 4, 2012

(54) SURFACE-EMITTING LASER DEVICE AND SURFACE-EMITTING LASER ARRAY INCLUDING SAME

(75) Inventor: Shunichi Sato, Miyagi (JP)

(73) Assignee: Ricoh Company, Ltd., Tokyo (JP)

( * ) Notice: Subject to any disclaimer, the term of this patent is extended or adjusted under 35 U.S.C. 154(b) by 0 days.

(21) Appl. No.: 12/712,608

(22) Filed: Feb. 25, 2010

(65) Prior Publication Data

US 2010/0150195 A1 Jun. 17, 2010

Related U.S. Application Data

(63) Continuation of application No. 11/836,196, filed on Aug. 9, 2007, now Pat. No. 7,693,204, which is a continuation-in-part of application No. PCT/JP2007/052298, filed on Feb. 2, 2007.

(30) Foreign Application Priority Data

| | | |
|---|---|---|
| Feb. 3, 2006 | (JP) | 2006-027466 |
| Mar. 3, 2006 | (JP) | 2006-057535 |
| Sep. 15, 2006 | (JP) | 2006-250384 |
| Feb. 26, 2007 | (JP) | 2007-046247 |

(51) Int. Cl.
*H01S 5/00* (2006.01)
*H01S 3/08* (2006.01)
(52) U.S. Cl. ........... 372/50.124; 372/43.01; 372/92; 372/99
(58) Field of Classification Search ........ 372/43.01, 372/92, 99, 50.124
See application file for complete search history.

(56) References Cited

U.S. PATENT DOCUMENTS

| | | | |
|---|---|---|---|
| 5,258,990 A | | 11/1993 | Olbright et al. |
| 5,283,447 A | * | 2/1994 | Olbright et al. ............. 257/85 |
| 5,436,466 A | | 7/1995 | Ko et al. |
| 5,493,577 A | * | 2/1996 | Choquette et al. ...... 372/46.013 |
| 5,633,886 A | | 5/1997 | Ramdani et al. |
| 5,748,665 A | | 5/1998 | Jiang et al. |
| 5,904,549 A | | 5/1999 | Sato |

(Continued)

FOREIGN PATENT DOCUMENTS

JP 09-107153 A 4/1997

(Continued)

OTHER PUBLICATIONS

Ueki, N. et al., "Single-Transverse-Mode 3.4-mW Emission of Oxide-Confined 780-nm VCSEL's", IEEE Photonics Technology Letters, vol. 11, No. 12, pp. 1539-1541, Dec. 1999.

(Continued)

*Primary Examiner* — Jessica Stultz
*Assistant Examiner* — Phillip Nguyen
(74) *Attorney, Agent, or Firm* — Oblon, Spivak, McClelland, Maier & Neustadt, L.L.P.

(57) ABSTRACT

A surface-emitting laser device is disclosed that includes a substrate connected to a heat sink; a first reflective layer formed of a semiconductor distributed Bragg reflector on the substrate; a first cavity spacer layer formed in contact with the first reflective layer; an active layer formed in contact with the first cavity spacer layer; a second cavity spacer layer formed in contact with the active layer; and a second reflective layer formed of a semiconductor distributed Bragg reflector in contact with the second cavity spacer layer. The first cavity spacer layer includes a semiconductor material having a thermal conductivity greater than the thermal conductivity of a semiconductor material forming the second cavity spacer layer.

23 Claims, 57 Drawing Sheets

U.S. PATENT DOCUMENTS

| | | | |
|---|---|---|---|
| 5,923,691 A | 7/1999 | Sato | |
| 5,939,733 A | 8/1999 | Sato | |
| 6,002,700 A | 12/1999 | Sato | |
| 6,072,196 A | 6/2000 | Sato | |
| 6,207,973 B1 | 3/2001 | Sato et al. | |
| 6,233,264 B1 | 5/2001 | Sato | |
| 6,281,518 B1 | 8/2001 | Sato | |
| 6,382,800 B2 | 5/2002 | Sato | |
| 6,542,528 B1 | 4/2003 | Sato et al. | |
| 6,563,851 B1 | 5/2003 | Jikutani et al. | |
| 6,614,821 B1 | 9/2003 | Jikutani et al. | |
| 6,674,785 B2 | 1/2004 | Sato et al. | |
| 6,765,232 B2 | 7/2004 | Takahashi et al. | |
| 6,782,032 B2* | 8/2004 | Kondow et al. | 372/92 |
| 6,803,604 B2 | 10/2004 | Takahashi et al. | |
| 6,927,412 B2 | 8/2005 | Takahashi et al. | |
| 6,959,025 B2 | 10/2005 | Jikutani et al. | |
| 6,975,663 B2 | 12/2005 | Sekiya et al. | |
| 7,656,924 B2* | 2/2010 | Shimizu et al. | 372/50.124 |
| 7,720,125 B2 | 5/2010 | Jikutani et al. | |
| 2002/0028526 A1 | 3/2002 | Kurahashi et al. | |
| 2002/0044583 A1 | 4/2002 | Samonji et al. | |
| 2002/0061043 A1 | 5/2002 | Tanaka | |
| 2002/0075929 A1* | 6/2002 | Cunningham | 372/50 |
| 2002/0101899 A1 | 8/2002 | Yokouchi et al. | |
| 2003/0053501 A1 | 3/2003 | Sekiya et al. | |
| 2003/0178711 A1 | 9/2003 | Honda et al. | |
| 2005/0121682 A1 | 6/2005 | Shigihara | |
| 2005/0169334 A1 | 8/2005 | Sato | |
| 2005/0213629 A1* | 9/2005 | Takahashi | 372/50.11 |
| 2005/0230674 A1 | 10/2005 | Takahashi et al. | |
| 2005/0238075 A1 | 10/2005 | Jikutani et al. | |
| 2005/0271092 A1* | 12/2005 | Ledentsov et al. | 372/20 |
| 2005/0271113 A1 | 12/2005 | Song et al. | |
| 2006/0007979 A1 | 1/2006 | Jikutani et al. | |
| 2006/0054899 A1 | 3/2006 | Takahashi et al. | |
| 2006/0093006 A1* | 5/2006 | Jikutani | 372/50.1 |
| 2006/0093010 A1 | 5/2006 | Sekiya et al. | |
| 2006/0261352 A1 | 11/2006 | Takahashi et al. | |
| 2007/0053399 A1* | 3/2007 | Johnson et al. | 372/50.124 |
| 2007/0223546 A1* | 9/2007 | Brenner et al. | 372/43.01 |

FOREIGN PATENT DOCUMENTS

| | | |
|---|---|---|
| JP | 09-199793 A | 7/1997 |
| JP | 11-340570 | 12/1999 |
| JP | 11-354888 | 12/1999 |
| JP | 3050990 | 3/2000 |
| JP | 3095545 | 8/2000 |
| JP | 2002-076433 A | 3/2002 |
| JP | 2002-158406 A | 5/2002 |
| JP | 2002-164621 A | 6/2002 |
| JP | 2002-353568 | 6/2002 |
| JP | 2003-017813 A | 1/2003 |
| JP | 2003-347670 A | 12/2003 |
| JP | 2004-140007 A | 5/2004 |
| JP | 2004-281968 A | 10/2004 |
| JP | 2005-039003 A | 2/2005 |
| JP | 2005-167137 A | 6/2005 |
| JP | 2005-340779 A | 12/2005 |
| JP | 2005-347482 A | 12/2005 |
| JP | 2005-349773 A | 12/2005 |
| JP | 2005-354061 A | 12/2005 |

OTHER PUBLICATIONS

Tansu, N. et al., "Low-Temperature Sensitive, Compressively Strained InGaAsP Active ($\lambda$ =- 0.78-0.85 μm) Region Diode Lasers", IEEE Photonics Technology Letters, vol. 12, No. 6, pp. 603-605, Jun. 2000.

Schneider, R. P. Jr., et al., "GaInAsP/AlGaInP-based near-IR (780 nm) vertical-cavity surface-emitting lasers", Electronics Letters, vol. 31, No. 7, pp. 554-556, Mar. 30, 1995.

Lott, J. A. et al., "Partial Top Dielectric Stack distributed Bragg Reflectors for Red Vertical Cavity Surface Emitting Laser Arrays", IEEE Photonics Technology Letters, vol. 6, No. 12, pp. 1397-1399, Dec. 1994.

Office Action mailed Jun. 9, 2011, in Japanese Patent Application No. 2005-101765 (without English translation).

* cited by examiner

MOLAR AMOUNT OF $Al_x$ IN $Al_x Ga_{1-x} As$ OR $(Al_x Ga_{1-x})_{0.5} In_{0.5} P$

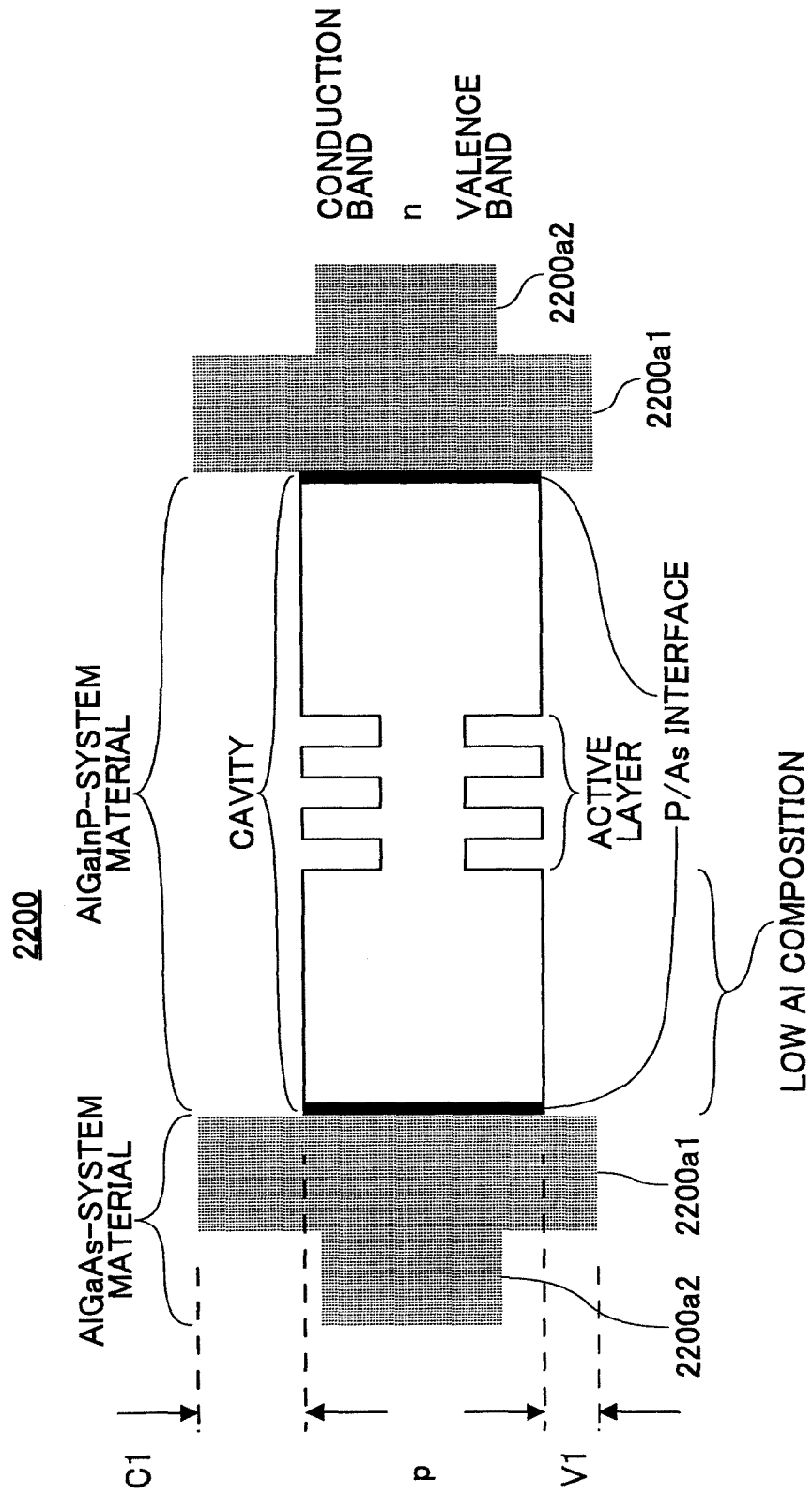

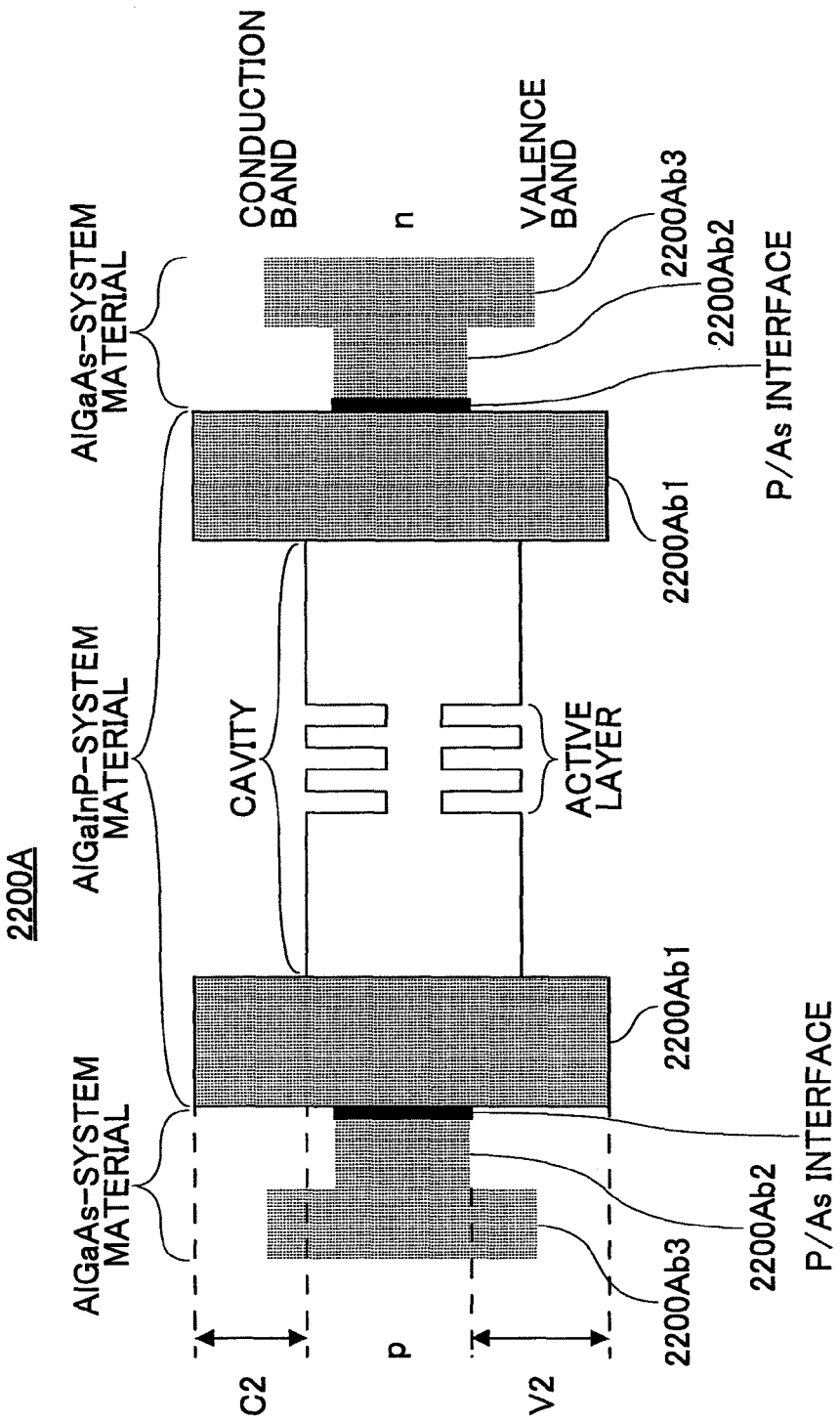

SURFACE-EMITTING LASER DEVICE AND SURFACE-EMITTING LASER ARRAY INCLUDING SAME

CROSS-REFERENCE TO RELATED APPLICATION

This application is a continuation of and claims the benefit of priority from U.S. Ser. No. 11/836,196, filed Aug. 9, 2007, now U.S. Pat. No. 7,693,204 which is a continuation-in-part application of PCT International Application No. PCT/JP2007/052298, filed on Feb. 2, 2007, which claims priority to Japanese Priority Patent Applications No. 2006-027466, filed on Feb. 3, 2006, No. 2006-057535, filed on Mar. 3, 2006, and No. 2006-250384, filed on Sep. 15, 2006.

The present application is also based on Japanese Priority Patent Application No. 2007-046247, filed on Feb. 26, 2007.

The entire contents of the foregoing applications are hereby incorporated by reference.

BACKGROUND OF THE INVENTION

1. Field of the Invention

The present invention relates to a surface-emitting laser device, a surface-emitting laser array including the same, an image forming apparatus including the surface-emitting laser array, an optical pickup unit including the surface-emitting laser device or the surface-emitting laser array, an optical transmitter module including the surface-emitting laser device or the surface-emitting laser array, an optical transmitter receiver module including the surface-emitting laser device or the surface-emitting laser array, an optical communication system including the surface-emitting laser device or the surface-emitting laser array, an optical scanner including the surface-emitting laser array, and an electrophotographic apparatus including the optical scanner.

2. Description of the Related Art

Surface-emitting laser devices (surface-emitting semiconductor laser devices) are semiconductor lasers that emit light in a direction perpendicular to a substrate. Since surface-emitting laser devices achieve high-performance characteristics with low cost compared with edge-emitting laser devices, surface-emitting laser devices are used for consumer applications such as a light source for optical communications such as an optical interconnection, a light source for optical pickups, and a light source for image forming apparatuses.

In particular, surface-emitting laser devices of 850 nm and 980 nm bands enjoy good confinement of carriers in an active layer. More specifically, surface-emitting laser devices of the 850 nm band employ a quantum well active layer formed of gallium arsenide (GaAs) and barrier layers and spacers (cladding layers) formed of aluminum gallium arsenide (AlGaAs).

Further, in surface-emitting laser devices of the 850 nm band, practical-level performance is realized because a current confinement structure using high-performance AlGaAs-system reflecting mirrors (such as semiconductor multilayer-film reflecting mirrors and semiconductor distributed Bragg reflectors [semiconductor DBRs]) and an Al oxide film can be adopted.

However, since the volume of the active layer is small in surface-emitting laser devices, surface-emitting laser devices are lower in light output than edge-emitting lasers, so as to be often required to increase output. In particular, as the wavelength becomes shorter, confinement of carriers in the active layer becomes poorer, thus causing problems such as inability to obtain high output and poor temperature characteristics.

Short-wavelength surface-emitting laser devices having an oscillation wavelength in the 780 nm band adopt a selectively oxidized AlAs layer as a current confinement structure. (See Non-Patent Document 1.) The surface-emitting laser device disclosed in Non-Patent Document 1 has a cavity (resonator) sandwiched between a lower reflecting mirror and a higher reflecting mirror, where the cavity has an active layer sandwiched between spacer layers.

The cavity has one oscillation wavelength's worth of thickness. The active layer has a quantum well structure of alternately stacked well layers of $Al_{0.12}Ga_{0.88}As$ and barrier layers of $Al_{0.3}Ga_{0.7}As$. Further, the spacer layers are formed of $Al_{0.6}Ga_{0.4}As$. Further, the lower reflecting mirror has 40.5 stacked pairs of n-type $Al_{0.3}Ga_{0.7}As$ high refractive index layers and n-type $Al_{0.9}Ga_{0.1}As$ low refractive index layers. In this case, letting the oscillation wavelength of the surface-emitting laser device be $\lambda$, the film thickness of each of the high refractive index layers and low refractive index layers is $\lambda/4$.

Further, the upper reflecting mirror has 24 stacked pairs of p-type $Al_{0.3}Ga_{0.7}As$ high refractive index layers and p-type $Al_{0.9}Ga_{0.1}As$ low refractive index layers. In this case, the film thickness of each of the high refractive index layers and low refractive index layers is also $\lambda/4$.

Further, an AlAs selectively oxidized layer is provided $\lambda/4$ apart from the cavity in the upper reflecting mirror. A composition gradient layer that gradually changes in composition is provided between each adjacent two layers of each of the reflecting mirrors in order to reduce resistance.

The above-described layers such as the active and spacer layers are formed by MOCVD (Metal Organic Chemical Vapor Deposition) or MBE (Molecular Beam Epitaxy).

The surface-emitting laser device disclosed in Non-Patent Document 1 adopts a mesa shape. This mesa shape is formed by successively stacking the lower reflecting mirror, the (lower) spacer layer, the active layer, the (upper) spacer layer, and the upper reflecting mirror on a substrate and thereafter etching the upper reflecting mirror, the (upper) spacer layer, the active layer, and the (lower) spacer layer so as to reach the lower reflecting mirror by dry etching.

Once the mesa shape is formed, the edge surface of an AlAs layer to serve as the AlAs selectively oxidized layer is exposed. Accordingly, the AlAs layer is subjected to heat treatment in steam so as to convert AlAs into an insulator of $Al_xAs_y$, thereby forming a current confinement structure (oxide aperture) that limits the path of a device driving current to the central unoxidized AlAs region.

Thereafter, a p-side electrode is formed on the mesa except for a light exit part (metal aperture) at the top of the mesa, and an n-side electrode is formed on the bottom side of the substrate, thereby completing the surface-emitting laser device.

According to Non-Patent Document 1, an output of 3.4 mW, which is the maximum of a single mode in the 780 nm band, is obtained by optimizing the oxide aperture and the metal aperture.

However, an output of 7 mW has been reported in the 850 nm and 980 nm bands, showing that the surface-emitting laser device of the 780 nm band is inferior in output. One method of increasing this light output is to reduce an increase in the temperature of a light emission part.

As a method of suppressing an increase in the temperature of a light emission part, a configuration that reduces thermal resistance in a surface-emitting laser device having an oscillation wavelength of 850 nm has been proposed (Patent Document 1). This configuration employs AlAs, which is higher in thermal conductivity than AlGaAs, for a large proportion of low refractive index layers disposed in the lower part of a lower reflecting mirror.

Conventional AlGaAs is used for the low refractive index layers of the upper part of the lower reflecting mirror. If the etching surface reaches inside the lower reflecting mirror using AlAs at the time of forming the mesa shape, the exposed AlAs in the lower reflecting mirror is also oxidized at the time of forming an AlAs selectively oxidized layer by oxidation in the process subsequent to the etching, so that the device is insulated or has high resistance. Therefore, in order to avoid this, AlGaAs is used for the low refractive index layers of the upper part of the lower reflecting mirror.

That is, by providing AlGaAs lower in etching rate than AlAs on the upper side of the lower reflecting mirror, the etching surface is positioned inside AlGaAs on the upper side of the lower reflecting mirror.

Further, in surface-emitting laser devices of the 780 nm band, since active aluminum (Al) is added to the active layer, oxygen is captured during growth or processing, so that a nonradiative recombination center is formed in the active layer. This decreases light emission efficiency and reliability.

Therefore, in surface-emitting laser devices of a wavelength band shorter than 850 nm, a surface-emitting laser device of the 780 nm band that adopts an Al-free active region (quantum well active layers and their adjacent layers) in order to prevent formation of the nonradiative recombination center has been proposed (Patent Document 2). Specifically, GaAsP having tensile strain is used for quantum well active layers, GaInP having compressive strain is used for barrier layers, lattice-matching GaInP is used for spacer layers (between cladding layers and the first and third quantum well active layers), and AlGaInP is used for the cladding layers. Adoption of this configuration improves the reliability of the surface-emitting laser device.

Further, there has been proposed a surface-emitting laser device of the 780 nm band that, besides producing the effect due to the Al-free active region, uses GaInPAs having compressive strain for quantum well layers, uses lattice-matching GaInP or GaInP having tensile strain for barrier layers, and uses AlGaInP greater in Al composition than spacer layers for cladding layers in order to increase the gain of the active layer (Non-Patent Document 2). Compared with the structure of the surface-emitting laser device disclosed in Patent Document 1, this surface-emitting laser device, which has lattice-matching barrier layers and has a greater band gap than compressive strain composition, enjoys good carrier confinement.

However, there is a problem in that surface-emitting laser devices of short oscillation wavelengths are low in output.

Meanwhile, since surface-emitting lasers consume less power, have better mode stability, and are highly integrated more easily than edge-emitting lasers, their research and development have been active of late in expectation of application to the communication field and the image recording field.

In semiconductor lasers, the oscillation wavelength is determined by the band gap of the material of an active layer. In the visible range to the near infrared range, studies have been made of AlGaAs-system and (Al)GaInP-system materials. Of these, AlGaAs-system materials in particular have long been studied with many reports, and as reported in Non-Patent Document 1, a single-mode output characteristic of over 3 mW is realized with respect to surface-emitting laser devices. Products using the characteristic have already been commercially available.

However, in semiconductor lasers, Al is regarded as a cause of device degradation. Since AlGaAs-system materials inherently contain a cause of degradation, it is difficult to realize a highly reliable device with AlGaAs-system materials. On the other hand, it is relatively easy to realize a highly reliable device with GaInP-system and GaInAsP-system materials since Al is not contained in the active layer.

Meanwhile, surface-emitting laser devices have a structure where a cavity is vertically sandwiched between multilayer films each formed of two types of materials different in refractive index. Combinations of the two types of materials include $Al_xGa_{1-x}As/Al_yGa_{1-y}As$, $(Al_xGa_{1-x})_{0.5}In_{0.5}P/(Al_xGa_{1-x})_{0.5}In_{0.5}P$, and $Al_xGa_{1-x}As/(Al_yGa_{1-y})_{0.5}In_{0.5}P$ ($0 \leq x, y \leq 1$, and $x \neq y$). These material systems and compositions are suitably determined in accordance with the oscillation wavelength.

Further, surface-emitting laser devices have high device resistance for structural reasons so as to be characterized in that heat generated in the active layer is less likely to be emitted outside. That is, it is necessary to solve these problems in order to develop surface-emitting laser devices having good characteristics. In order to solve the former problem, a composition gradient layer is provided at each interface of the two types of materials forming each reflecting mirror. In order to solve the latter problem, materials having good thermal conductivity are employed.

With respect to the material conductivity, AlGaAs-system materials are better in thermal conductivity than AlGaInP-system materials if Al composition is the same. Non-Patent Document 3 reports a surface-emitting laser device using $AlAs/Al_{0.25}Ga_{0.75}As$.

However, in this reported case, $(Al_{0.5}Ga_{0.5})_{0.5}In_{0.5}P$ is employed as cavity spacers, and this material is joined to $Al_{0.25}Ga_{0.75}As$ forming reflecting mirrors. However, the band discontinuity of the valence bands of these materials is relatively large, which may cause an increase in device resistance.

The case of joining AlGaAs-system reflecting mirrors and an AlGaInP-system cavity is disclosed in Non-Patent Document 4, but cannot avoid the same problem, either.

Further, in the case of successively causing crystal growth of an AlGaInP-system material and an AlGaAs-system material, it is necessary to switch the V-group material from a P material (such as $PH_3$ to an As material (such as $AsH_3$) after growth of the AlGaInP-system material. At this point, it is highly possible that a defect is introduced at their interface to cause various problems. In Patent Document 3, the possibility of the above-described increase in device resistance is low, but there is no description of the above-described P-containing material/As-containing material interface.

On the other hand, Patent Document 4 discloses a configuration where only an n-side reflecting mirror or each of a p-side reflecting mirror and the n-side reflecting mirror is formed of an AlGaInP-system material. However, since the AlGaInP-system material is inferior in thermal conductivity to the AlGaAs-system material, the temperature of the active layer is likely to increase during oscillation so as to degrade many characteristics.

Meanwhile, in image recording in electrophotography, image recording methods using a laser are widely used as image recording means for obtaining high-definition image quality. In the case of electrophotography, it is common to form a (sub scanning) latent image on a photosensitive drum by causing the drum to rotate while causing a laser to perform scanning (main scanning) in the axial direction of the drum using a polygon mirror.

Further, in the field of electrophotography, high-definition images and high-speed image recording are required. These may be realized by increasing laser output or the sensitivity of a photosensitive body while increasing the speed of main scanning and sub scanning. In the case of increasing image recording speed by this method, however, many problems such as development of a light source for high laser output or a highly sensitive photosensitive body, reinforcement of a housing that supports high-speed main and sub scanning, and development of a position control method at the time of high-speed scanning, thus necessitating expenditure of large amounts of money and time. Further, with respect to high-definition images, if the resolution of an image is doubled, the time required for each of main scanning and sub scanning is also doubled, so that the time required for outputting the image is quadrupled. Accordingly, it is also necessary to simultaneously achieve high-speed image outputting in order to realize high-definition images.

Another method for achieving high-speed image outputting may be to employ a multi-beam laser (multiple lasers). It is common to use multiple lasers in current high-speed output machines. Employment of multiple lasers expands the area in which a latent image is formed with a single main scan. In the case of using n lasers, the above-described latent image formation area is n times as large and the time required for image recording is 1/n times as much as in the case of using a single laser.

As such a case, a multi-beam semiconductor laser having multiple light emission sources in a single chip is proposed in Patent Document 5. However, with a configuration using an edge-emitting semiconductor laser as described in Patent Document 5, the number of beams is about four or at most eight for structural and cost reasons, so that it is impossible to support high-speed image outputting, which is expected to make progress in the future.

On the other hand, two-dimensional integration is easy for surface-emitting laser devices as described above. By modifying or varying the integration method, it is possible to make the actual beam pitch narrower and to integrate as many light-emitting devices as possible onto a single chip.

However, conventional surface-emitting laser devices have the problem of low output because carrier confinement is insufficient and heat generated in the active layer is less likely to be transferred outside.

[Patent Document 1] Japanese Laid-Open Patent Application No. 2002-164621
[Patent Document 2] Japanese Laid-Open Patent Application No. 9-107153
[Patent Document 3] Japanese Laid-Open Patent Application No. 2004-281968
[Patent Document 4] Japanese Laid-Open Patent Application No. 2002-158406
[Patent Document 5] Japanese Laid-Open Patent Application No. 11-340570
[Non-Patent Document 1] Ueki, N. et al.; "Single-Transverse-Mode 3.4-mW Emission of Oxide-Confined 780-nm VCSEL's," *IEEE PHOTONICS TECHNOLOGY LETTERS*, 11, No. 12, 1539-1541 (1999)
[Non-Patent Document 2] Tansu, N. et al.; "Low-Temperature Sensitive, Compressively Strained InGaAsP Active ($\lambda$=0.78-0.85 µm) Region Diode Lasers," *IEEE PHOTONICS TECHNOLOGY LETTERS*, 12, No. 6, 603-605 (2000)
[Non-Patent Document 3] Schneider, R. P. Jr. et al.; "GaInAsP/AlGaInP-based near-IR (780 nm) vertical-cavity surface-emitting lasers," *ELECTRONICS LETTERS*, 31, No. 7, 554-556 (1995)
[Non-Patent Document 4] Lott, J. A. et al.; "Partial top dielectric stack distributed Bragg reflectors for red vertical cavity surface emitting laser arrays," *IEEE PHOTONICS TECHNOLOGY LETTERS*, 6, No. 12, 1397-1399 (1994)

SUMMARY OF THE INVENTION

Embodiments of the present invention may solve or reduce one or more of the above-described problems.

According to one embodiment of the present invention, there is provided a surface-emitting laser device in which one or more of the above-described problems may be solved or reduced.

According to one embodiment of the present invention, there are provided a surface-emitting laser array including the surface-emitting laser device, an image forming apparatus including the surface-emitting laser array, an optical pickup unit including the surface-emitting laser device or the surface-emitting laser array, an optical transmitter module including the surface-emitting laser device or the surface-emitting laser array, an optical transmitter receiver module including the surface-emitting laser device or the surface-emitting laser array, an optical communication system including the surface-emitting laser device or the surface-emitting laser array, an optical scanner including the surface-emitting laser array, and an electrophotographic apparatus including the optical scanner.

According to one embodiment of the present invention, there is provided a surface-emitting laser device that can have high output.

According to one embodiment of the present invention, there is provided a surface-emitting laser array having a surface-emitting laser device that can have high output.

According to one embodiment of the present invention, there is provided an image forming apparatus having a surface-emitting laser device that can have high output.

According to one embodiment of the present invention, there is provided an optical pickup unit having a surface-emitting laser device that can have high output or a surface-emitting laser array using the surface-emitting laser device.

According to one embodiment of the present invention, there is provided an optical transmitter module having a surface-emitting laser device that can have high output or a surface-emitting laser array using the surface-emitting laser device.

According to one embodiment of the present invention, there is provided an optical transmitter receiver module having a surface-emitting laser device that can have high output or a surface-emitting laser array using the surface-emitting laser device.

According to one embodiment of the present invention, there is provided an optical communication system having a surface-emitting laser device that can have high output or a surface-emitting laser array using the surface-emitting laser device.

According to one embodiment of the present invention, there is provided an optical scanner having a surface-emitting laser array including a surface-emitting laser device that can have high output.

According to one embodiment of the present invention, there is provided an electrophotographic apparatus using a surface-emitting laser array including a surface-emitting laser device that can have high output.

According to one embodiment of the present invention, there is provided a surface-emitting laser device including a substrate connected to a heat sink; a first reflective layer formed of a semiconductor distributed Bragg reflector on the substrate; a first cavity spacer layer formed in contact with the first reflective layer; an active layer formed in contact with the first cavity spacer layer; a second cavity spacer layer formed in contact with the active layer; and a second reflective layer formed of a semiconductor distributed Bragg reflector in contact with the second cavity spacer layer, wherein the first cavity spacer layer includes a semiconductor material having a thermal conductivity greater than a thermal conductivity of a semiconductor material forming the second cavity spacer layer.

According to one embodiment of the present invention, there is provided a surface-emitting laser device including a substrate connected to a heat sink; a first reflective layer formed of a semiconductor distributed Bragg reflector on the substrate; a first cavity spacer layer formed in contact with the first reflective layer; an active layer formed in contact with the first cavity spacer layer; a second cavity spacer layer formed in contact with the active layer; and a second reflective layer formed of a semiconductor distributed Bragg reflector in contact with the second cavity spacer layer, wherein the active layer includes a well layer formed of $Ga_aIn_{1-a}P_bAs_{1-b}$ ($0 \leq a \leq 1$, $0 \leq b \leq 1$); and a barrier layer formed of $(Ga_cIn_{1-c})_dP_{1-d}As$ ($0 \leq c \leq 1$, $0 \leq d \leq 1$) having a band gap greater than a band gap of the well layer; the first reflective layer includes a plurality of low refractive index layers formed of $Al_xGa_{1-x}As$ ($0 < x \leq 1$); and a plurality of high refractive index layers formed of $Al_yGa_{1-y}As$ ($0 < y < x \leq 1$); a part of at least one of the first and second cavity spacer layers is formed of AlGaInP; one of the low refractive index layers forming the second reflective layer which one is disposed closest to the active layer is formed of $(Al_eGa_{1-e})_fIn_{1-f}P$ ($0 < e \leq 1$, $0 \leq f \leq 1$); and one of the low refractive index layers forming the first reflective layer which one is disposed closest to the active layer is formed of $Al_xGa_{1-x}As$ ($0 < x \leq 1$) having a thermal conductivity greater than a thermal conductivity of said $(Al_eGa_{1-e})_fIn_{1-f}P$.

According to one embodiment of the present invention, there is provided a surface-emitting laser device including a substrate connected to a heat sink; a first reflective layer formed of a semiconductor distributed Bragg reflector on the substrate; a first cavity spacer layer formed in contact with the first reflective layer; an active layer formed in contact with the first cavity spacer layer; a second cavity spacer layer formed in contact with the active layer; and a second reflective layer formed of a semiconductor distributed Bragg reflector in contact with the second cavity spacer layer, wherein the active layer includes a well layer formed of $Ga_aIn_{1-a}P_bAs_{1-b}$ ($0 \leq a \leq 1$, $0 \leq b \leq 1$); and a barrier layer formed of $(Ga_cIn_{1-c})_dP_{1-d}As$ ($0 \leq c \leq 1$, $0 \leq d \leq 1$) having a band gap greater than a band gap of the well layer; the first reflective layer includes a plurality of low refractive index layers formed of $Al_xGa_{1-x}As$ ($0 < x \leq 1$); and a plurality of high refractive index layers formed of $Al_yGa_{1-y}As$ ($0 < y < x \leq 1$); a part of the second cavity spacer layer is formed of $(Al_eGa_{1-e})_fIn_{1-f}P$ ($0 < e \leq 1$, $0 \leq f \leq 1$); and the first cavity spacer layer includes a semiconductor material at a symmetric position of a position at which the second cavity spacer layer includes said $(Al_eGa_{1-e})_fIn_{1-f}P$ with respect to the active layer, the semiconductor material having a thermal conductivity greater than a thermal conductivity of said $(Al_eGa_{1-e})_fIn_{1-f}P$.

According to one embodiment of the present invention, there is provided a surface-emitting laser device including a substrate connected to a heat sink; a first reflective layer formed of a semiconductor distributed Bragg reflector on the substrate; a first cavity spacer layer formed in contact with the first reflective layer; an active layer formed in contact with the first cavity spacer layer; a second cavity spacer layer formed in contact with the active layer; and a second reflective layer formed of a semiconductor distributed Bragg reflector in contact with the second cavity spacer layer, wherein the first reflective layer includes a plurality of low refractive index layers and the second reflective layer includes a plurality of low refractive index layers; and a thermal conductivity of a semiconductor material of one of the low refractive index layers of the first reflective layer which one is disposed closest to the active layer is greater than a thermal conductivity of a semiconductor material of one of the low refractive index layers of the second reflective layer which one is disposed closest to the active layer.

According to one aspect of the present invention, in a surface-emitting laser device, a cavity spacer layer and/or a reflective layer disposed on the substrate side of an active layer is formed of a semiconductor material higher in thermal conductivity than the semiconductor materials of a cavity spacer layer and a reflective layer disposed on the light output side of the active layer. Accordingly, heat generated in the active layer is emitted to the substrate, so that an increase in the temperature of the active layer is suppressed.

Accordingly, the temperature characteristics of the surface-emitting laser device are improved so that the surface-emitting laser device can have high output.

According to one embodiment of the present invention, there is provided a surface-emitting laser array including a surface-emitting laser device according to the present invention.

Since the surface-emitting laser array includes one or more surface-emitting laser devices according to the present invention, it is possible to reduce the intervals at which the surface-emitting laser devices are disposed, so that it is possible to dispose the surface-emitting laser devices at high density.

According to one embodiment of the present invention, there is provided an image forming apparatus including a surface-emitting laser array as a light source for writing, the surface-emitting laser array including a plurality of surface-emitting laser devices according to the present invention.

Since the image forming apparatus includes surface-emitting laser devices or a surface-emitting laser array according to the present invention, the image forming apparatus can perform writing onto a photosensitive body with an increased number of surface-emitting laser devices. That is, the image forming apparatus can perform writing onto a photosensitive body with increased dot density.

According to one embodiment of the present invention, there is provided an optical pickup unit including a surface-emitting laser device or a surface-emitting laser array according to the present invention as a light source.

Since the optical pickup unit includes one or more surface-emitting laser devices or a surface-emitting laser array according to the present invention as a light source, the optical pickup unit can record information on or reproduce information from an optical disk with multiple laser beams.

According to one embodiment of the present invention, there is provided an optical transmitter module including a surface-emitting laser device or a surface-emitting laser array according to the present invention as a light source.

Since the optical transmitter module includes one or more surface-emitting laser devices or a surface-emitting laser array according to the present invention as a light source, the optical transmitter module can transmit a signal with multiple laser beams. That is, the optical transmitter module can transmit a signal at high transmission rate.

According to one embodiment of the present invention, there is provided an optical transmitter receiver module including a surface-emitting laser device or a surface-emitting laser array according to the present invention as a light source.

Since the optical transmitter receiver module includes one or more surface-emitting laser devices or a surface-emitting laser array according to the present invention as a light source, the optical transmitter receiver module can communicate a signal with multiple laser beams. That is, the optical transmitter receiver module can communicate a signal at high rate.

According to one embodiment of the present invention, there is provided an optical communication system including a surface-emitting laser device or a surface-emitting laser array according to the present invention as a light source.

Since the optical communication system includes one or more surface-emitting laser devices or a surface-emitting laser array according to the present invention as a light source, it is possible to increase the speed of the entire system.

According to one embodiment of the present invention, there is provided a surface-emitting laser device including a first reflective layer formed of a semiconductor distributed Bragg reflector on a substrate; a second reflective layer formed in contact with the first reflective layer; a cavity including an active layer, the cavity being formed in contact with the second reflective layer; a third reflective layer formed in contact with the cavity; and a fourth reflective layer formed in contact with the third reflective layer, wherein the cavity is formed of an AlGaInPAs-system material; the second reflective layer includes a layered body of N first high refractive index layers and N first low refractive index layers that are alternately stacked, where N is a positive integer; the third reflective layer includes a layered body of M second high refractive index layers and M second low refractive index layers that are alternately stacked, where M is a positive integer; each of the N first low refractive index layers and the M second low refractive index layers is formed of $(Al_xGa_{1-x})_{0.5}In_{0.5}P$ ($0 \leq x \leq 1$); each of the N first high refractive index layers and the M second high refractive index layers is formed of $(Al_yGa_{1-y})_{0.5}In_{0.5}P$ ($0 \leq y < x \leq 1$); one of the N first low refractive index layers is in contact with the cavity, and one of the N first high refractive index layers is in contact with an AlGaAs-system material forming the first reflective layer; and one of the M second low refractive index layers is in contact with the cavity, and one of the M second high refractive index layers is in contact with an AlGaAs-system material forming the fourth reflective layer.

According to one embodiment of the present invention, there is provided a surface-emitting laser device including a first reflective layer stacked on a substrate; a cavity stacked on the first reflective layer, the cavity being formed of an AlGaInPAs-system material; a second reflective layer stacked on the cavity, the second reflective layer including a layered body of N stacked pairs of a high refractive index layer and a low refractive index layer, where N is a positive integer; and a third reflective layer stacked on the second reflective layer, the third reflective layer including a layer formed of an AlGaAs-system material, wherein the N low refractive index layers are formed of $(Al_xGa_{1-x})_{0.5}In_{0.5}P$ ($0 \leq x \leq 1$), the N high refractive index layers are formed of $(Al_yGa_{1-y})_{0.5}In_{0.5}P$ ($0 \leq y < x \leq 1$), and the layered body has one of the N high refractive index layers thereof in contact with the layer of the third reflective layer formed of the AlGaAs-system material.

In a surface-emitting laser device according to one embodiment of the present invention, the low refractive index layers of reflective layers formed in contact with a cavity are formed of $(Al_xGa_{1-x})_{0.5}In_{0.5}P$ ($0 \leq x \leq 1$), the high refractive index layers of the reflective layers formed in contact with the cavity are formed of $(Al_yGa_{1-y})_{0.5}In_{0.5}P$ ($0 \leq y < x \leq 1$), and the cavity is formed of an AlGaInPAs-system material. As a result, it is possible to confine carriers in an active layer, and to reduce the resistances of the reflective layers formed in contact with the cavity. Accordingly, the surface-emitting laser device can have high output.

According to one embodiment of the present invention, there is provided a surface-emitting laser array including a plurality of surface-emitting laser devices according to the present invention, wherein the surface-emitting laser devices are disposed at corresponding intersection points of a plurality of equally spaced first baselines and a plurality of equally spaced second baselines, the second baselines each forming a predetermined angle with the first baselines.

According to one embodiment of the present invention, there is provided an optical scanner including a surface-emitting laser array including a plurality of surface-emitting laser devices according to the present invention, wherein the surface-emitting laser devices are disposed at corresponding intersection points of a plurality of equally spaced first baselines and a plurality of equally spaced second baselines, the second baselines each forming a predetermined angle with the first baselines; a light-receiving part configured to receive laser light emitted from the surface-emitting laser array; and a movement part configured to move the light-receiving part onto an optical axis of the emitted laser light at a time other than a time of image recording.

According to one embodiment of the present invention, there is provided an optical scanner including a surface-emitting laser array including a plurality of surface-emitting laser devices according to the present invention, wherein the surface-emitting laser devices are disposed at corresponding intersection points of a plurality of equally spaced first baselines and a plurality of equally spaced second baselines, the second baselines each forming a predetermined angle with the first baselines; a light-receiving part configured to receive a part of laser light emitted from the surface-emitting laser array; and a light guide part configured to guide the part of the emitted laser light to the light-receiving part.

According to one embodiment of the present invention, there is provided an electrophotographic apparatus including an optical scanner, the optical scanner including a surface-emitting laser array including a plurality of surface-emitting laser devices according to the present invention, wherein the surface-emitting laser devices are disposed at corresponding intersection points of a plurality of equally spaced first baselines and a plurality of equally spaced second baselines, the second baselines each forming a predetermined angle with the first baselines; a light-receiving part configured to receive a part of laser light emitted from the surface-emitting laser array; and a light guide part configured to guide the part of the emitted laser light to the light-receiving part.

BRIEF DESCRIPTION OF THE DRAWINGS

Other objects, features and advantages of the present invention will become more apparent from the following detailed description when read in conjunction with the accompanying drawings, in which:

FIG. 27A is an energy band diagram of the cavity and the reflective layers of a conventional surface-emitting laser device, and FIG. 27B is an energy band diagram of the cavity and the reflective layers of another conventional surface-emitting laser device;

DETAILED DESCRIPTION OF THE PREFERRED EMBODIMENTS

Figure 1:
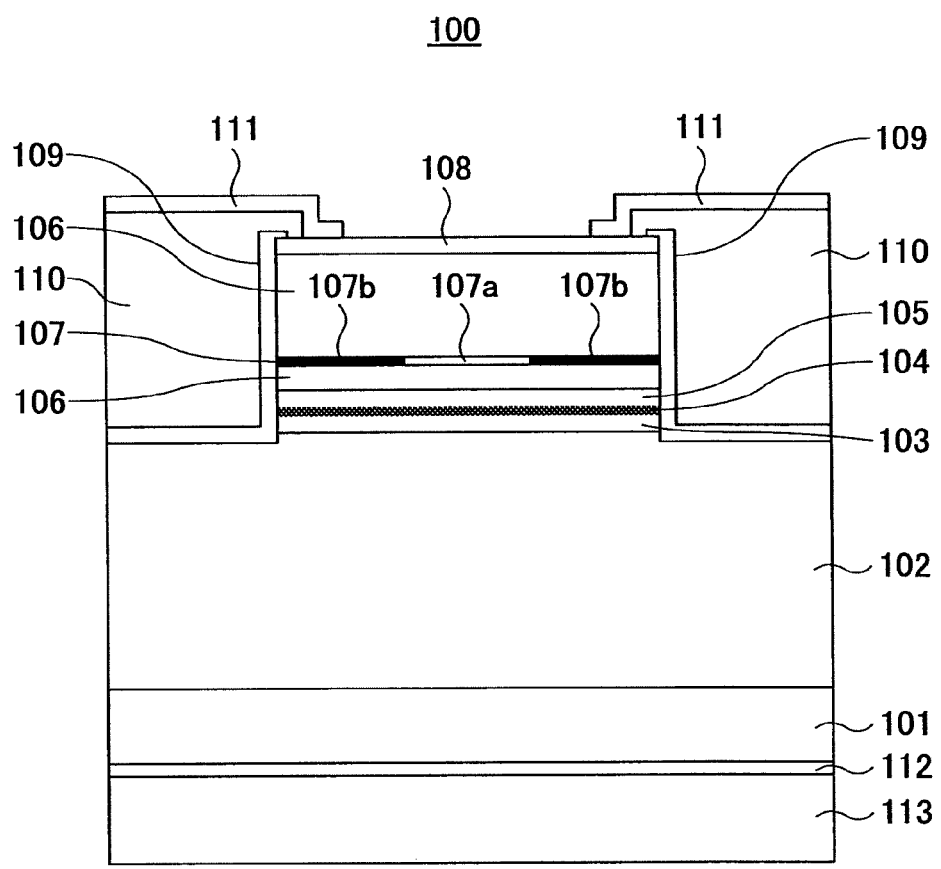
FIG. 1 is a schematic cross-sectional view of a surface-emitting laser device according to a first embodiment of the present invention.

A description is given, with reference to the accompanying drawings, of embodiments of the present invention. In the drawings, the same elements as or the elements corresponding to those previously described are referred to by the same reference numerals, and a description thereof is not repeated.

First Embodiment

FIG. 1 is a schematic cross-sectional view of a surface-emitting laser device 100 according to a first embodiment of the present invention. Referring to FIG. 1, the surface-emitting laser device 100 includes a substrate 101, reflective layers 102 and 106, cavity spacer layers 103 and 105, an active layer 104, a selectively oxidized layer 107, a contact layer 108, a $SiO_2$ layer 109, insulating resin 110, a p-side electrode 111, and an n-side electrode 112. The surface-emitting laser device 100 is a 780 nm band surface-emitting laser device.

The substrate 101 is formed of (100) n-type gallium arsenide (n-GaAs) whose surface orientation is inclined at an inclination angle of 15 degrees to the direction of a (111)A surface. The reflective layer 102 is formed of 35.5 periods of [n-$Al_{0.9}Ga_{0.1}$As/n-$Al_{0.3}Ga_{0.7}$As], letting a pair of n-$Al_{0.9}Ga_{0.1}$As/n-$Al_{0.3}Ga_{0.7}$As be one period, and is formed on a principal plane of the substrate 101. Letting the oscillation wavelength of the surface-emitting laser device 100 be λ, the film thickness of each of n-$Al_{0.9}Ga_{0.1}$As and n-$Al_{0.3}Ga_{0.7}$As is λ/4.

The cavity spacer layer 103 is formed of $Ga_{0.5}In_{0.5}$P on the reflective layer 102. The active layer 104 has a quantum well structure of compressive strain composition, and is formed on the cavity spacer layer 103.

The cavity spacer layer 105 is formed of $(Al_{0.7}Ga_{0.3})_{0.5}In_{0.5}$P on the active layer 104. The reflective layer 106 is formed of 24 periods of [p-$Al_{0.9}Ga_{0.1}$As/p-$Al_{0.3}Ga_{0.7}$As], letting a pair of p-$Al_{0.9}Ga_{0.1}$As/p-$Al_{0.3}Ga_{0.7}$As be one period, and is formed on the cavity spacer layer 105. The film thickness of each of p-$Al_{0.9}Ga_{0.1}$As and p-$Al_{0.3}Ga_{0.7}$As is λ/4.

The selectively oxidized layer 107 is formed of p-AlAs and provided in the reflective layer 106. The selectively oxidized layer 107 includes an unoxidized region 107a and an oxidized region 107b, and is 20 nm in film thickness.

The contact layer 108 is formed of p-GaAs on the reflective layer 106. The $SiO_2$ layer 109 is formed so as to cover part of a principal plane of the reflective layer 102 and the edge surfaces of the cavity spacer layer 103, the active layer 104, the cavity spacer layer 105, the reflective layer 106, the selectively oxidized layer 107 and the contact layer 108.

The insulating resin 110 is formed in contact with the $SiO_2$ layer 109. The p-side electrode 111 is formed on part of the contact layer 108 and the insulating resin 110. The n-side electrode 112 is formed on the bottom side of the substrate 101.

In the surface-emitting laser device 100, the substrate 101 is connected to a heat sink 113 through the n-side electrode 112.

Each of the reflective layers 102 and 106 forms a semiconductor distributed Bragg reflector that reflects oscillating light that has oscillated in the active layer 104 by multiple Bragg reflections so as to confine the oscillating light in the active layer 104.

The oxidized region 107b has a smaller refractive index than the unoxidized region 107a. The oxidized region 107b forms a current confinement part that limits to the unoxidized region 107a the path through which a current injected from the p-side electrode 111 flows to the active layer 104, and confines the oscillating light that has oscillated in the active layer 104 in the unoxidized region 107a. Thereby, the surface-emitting laser device 100 is enabled to perform oscillation with low threshold current.

Figure 2:
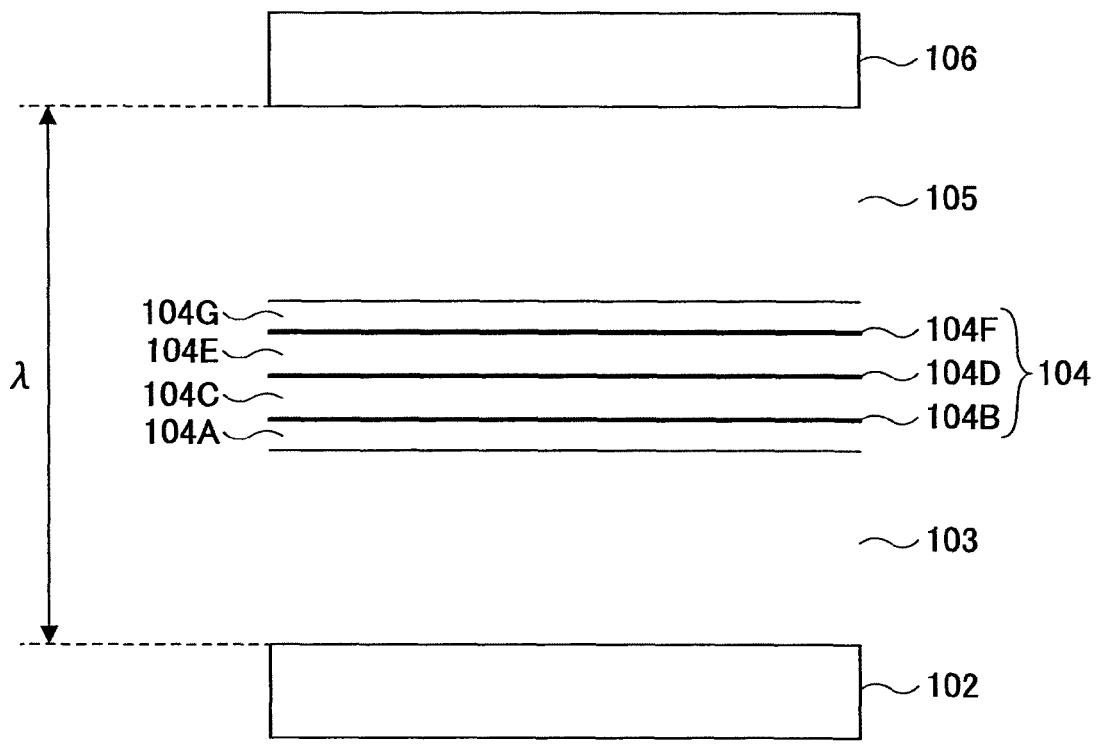
FIG. 2 is a cross-sectional view of part of two reflective layers, two cavity spacer layers, and an active layer shown in FIG. 1 according to the first embodiment of the present invention.

FIG. 2 is a cross-sectional view of part of the two reflective layers 102 and 106, the two cavity spacer layers 103 and 105, and the active layer 104 shown in FIG. 1. Referring to FIG. 2, the active layer 104 includes barrier layers 104A, 104C, 104E, and 104G and well layers 104B, 104D, and 104F. Each of the barrier layers 104A, 104C, 104E, and 104G is formed of $Ga_{0.5}In_{0.5}$P and each of the well layers 104B, 104D, and 104F is formed of GaInPAs. Thus, the active layer 104 is formed of three well layers and four barrier layers. The barrier layer 104A is in contact with the cavity spacer layer 103, and the barrier layer 104G is in contact with the cavity spacer layer 105.

Figure 3:
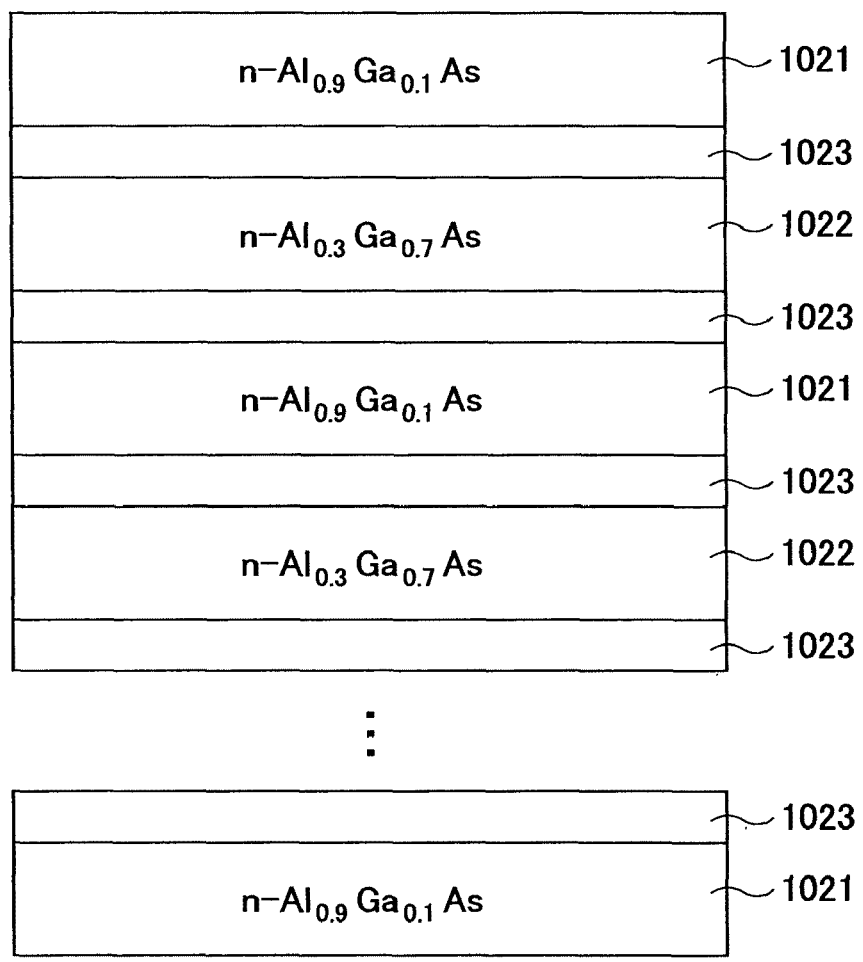
FIG. 3 is a schematic cross-sectional view of one of the reflective layers shown in FIG. 1 according to the first embodiment of the present invention.

FIG. 3 is a schematic cross-sectional view of the reflective layer 102 shown in FIG. 1. Referring to FIG. 3, the reflective layer 102 includes low refractive index layers 1021 and high refractive index layers 1022 that are alternately stacked. The low refractive index layers 1021 are formed of n-$Al_{0.9}Ga_{0.1}$As. The high refractive index layers 1022 are formed of n-$Al_{0.3}Ga_{0.7}$As. A composition gradient layer 1023 is provided between each high refractive index layer 1022 and each of its adjacent low refractive index layers 1021. The composition gradient layers 1023 are formed of AlGaAs whose composition changes from the composition of one of the low refractive index layer 1021 and the high refractive index layer 1022 toward the composition of the other one of the low refractive index layer 1021 and the high refractive index layer 1022.

The composition gradient layers 1023 are provided in order to reduce the electric resistance between the low refractive index layers 1021 and the high refractive index layers 1022.

Each low refractive index layer 1021 has a film thickness of d1. Each high refractive index layer 1022 has a film thickness of d2. Each composition gradient layer 1023 has a film thickness of d3.

In the case of a reflective layer that does not include the composition gradient layers 1023 to have steep interfaces, the film thicknesses of low refractive index layers and high refractive index layers forming the reflective layer are determined to be $\lambda/4n$ (where n is the refractive index of each semiconductor layer) with respect to a laser oscillation wavelength ($\lambda$=780 nm) so as to satisfy the phase condition of multiple Bragg reflections.

This $\lambda/4n$ film thickness causes the phase shift of oscillating light in each semiconductor layer to be $\pi/2$. In the case of including the composition gradient layers 1023 as in the surface-emitting laser device 100, the thickness of each semiconductor layer including the corresponding composition gradient layer 1023 is determined to satisfy the condition of multiple Bragg reflections.

The film thickness d3 is, for example, 20 nm. The film thicknesses d1 and d2 are determined so that d1+d3 and d2+d3 satisfy the condition of multiple Bragg reflections. That is, d1+d3 and d2+d3 are determined so that the phase shift of oscillating light in the reflective layer 102 is $\pi/2$.

In FIG. 3, the lowermost low refractive index layer 1021 is in contact with the substrate 101, and the uppermost low refractive index layer 1021 is in contact with the cavity spacer layer 103.

Figure 4:
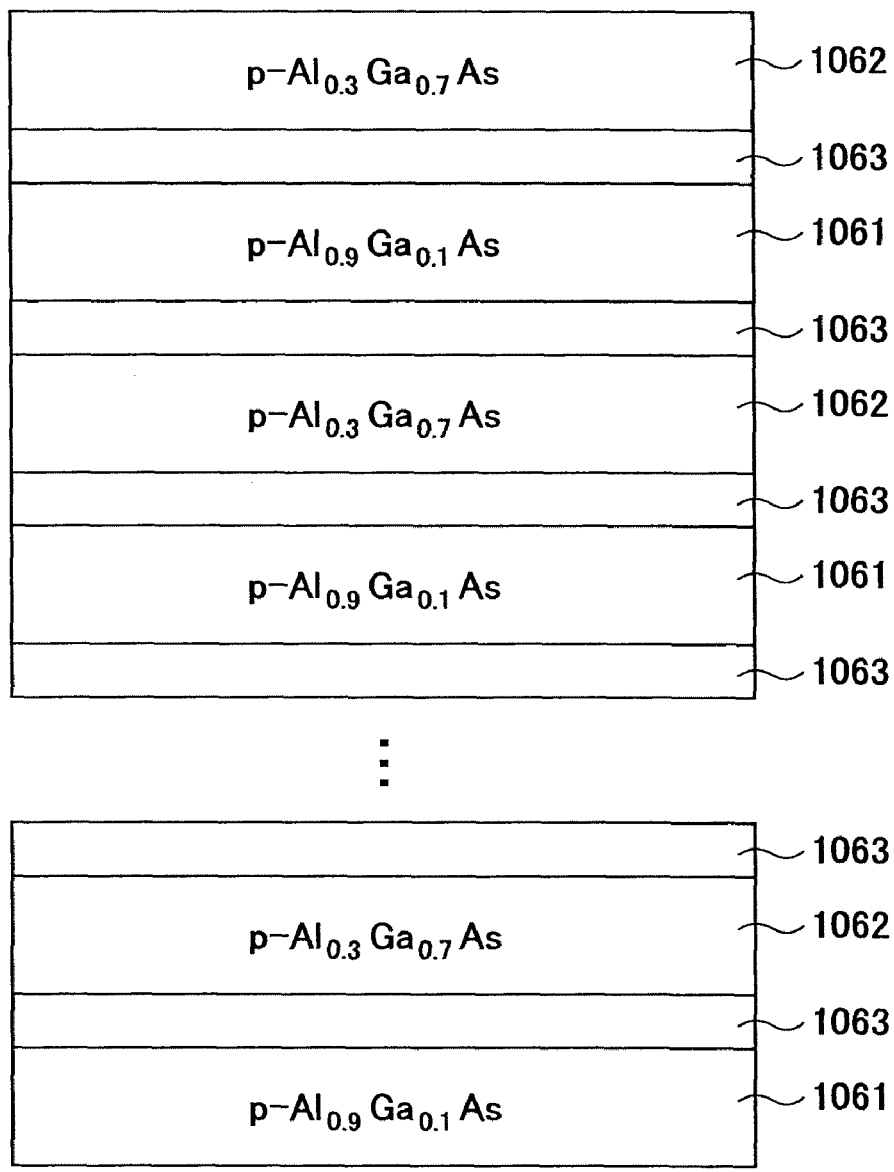
FIG. 4 is a schematic cross-sectional view of the other one of the reflective layers shown in FIG. 1 according to the first embodiment of the present invention.

FIG. 4 is a schematic cross-sectional view of the reflective layer 106 shown in FIG. 1. Referring to FIG. 4, the reflective layer 106 includes low refractive index layers 1061, high refractive index layers 1062, and composition gradient layers 1063. The low refractive index layers 1061 are formed of p-$Al_{0.9}Ga_{0.1}As$. The high refractive index layers 1062 are formed of p-$Al_{0.3}Ga_{0.7}As$. The composition gradient layers 1063 are formed of AlGaAs whose composition changes from the composition of one of the low refractive index layer 1061 and the high refractive index layer 1062 toward the composition of the other one of the low refractive index layer 1061 and the high refractive index layer 1062.

The composition gradient layers 1063 are provided in order to reduce the electric resistance between the low refractive index layers 1061 and the high refractive index layers 1062.

Each low refractive index layer 1061 has a film thickness of d4. Each high refractive index layer 1062 has a film thickness of d5. Each composition gradient layer 1063 has a film thickness of d6.

In the case of a reflective layer that does not include the composition gradient layers 1063 to have steep interfaces, the film thicknesses of low refractive index layers and high refractive index layers forming the reflective layer are determined to be $\lambda/4n$ (where n is the refractive index of each semiconductor layer) with respect to a laser oscillation wavelength ($\lambda$=780 nm) so as to satisfy the phase condition of multiple Bragg reflections.

This $\lambda/4n$ film thickness causes the phase shift of oscillating light in each semiconductor layer to be $\pi/2$. In the case of including the composition gradient layers 1063 as in the surface-emitting laser device 100, the thickness of each semiconductor layer including the corresponding composition gradient layer 1063 is determined to satisfy the condition of multiple Bragg reflections.

The film thickness d6 is, for example, 20 nm. The film thicknesses d4 and d5 are determined so that d4+d6 and d5+d6 satisfy the condition of multiple Bragg reflections. That is, d4+d6 and d5+d6 are determined so that the phase shift of oscillating light in the reflective layer 106 is $\pi/2$.

In FIG. 4, the lowermost low refractive index layer 1061 is in contact with the cavity spacer layer 105, and the uppermost high refractive index layer 1062 is in contact with the contact layer 108.

Figure 5A:
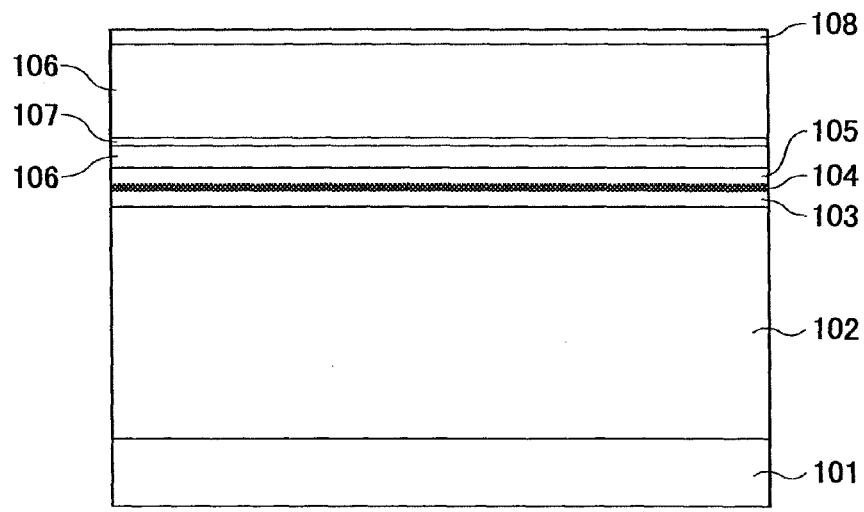
FIGS. 5A through 5H are diagrams showing a method of manufacturing the surface-emitting laser device shown in FIG. 1 according to the first embodiment of the present invention.

FIGS. 5A through 5H are diagrams showing a method of manufacturing the surface-emitting laser device 100 shown in FIG. 1. Referring to FIG. 5A, when a series of operations starts, the reflective layer 102, the cavity spacer layer 103, the active layer 104, the cavity spacer layer 105, the reflective layer 106, a p-AlAs layer to serve as the selectively oxidized layer 107, and the contact layer 108 are successively stacked on the substrate 101 using MOCVD (Metal Organic Chemical Vapor Deposition).

In this case, n-$Al_{0.9}Ga_{0.1}As$ and n-$Al_{0.3}Ga_{0.7}As$ of the reflective layer 102 are formed using trimethylaluminum (TMA), trimethylgallium (TMG), arsine ($AsH_3$), and hydrogen selenide ($H_2Se$) as materials, and $Ga_{0.5}In_{0.5}P$ of the cavity spacer layer 103 is formed using trimethylgallium (TMG), trimethylindium (TMI), and phosphine ($PH_3$) as materials.

Further, GaInPAs of the active layer 104 is formed using trimethylgallium (TMG), trimethylindium (TMI), phosphine ($PH_3$), and arsine ($AsH_3$) as materials, and $Ga_{0.5}In_{0.5}P$ of the active layer 104 is formed using trimethylgallium (TMG), trimethylindium (TMI), and phosphine ($PH_3$) as materials.

Further, $(Al_{0.7}Ga_{0.3})_{0.5}In_{0.5}P$ of the cavity spacer layer 105 is formed using trimethylaluminum (TMA), trimethylgallium (TMG), trimethylindium (TMI), and phosphine ($PH_3$) as materials.

Further, p-$Al_{0.9}Ga_{0.1}As$/p-$Al_{0.3}Ga_{0.7}As$ of the reflective layer 106 are formed using trimethylaluminum (TMA), trimethylgallium (TMG), arsine ($AsH_3$), and carbon tetrabromide ($CBr_4$) as materials. Carbon tetrabromide ($CBr_4$) may be replaced by dimethyl zinc (DMZn).

Further, p-AlAs of the selectively oxidized layer 107 is formed using trimethylaluminum (TMA), arsine ($AsH_3$), and carbon tetrabromide ($CBr_4$) as materials, and p-GaAs of the contact layer 108 is formed using trimethylaluminum (TMA), arsine ($AsH_3$), and carbon tetrabromide ($CBr_4$) as materials. In this case, carbon tetrabromide ($CBr_4$) may also be replaced by dimethyl zinc (DMZn).

Figure 5B:
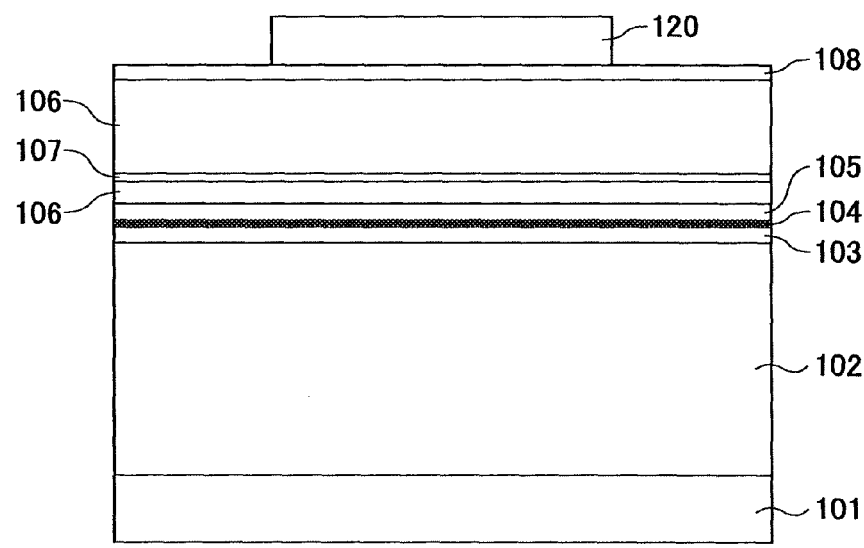

Thereafter, resist is applied on the contact layer 108, and a resist pattern 120 is formed on the contact layer 108 using a photomechanical process as shown in FIG. 5B.

Figure 5C:
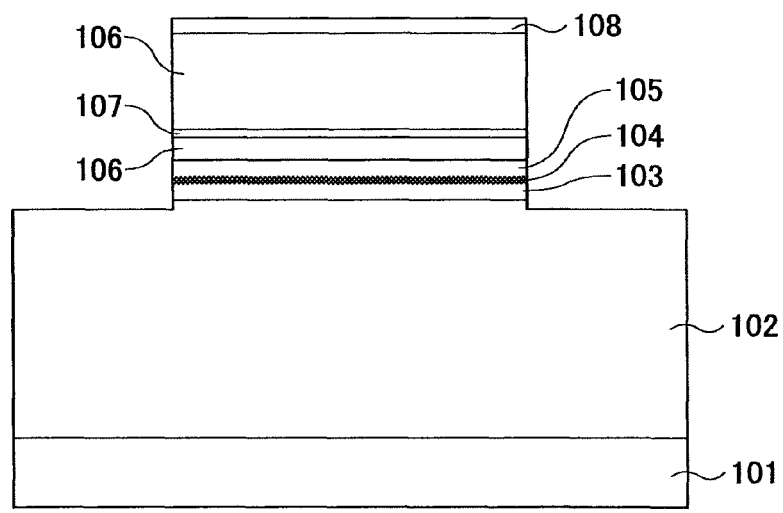

Once the resist pattern 120 is formed, the peripheral parts of the cavity spacer layer 103, the active layer 104, the cavity spacer layer 105, the reflective layer 106, the p-AlAs layer to serve as the selectively oxidized layer 107, and the contact layer 108 are removed by dry etching using the formed resist pattern 120 as a mask, and the resist pattern 120 is thereafter removed as shown in FIG. 5C.

The dry etching is performed introducing a halogen-based gas such as $Cl_2$, $BCl_3$, or $SiCl_4$ and using plasma according to RIBE (Reactive Ion Beam Etching), ICP (Inductively Coupled Plasma) etching, or RIE (Reactive Ion Etching).

Figure 5D:
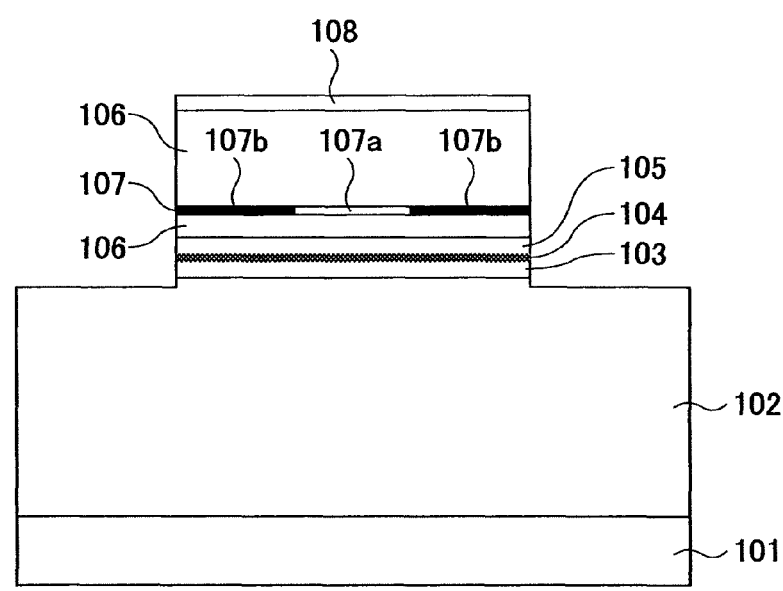

After the process shown in FIG. 5C, the p-AlAs layer 107 is oxidized from its periphery to center by heating the sample (structure) to 350° C. in an atmosphere where water heated to 85° C. is bubbled with nitrogen gas, thereby forming the unoxidized region 107a and the oxidized region 107b in the p-AlAs layer 107 (selectively oxidized layer 107) as shown in FIG. 5D. In this case, the unoxidized region 107a is 4 μm square.

Figure 5E:
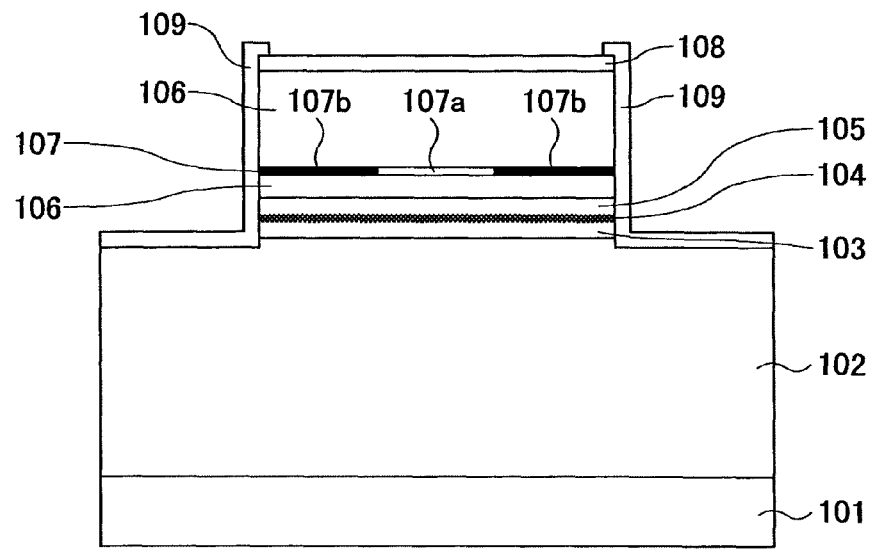

Thereafter, the $SiO_2$ layer 109 is formed on the entire surface of the sample using CVD (Chemical Vapor Deposition), and the $SiO_2$ layer 109 is removed from a region to serve as a light exit part and its surrounding region using a photomechanical process as shown in FIG. 5E.

Figure 5F:
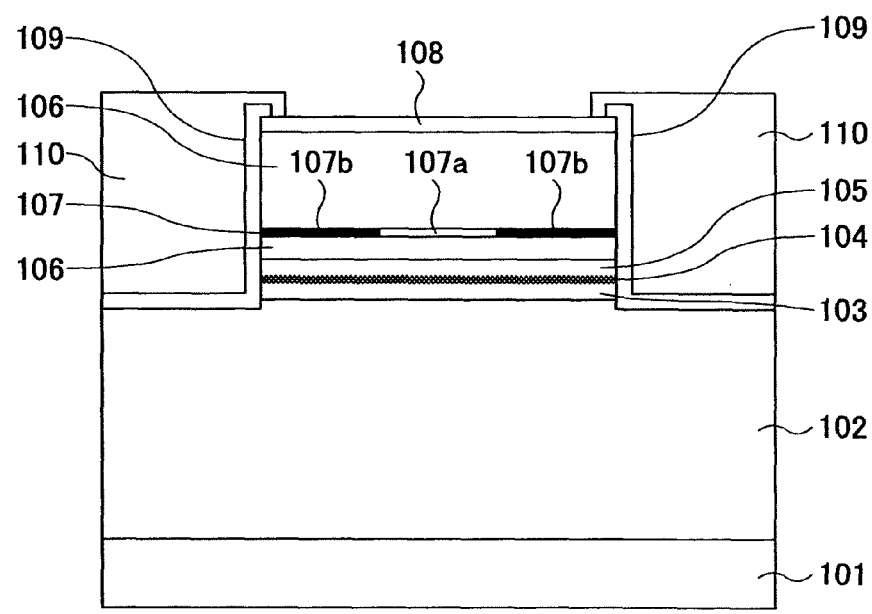

Next, the insulating resin 110 is applied on the entire sample by spin coating, and the insulating resin 110 is removed from the region to serve as the light exit part as shown in FIG. 5F.

Figure 5G:
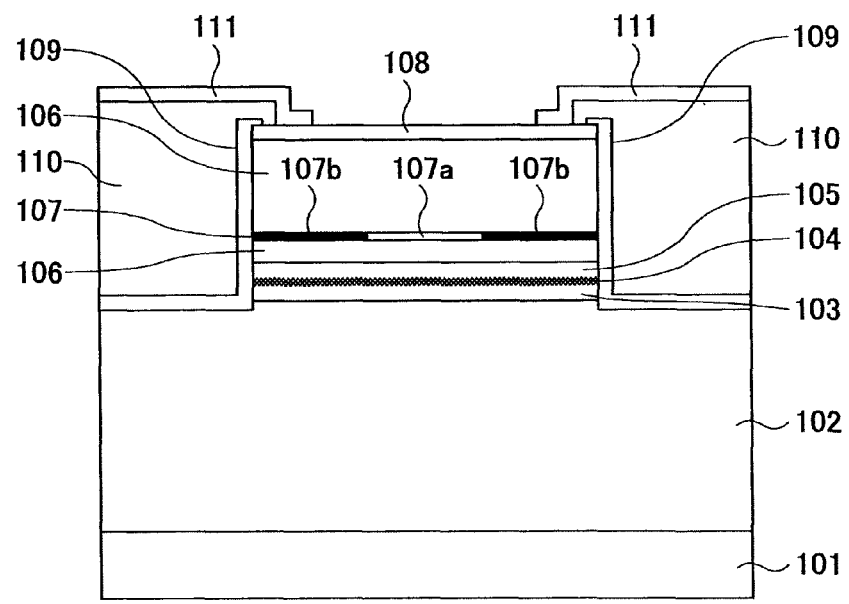
Figure 5H:
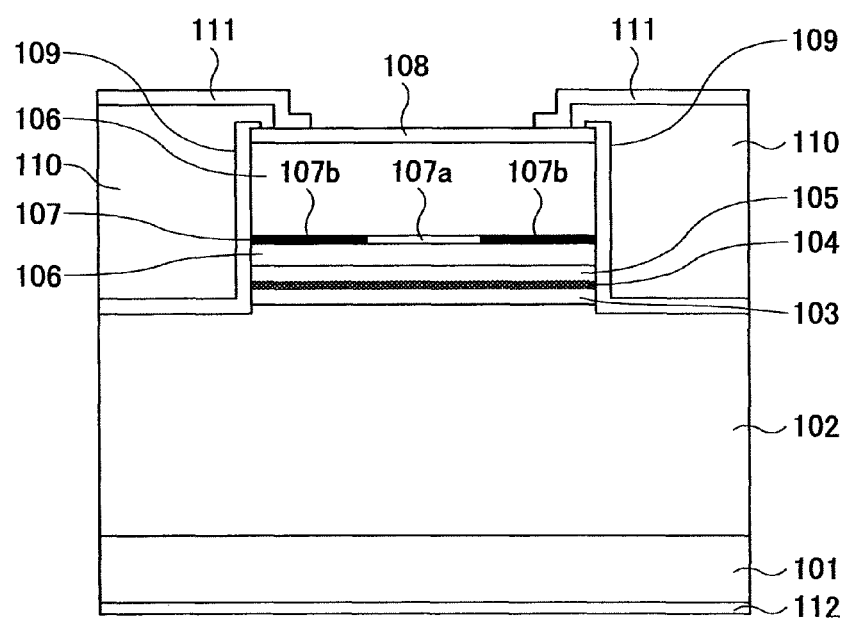

After forming the insulating resin 110, a resist pattern having a predetermined size is formed on the region to serve as the light exit part, and a p-side electrode material is formed on the entire surface of the sample by vapor deposition. Then, the p-side electrode material on the resist pattern is removed by lift-off, so that the p-side electrode 111 is formed as shown in FIG. 5G. Then, as shown in FIG. 5H, the bottom side of the substrate 101 is ground, and the n-side electrode 112 is formed on the bottom side of the substrate 101. Further, ohmic conduction is made between the p-side electrode 111 and the n-side electrode 112 by annealing. Thereby, the surface-emitting laser device 100 is manufactured.

In the surface-emitting laser device 100, the well layers 104B, 104D, and 104F of the active layer 104 are formed of GaInPAs, and the cavity spacer layer 105 in contact with the active layer 104 is formed of $(Al_{0.7}Ga_{0.3})_{0.5}In_{0.5}P$. This $(Al_{0.7}Ga_{0.3})_{0.5}In_{0.5}P$ has a greater band gap than GaInPAs forming the well layers 104B, 104D, and 104F.

Accordingly, in the surface-emitting laser device 100, the difference in band gap between the well layers 104B, 104D, and 104F of the active layer 104 and the cavity spacer layer 105 can be greater than in the case of forming the cavity spacer layer 105 of an AlGaAs-system semiconductor material. As a result, the rate of confinement of carriers in the well layers 104B, 104D, and 104F improves, so that the output of the surface-emitting laser device 100 improves.

Table 1 shows the band gap (Eg) difference (ΔEg) between the cavity spacer layers 103 and 105 and the well layers 104B, 104D, and 104F and the band gap (Eg) difference (ΔEg) between the barrier layers 104A, 104C, 104E, and 104G and the well layers 104B, 104D, and 104F in the case of forming the cavity spacer layers 103 and 105 and the well layers 104B, 104D, and 104F of AlGaAs and AlGaAs, respectively, and in the case of forming the cavity spacer layers 103 and 105 and the well layers 104B, 104D, and 104F of AlGaInP and GaInPAs, respectively.

104D, and 104F is 465.9 meV and the band gap difference between the barrier layers 104A, 104C, 104E, and 104G and the well layers 104B, 104D, and 104F is 228.8 meV in a surface-emitting laser device having an oscillation wavelength of 780 nm.

In the case of using AlGaAs/GaAs for the cavity spacer layers 103 and 105/the well layers 104B, 104D, and 104F of the active layer 104, the band gap difference between the cavity spacer layers 103 and 105 and the well layers 104B, 104D, and 104F is 602.6 meV and the band gap difference between the barrier layers 104A, 104C, 104E, and 104G and the well layers 104B, 104D, and 104F is 365.5 meV in a surface-emitting laser device having an oscillation wavelength of 850 nm.

On the other hand, in the case of using AlGaInP/GaInPAs for the cavity spacer layers 103 and 105/the well layers 104B, 104D, and 104F of the active layer 104, the band gap difference between the cavity spacer layers 103 and 105 and the well layers 104B, 104D, and 104F is 767.3 meV and the band gap difference between the barrier layers 104A, 104C, 104E, and 104G and the well layers 104B, 104D, and 104F is 313.3 meV in the surface-emitting laser device 100 having an oscillation wavelength of 780 nm.

Thus, the band gap difference between the cavity spacer layers 103 and 105 and the well layers 104B, 104D, and 104F and the band gap difference between the barrier layers 104A, 104C, 104E, and 104G and the well layers 104B, 104D, and 104F can be remarkably greater than conventionally by forming the cavity spacer layers 103 and 105 and the well layers 104B, 104D, and 104F of the active layer 104 of AlGaInP and GaInPAs, respectively. As a result, the effect of confinement of carriers in the well layers 104B, 104D, and 104F is remarkably greater, so that the surface-emitting laser device 100 oscillates with a low threshold and emits oscillating light of

TABLE 1

| | | WAVELENGTH | | |
|---|---|---|---|---|
| | | 780 nm | | 850 nm (Ref.) |
| | | SPACER LAYER/ QUANTUM WELL ACTIVE LAYER AlGaAs/AlGaAs-SYSTEM MATERIAL | SPACER LAYER/ QUANTUM WELL ACTIVE LAYER AlGaInP/GaInPAs-SYSTEM MATERIAL | SPACER LAYER/ QUANTUM WELL ACTIVE LAYER AlGaAs/GaAs-SYSTEM MATERIAL |
| SPACER LAYER | | $Al_{0.6}Ga_{0.4}As$ (Eg = 2.0226 eV) | $(Al_xGa_{1-x})_{0.5}In_{0.5}P$ (Eg(x = 0.7) = 2.324 eV) | $Al_{0.6}Ga_{0.4}As$ (Eg = 2.0226 eV) |
| ACTIVE LAYER | QUANTUM WELL ACTIVE LAYER | $Al_{0.12}Ga_{0.88}As$ (Eg = 1.5567 eV) | GaInPAs (COMPRESSIVE STRAIN) (Eg = 1.5567 eV) | GaAs Eg = 1.42 eV |
| | BARRIER LAYER | $Al_{0.3}Ga_{0.7}As$ (Eg = 1.78552 eV) | $Ga_xIn_{1-x}P$ (TENSILE STRAIN) (Eg(x = 0.6) = 1.87 eV) | $Al_{0.3}Ga_{0.7}As$ (Eg = 1.78552 eV) |
| Eg DIFFERENCE (ΔEg) BETWEEN SPACER LAYER & WELL LAYER | | 465.9 meV | 767.3 meV | 602.6 meV |
| Eg DIFFERENCE (ΔEg) BETWEEN BARRIER LAYER & WELL LAYER | | 228.8 meV | 313.3 meV | 365.5 meV |

In the case of using AlGaAs/AlGaAs for the cavity spacer layers 103 and 105/the well layers 104B, 104D, and 104F of the active layer 104, the band gap difference between the cavity spacer layers 103 and 105 and the well layers 104B, higher output. This effect cannot be produced by a 780 nm or 850 nm surface-emitting laser device formed of the AlGaAs system having substantially the same lattice constant as a GaAs substrate.

Further, in the surface-emitting laser device 100, the cavity spacer layer 103, which is disposed on the substrate 101 side of the active layer 104, is formed of $Ga_{0.5}In_{0.5}P$, and the cavity spacer layer 105, which is disposed on the side of the active layer 104 opposite to the substrate 101, is formed of $(Al_{0.7}Ga_{0.3})_{0.5}In_{0.5}P$.

Figure 6:
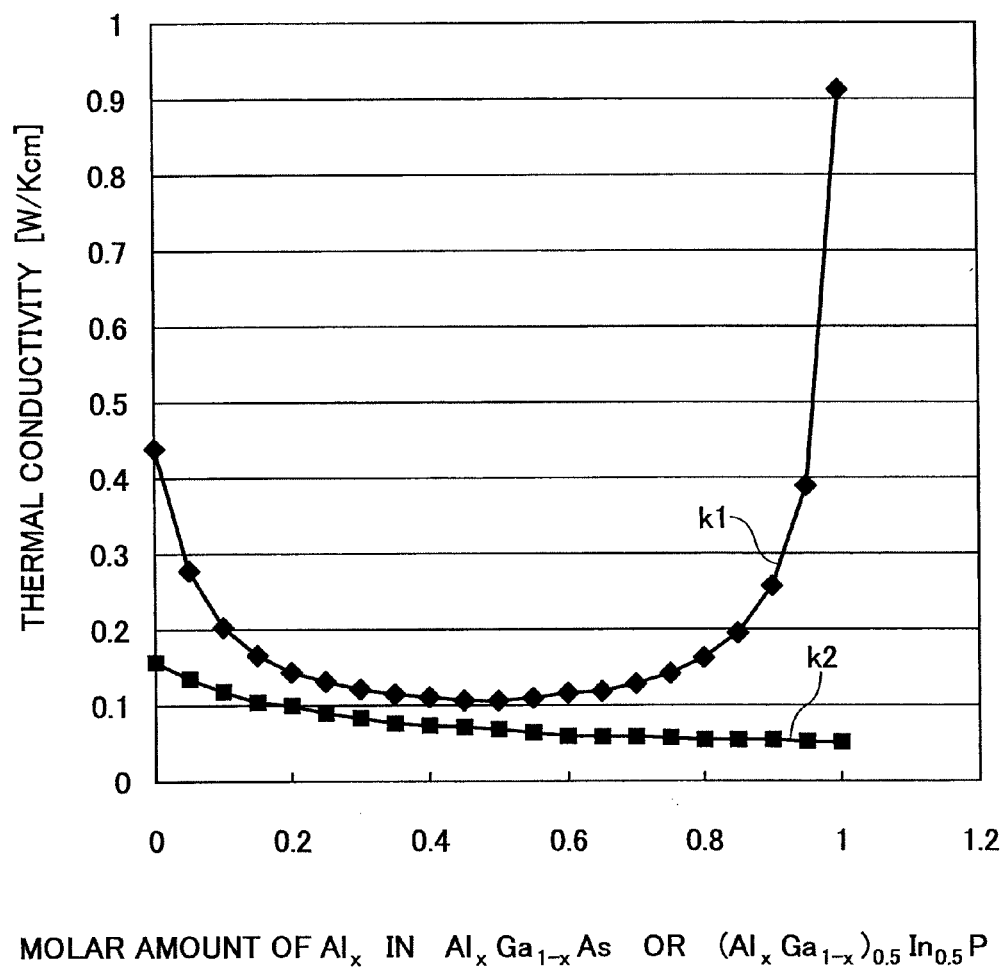
FIG. 6 is a graph showing the relationship between thermal conductivity and the molar amount of Al x in each of $Al_xGa_{1-x}As$ and $(Al_xGa_{1-x})_{0.5}In_{0.5}P$ according to the first embodiment of the present invention.

FIG. 6 is a graph showing the relationship between thermal conductivity and the molar amount of Al x in each of $Al_xGa_{1-x}As$ and $(Al_xGa_{1-x})_{0.5}In_{0.5}P$. In FIG. 6, the vertical axis represents thermal conductivity and the horizontal axis represents the molar amount of Al x in $Al_xGa_{1-x}As$ ($0 \leq x \leq 1$) or $(Al_xGa_{1-x})_{0.5}In_{0.5}P$ ($0 \leq x \leq 1$). A curved line k1 shows the relationship between the molar amount of Al x in $Al_xGa_{1-x}As$ and thermal conductivity, and a curved line k2 shows the relationship between the molar amount of Al x in $(Al_xGa_{1-x})_{0.5}In_{0.5}P$ lattice-matched with GaAs and thermal conductivity.

The thermal conductivity of $Ga_{0.5}In_{0.5}P$ (x=0 in FIG. 6) is greater than the thermal conductivity of $(Al_{0.7}Ga_{0.3})_{0.5}In_{0.5}P$ (x=0.7 in FIG. 6). More specifically, the thermal conductivity of $Ga_{0.5}In_{0.5}P$ (x=0 in FIG. 6) is 0.157 W/Kcm, and the thermal conductivity of $(Al_{0.7}Ga_{0.3})_{0.5}In_{0.5}P$ (x=0.7 in FIG. 6) is 0.056 W/Kcm. Thus, the thermal conductivity of $Ga_{0.5}In_{0.5}P$ (x=0 in FIG. 6) is approximately three times the thermal conductivity of $(Al_{0.7}Ga_{0.3})_{0.5}In_{0.5}P$ (x=0.7 in FIG. 6). (See the curved line k2.)

Therefore, in the surface-emitting laser device 100, a semiconductor material having high thermal conductivity is disposed on the substrate 101 side of the active layer 104.

As a result, even when laser light oscillates in the active layer 104 of the surface-emitting laser device 100 so that heat is generated in the active layer 104, the generated heat propagates to the substrate 101 using the cavity spacer layer 103 having high thermal conductivity as a heat dissipation route so as to be dissipated from the substrate 101 to the heat sink 113.

As a result, it is possible to suppress an increase in the temperature of the active layer 104, so that it is possible to obtain high-output and high-performance characteristics.

Thus, the surface-emitting laser device 100 can emit oscillating light of higher output because of the above-described effect of carrier confinement and improvement in the characteristic of dissipating heat generated in the active layer 104.

Further, the surface-emitting laser device 100 has the Al-free active layer 104. Accordingly, it is possible to prevent a nonradiative recombination center from being formed in the active layer 104 by preventing oxygen from being captured, so that it is possible to extend the useful service life of the surface-emitting laser device 100.

Further, since the cavity spacer layer 103 is formed of $Ga_{0.5}In_{0.5}P$ and the cavity spacer layer 105 is formed of $(Al_{0.7}Ga_{0.3})_{0.5}In_{0.5}P$, the surface-emitting laser device 100 has semiconductor materials disposed asymmetrically with respect to the active layer 104.

Further, in the surface-emitting laser device 100, the cavity spacer layer 103 is formed of $Ga_{0.5}In_{0.5}P$ and the cavity spacer layer 105 is formed of $(Al_{0.7}Ga_{0.3})_{0.5}In_{0.5}P$, where $Ga_{0.5}In_{0.5}P$ is greater in thermal conductivity than $(Al_{0.7}Ga_{0.3})_{0.5}In_{0.5}P$ as indicated by the curved line k2 in FIG. 6. Accordingly, in the surface-emitting laser device 100, part of the cavity spacer layer 105 is formed of $(Al_{0.7}Ga_{0.3})_{0.5}In_{0.5}P$, and the cavity spacer layer 103 contains the semiconductor material ($Ga_{0.5}In_{0.5}P$) having greater thermal conductivity than $Ga_{0.5}In_{0.5}P$ at the symmetric position of the position at which the cavity spacer layer 105 contains $(Al_{0.7}Ga_{0.3})_{0.5}In_{0.5}P$ with respect to the active layer 104.

The well layers 104B, 104D, and 104F of the active layer 104 are described above as formed of GaInPAs. In the present invention, however, the well layers 104B, 104D, and 104F are not limited to this, and in general, the well layers 104B, 104D, and 104F may be formed of $Ga_aIn_{1-a}P_bAs_{1-b}$ ($0 \leq a \leq 1$, $0 \leq b \leq 1$).

Further, the barrier layers 104A, 104C, 104E, and 104G of the active layer 104 are described above as formed of $Ga_{0.5}In_{0.5}P$. In the present invention, however, the barrier layers 104A, 104C, 104E, and 104G are not limited to this, and in general, the barrier layers 104A, 104C, 104E, and 104G may be formed of $Ga_cIn_{1-c}P$ ($0<c<1$).

Further, the barrier layers 104A, 104C, 104E, and 104G of the active layer 104 may also be formed of a semiconductor material having tensile strain. In this case, in general, the barrier layers 104A, 104C, 104E, and 104G are formed of $Ga_cIn_{1-c}P_eAs_{1-e}$ ($0 \leq c \leq 1$, $0 \leq e \leq 1$) having a greater band gap than the well layers 104B, 104D, and 104F. Further, in the case where quantum well active layers have compressive strain, a strain compensation effect is produced by the tensile strain of barrier layers, thus increasing reliability. Further, since it is possible to adopt quantum well active layers with greater strain, a greater strain effect can be produced.

If the barrier layer is formed of Al-free $Ga_cIn_{1-c}P_dAs_{1-d}$, GaInP has the largest band gap if the lattice constants are the same. Further, a semiconductor material having a smaller lattice constant has a larger band gap. Accordingly, by forming the barrier layers 104A, 104C, 104E, and 104G of $Ga_cIn_{1-c}P_dAs_{1-d}$, it is possible to increase the band discontinuity between the barrier layers 104A, 104C, 104E, and 104G and the well layers 104B, 104D, and 104F, thus resulting in a greater gain. This enables a low-threshold operation and a high-output operation. For example, a tensile strain layer formed of $Ga_{0.6}In_{0.4}P$ has a band gap of 2.02 eV, and a lattice-matching layer formed of $Ga_{0.5}In_{0.5}P$ has a band gap of 1.87 eV. Accordingly, the tensile strain layer is greater in band gap by 150 meV.

Further, the cavity spacer layer 105 is described above as formed of $(Al_{0.7}Ga_{0.3})_{0.5}In_{0.5}P$. In the present invention, however, the cavity spacer layer 105 is not limited to this, and in general, the cavity spacer layer 105 may be formed of $(Al_dGa_{1-d})_fIn_{1-f}P$ ($0<d \leq 1$, $0 \leq f \leq 1$). Further, $(Al_dGa_{1-d})_fIn_{1-f}P$ forming the cavity spacer layer 105 may be formed of multiple semiconductor layers or may contain a slight amount of other elements.

Further, the cavity spacer layer 103 is described above as formed of $Ga_{0.5}In_{0.5}P$. In the present invention, however, the cavity spacer layer 103 is not limited to this, and in general, the cavity spacer layer 103 may be formed of $(Al_gGa_{1-g})_hIn_{1-h}P$ ($0 \leq g \leq 1$, $0 \leq h \leq 1$) and may be formed of a semiconductor material having greater thermal conductivity than $(Al_dGa_{1-d})_fIn_{1-f}P$ ($0<d \leq 1$, $0 \leq f \leq 1$) forming the cavity spacer layer 105. Further, the cavity spacer layer 103 may also be formed of $Al_zGa_{1-z}As$ ($0 \leq z \leq 1$) having greater thermal conductivity than the cavity spacer layer 105.

Further, as described above, MOCVD is employed as a method of forming each semiconductor layer of the surface-emitting laser device 100. In the present invention, however, the method is not limited to this, and other crystal growth methods such as MEB (Molecular Beam Epitaxy) may also be employed.

Further, the cavity spacer layers 103 and 105 are described above as formed of semiconductor materials that are asymmetrical with respect to the active layer 104. In the present invention, the reflective layers 102 and 106 disposed on the substrate 101 side of the cavity spacer layer 103 and on the contact layer 108 side of the cavity spacer layer 105, respectively, may also be formed of semiconductor materials that are asymmetrical with respect to the active layer 104.

Further, in the first embodiment, AlGaInP materials is used for the cavity spacer layers 103 and 105, and GaInPAs is used for the barrier layers 104A, 104C, 104E, and 104G and the well layers 104B, 104D, and 104F of the active layer 104. Since these layers are formed on the (100) GaAs substrate 101 whose surface orientation is inclined at an inclination angle of 15 degrees to the direction of a (111)A surface, it is possible to reduce the effects of a decrease in the band gap due to formation of a natural superlattice, degradation of a surface characteristic due to generation of a hillock (hill-shaped defect), and a nonradiative recombination center.

Further, since the active layer 104 has compressive strain, a greater increase in the gain is obtained because of a heavy hole-light hole band separation. As a result, the surface-emitting laser device 100 has high gain, so that the surface-emitting laser device 100 has high output with a low oscillation threshold. This effect cannot be produced with an AlGaAs-system 780 nm or 850 nm surface-emitting laser device having substantially the same lattice constant as a GaAs substrate.

Further, in the first embodiment, $(Al_{0.7}Ga_{0.3})_{0.5}In_{0.5}P$ is used for the cavity spacer layer 105 while $Ga_{0.5}In_{0.5}P$ is used for the cavity spacer layer 103. An electron is lighter than a hole. Accordingly, it is the p-side that principally matters in carrier confinement. On the other hand, the band gap of $Ga_{0.5}In_{0.5}P$ on the n-side is approximately 1.91 eV, and hole confinement is sufficient with respect to the 780 nm band gap of the active layer 104.

Further, in the case of using a quantum well active layer (=active layer 104) formed of $Ga_cIn_{1-c}P_dAs_{1-d}$ ($0 \leq c \leq 1$, $0 \leq d \leq 1$), it is possible to manufacture a short-wavelength red surface-emitting semiconductor laser of, for example, the 650 nm band by changing the composition. In this case, the barrier layer is required to contain Al. Therefore, the effect of the Al-free configuration cannot be obtained, but the above-described heat dissipation effect can be produced. Further, it is also possible to manufacture a surface-emitting laser of a wavelength longer than 780 nm, such as a wavelength in the 850 nm, 980 nm, or 1.2 μm band. In this case, the above-described effects including carrier confinement can be obtained. Further, a quantum dot using (Ga)InAs or the like may replace a well layer as an active layer.

It is often the case that the substrate 101 side is mounted on CAN and a package with light exiting from the side opposite to the substrate 101 as in the first embodiment. In this case, the substrate 101 side serves as a principal heat dissipation route. Further, in the case where light is caused to exit from the substrate side by junction-down mounting, the upper reflective layer 106 serves as a principal heat dissipation route. Here, the heat sink refers to one in contact with the mounting side, and may be mounted directly on a package with conductive resin or be mounted on highly conductive metal such as CuW through AuSn.

The reflective layer 102 may form a first reflective layer and the reflective layer 106 may form a second reflective layer.

Further, the cavity spacer layer 103 may form a first cavity spacer layer and the cavity spacer layer 105 may form a second cavity spacer layer.

Second Embodiment

Figure 7:
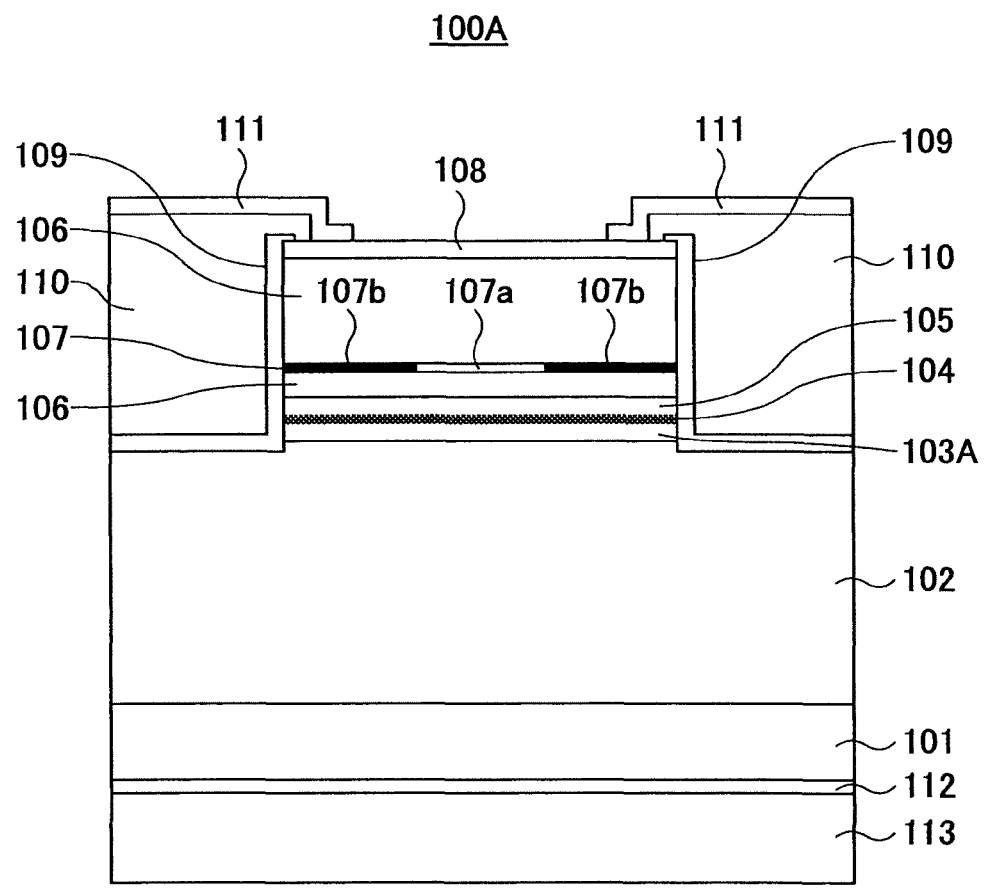
FIG. 7 is a schematic cross-sectional view of a surface-emitting laser device according to a second embodiment of the present invention.

FIG. 7 is a schematic cross-sectional view of a surface-emitting laser device 100A according to a second embodiment of the present invention. Referring to FIG. 7, the surface-emitting laser device 100A is the same as the surface-emitting laser device 100 shown in FIG. 1 except that the cavity spacer layer 103 of the surface-emitting laser device 100 is replaced with a cavity spacer layer 103A.

The cavity spacer layer 103A is formed of $Al_{0.4}Ga_{0.6}As$. In the surface-emitting laser device 100A, since the cavity spacer layer 105 is formed of $(Al_{0.7}Ga_{0.3})_{0.5}In_{0.5}P$, the cavity spacer layer 103A has a greater thermal conductivity than the cavity spacer layer 105. (See the curved lines k1 and k2 of FIG. 6). Thus, the surface-emitting laser device 100A has the two cavity spacer layers 103A and 105 formed of semiconductor materials asymmetrical with respect to the active layer 104, and the cavity spacer layer 103A disposed on the substrate 101 side of the active layer 104 is formed of a semiconductor material having a greater thermal conductivity than the semiconductor material of the cavity spacer layer 105 disposed on the other side of the active layer 104. As a result, it is possible to dissipate heat generated in the active layer 104 to the substrate 101 side, so that the surface-emitting laser device 100A has improved output characteristics.

The surface-emitting laser device 100A is manufactured according to the processes shown in FIGS. 5A through 5H. In this case, the cavity spacer layer 103 may be read as the cavity spacer layer 103A.

Otherwise, the second embodiment is the same as the first embodiment.

Third Embodiment

Figure 8:
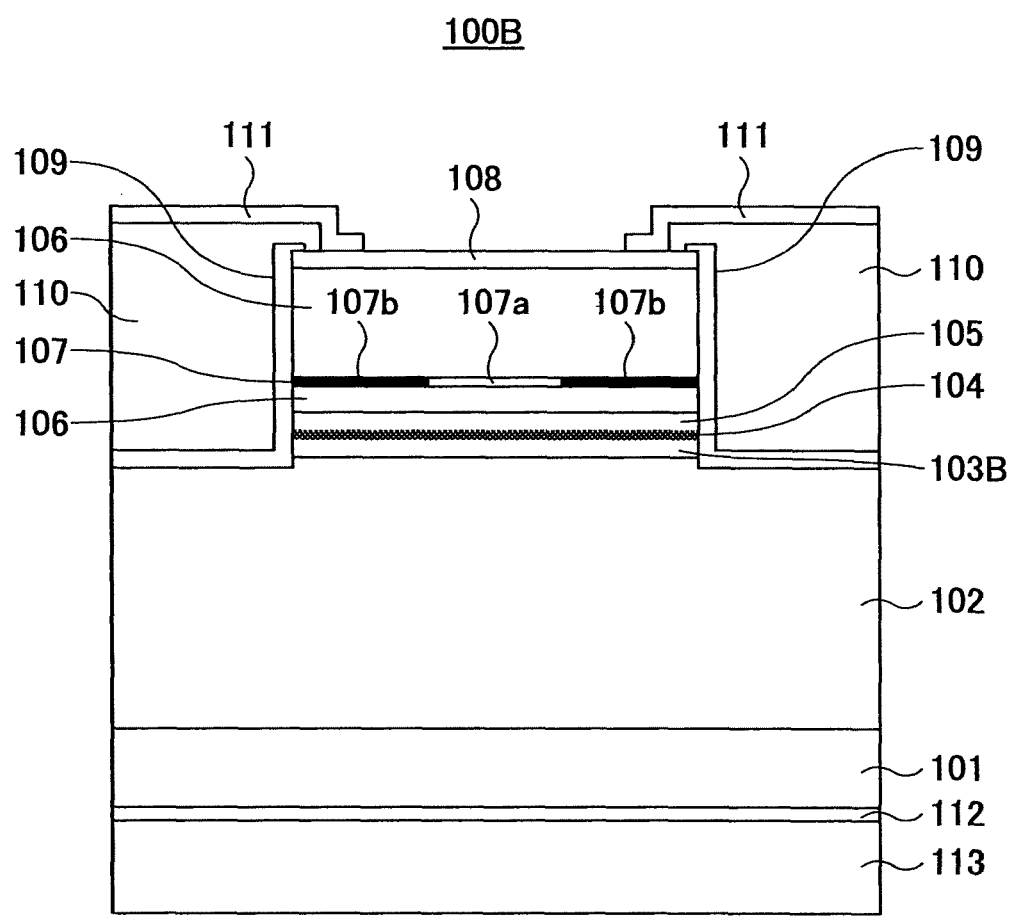
FIG. 8 is a schematic cross-sectional view of a surface-emitting laser device according to a third embodiment of the present invention.

FIG. 8 is a schematic cross-sectional view of a surface-emitting laser device 100E according to a third embodiment of the present invention. Referring to FIG. 8, the surface-emitting laser device 100B is the same as the surface-emitting laser device 100 shown in FIG. 1 except that the cavity spacer layer 103 of the surface-emitting laser device 100 is replaced with a cavity spacer layer 103B.

Figure 9:
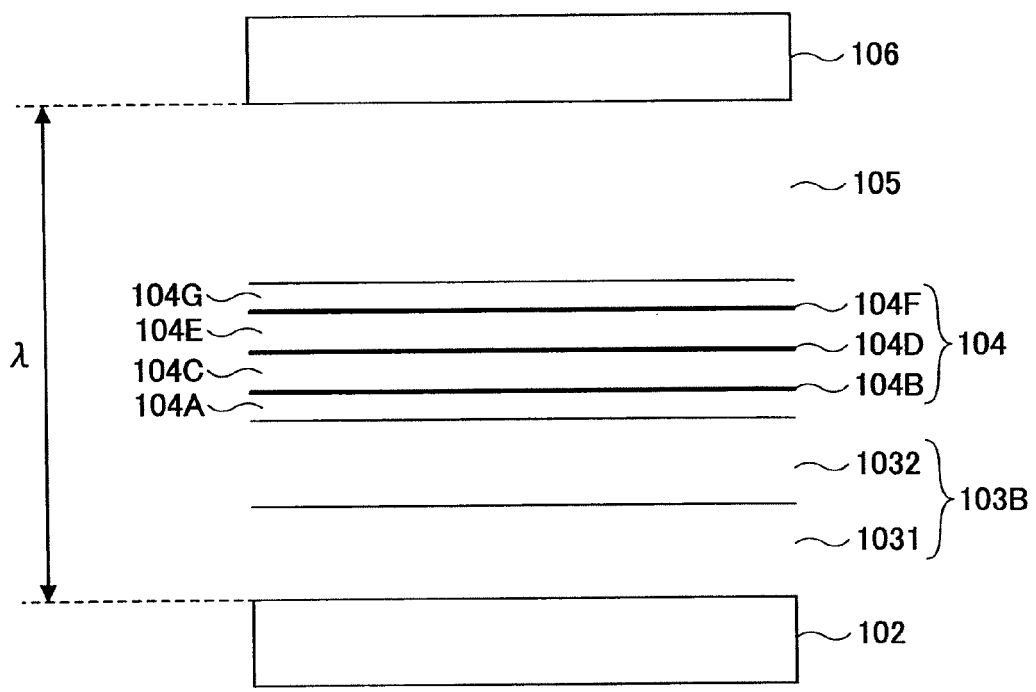
FIG. 9 is a cross-sectional view of part of two reflective layers, two cavity spacer layers, and an active layer shown in FIG. 8 according to the third embodiment of the present invention.

FIG. 9 is a cross-sectional view of part of the two reflective layers 102 and 106, the two cavity spacer layers 103B and 105, and the active layer 104 shown in FIG. 8. Referring to FIG. 9, the cavity spacer layer 103B includes spacer layers 1031 and 1032. The spacer layer 1031 is formed in contact with the reflective layer 102 and the spacer layer 1032 is formed in contact with the spacer layer 1031 and the active layer 104.

The spacer layer 1031 is formed of lattice-matching $Ga_{0.5}In_{0.5}P$, and the spacer layer 1032 is formed of $(Al_{0.7}Ga_{0.3})_{0.5}In_{0.5}P$.

According to the surface-emitting laser device 100B, the space layer 1032, which is in contact with the active layer 104, is formed of $(Al_{0.7}Ga_{0.3})_{0.5}In_{0.5}P$ in the cavity spacer layer 103B. Accordingly, the degree of carrier confinement is higher in the surface-emitting laser device 100B than in the surface-emitting laser device 100, so that the surface-emitting laser device 100B can be higher in output.

The surface-emitting laser device 100B is manufactured according to the processes shown in FIGS. 5A through 5H. In this case, the cavity spacer layer 103 may be read as the cavity spacer layer 103B.

Further, in the third embodiment, $Ga_{0.5}In_{0.5}P$ and $(Al_{0.7}Ga_{0.3})_{0.5}In_{0.5}P$ may be replaced with other materials as described in the first embodiment. Further, the cavity spacer layer 103B may have three or more layers.

Otherwise, the third embodiment is the same as the first embodiment.

Fourth Embodiment

Figure 10:
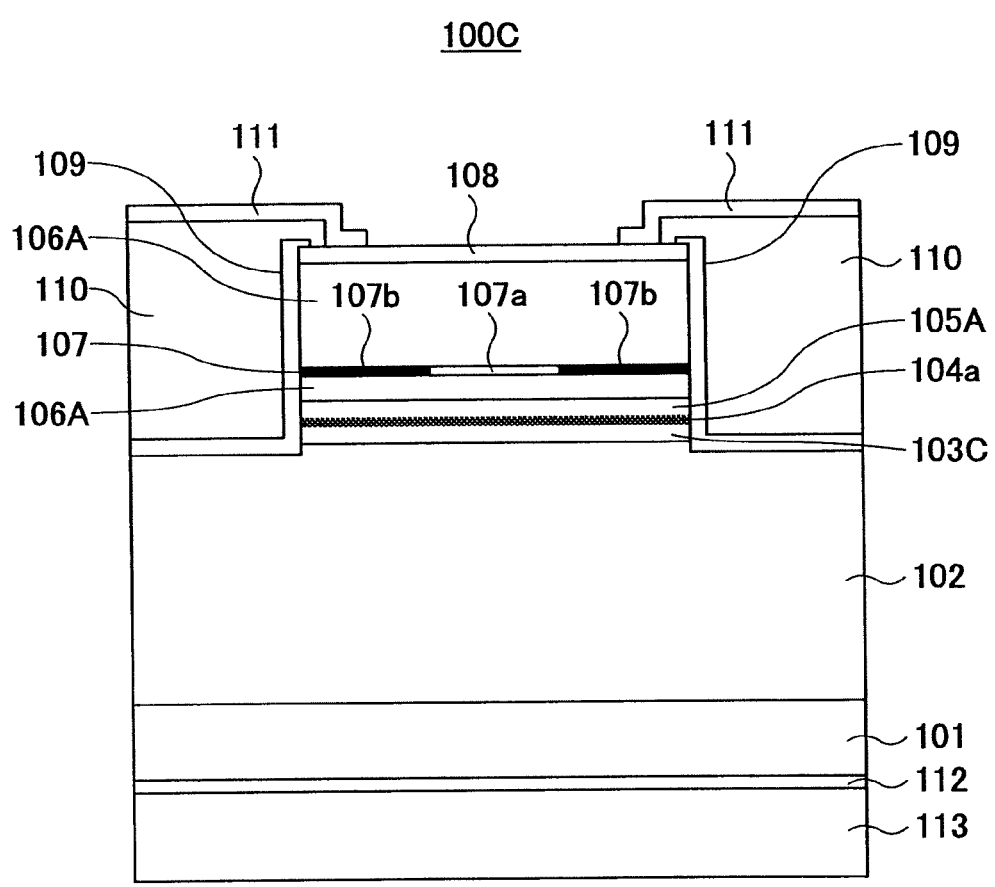
FIG. 10 is a schematic cross-sectional view of a surface-emitting laser device according to a fourth embodiment of the present invention.

FIG. 10 is a schematic cross-sectional view of a surface-emitting laser device 100C according to a fourth embodiment of the present invention. Referring to FIG. 10, the surface-emitting laser device 100C is the same as the surface-emitting laser device 100 shown in FIG. 1 except that the cavity spacer layer 103, the active layer 104, the cavity spacer layer 105, and the reflective layer 106 of the surface-emitting laser device 100 are replaced with a cavity spacer layer 103C, an active layer 104a, a cavity spacer layer 105A, and a reflective layer 106A, respectively.

Figure 11:
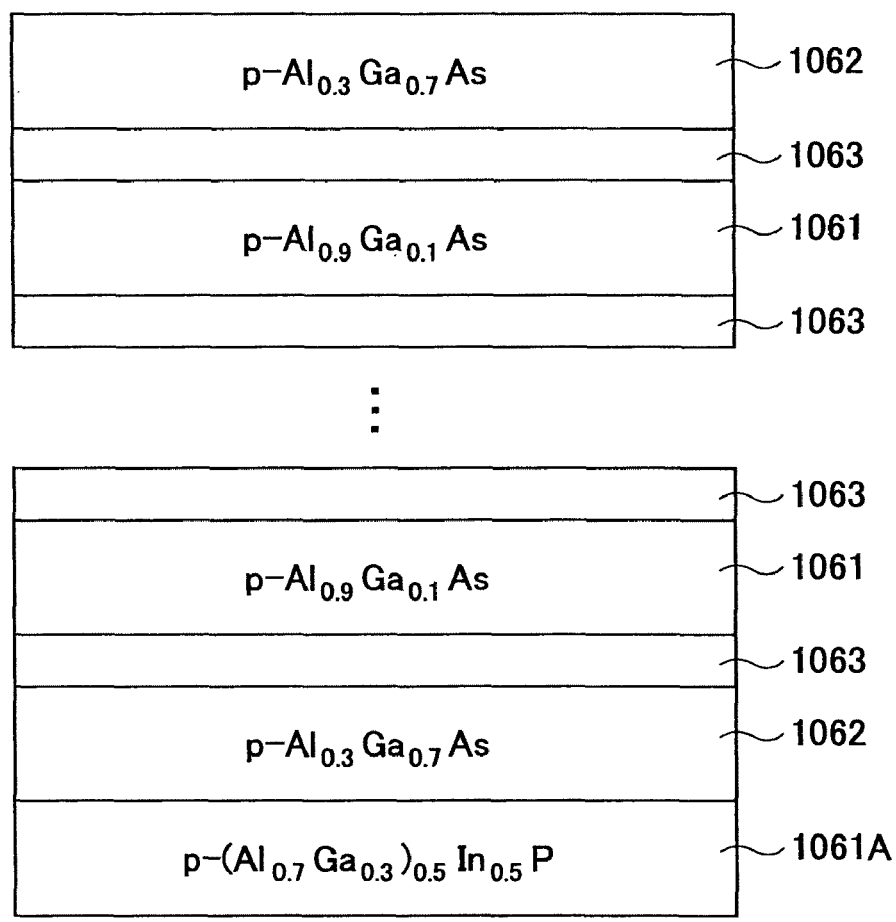
FIG. 11 is a cross-sectional view of a reflective layer shown in FIG. 10 according to the fourth embodiment of the present invention.

FIG. 11 is a cross-sectional view of the reflective layer 106A shown in FIG. 10. Referring to FIG. 11, the reflective layer 106A is the same as the reflective layer 106 shown in FIG. 4 except that the lowermost low refractive index layer 1061 of the reflective layer 106 is replaced with a low refractive index layer 1061A.

The low refractive index layer 1061A is formed of $(Al_{0.7}Ga_{0.3})_{0.5}In_{0.5}P$, and is in contact with the cavity spacer layer 105A. Further, the low refractive index layer 1061A has the film thickness of d4, and d4+d6 and d5+d6 are determined so that the phase shift of oscillating light in the reflective layer 106A is $\pi/2$.

Figure 12:
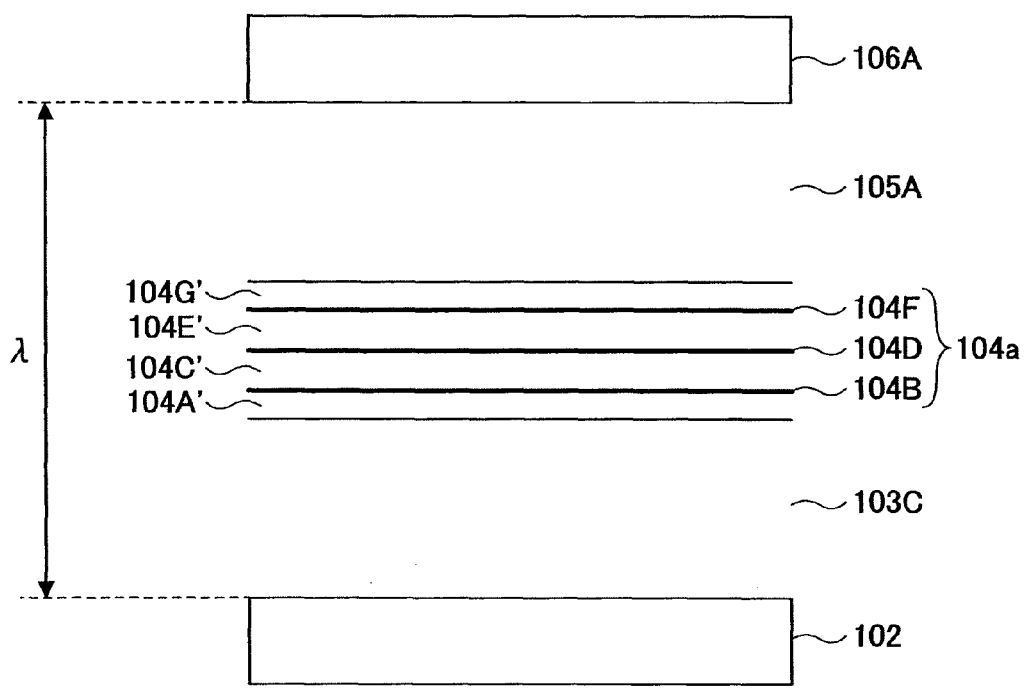
FIG. 12 is a cross-sectional view of part of the two reflective layers, two cavity spacer layers, and an active layer shown in FIG. 10 according to the fourth embodiment of the present invention.

FIG. 12 is a cross-sectional view of part of the two reflective layers 102 and 106A, the two cavity spacer layers 103C and 105A, and the active layer 104a shown in FIG. 10. Referring to FIG. 12, the cavity spacer layer 103C is formed of lattice-matching $(Al_{0.2}Ga_{0.8})_{0.5}In_{0.5}P$. Further, the active layer 104a includes barrier layers 104A', 104C', 104E', and 104G' formed of $Ga_{0.6}In_{0.4}P$ having tensile strain and the well layers 104B, 104D, and 104F described in the first embodiment. Further, the cavity spacer layer 105A is formed of $(Al_{0.2}Ga_{0.8})_{0.5}In_{0.5}P$.

As described above, the well layers 104B, 104D, and 104F of the active layer 104a is formed of GaInPAs, the cavity spacer layer 105A is formed of $(Al_{0.2}Ga_{0.8})_{0.5}In_{0.5}P$, and the low refractive index layer 1061A of the reflective layer 106A, which is in contact with the cavity spacer layer 105A, is formed of $(Al_{0.7}Ga_{0.3})_{0.5}In_{0.5}P$. Accordingly, the low refractive index layer 1061A confines carriers in the active layer 104a. As a result, the surface-emitting laser device 100B can have high output.

Further, the low refractive index layer 1021 of the reflective layer 102, which is in contact with the cavity spacer layer 103B, is formed of $Al_{0.9}Ga_{0.1}As$. Further, $Al_{0.9}Ga_{0.1}As$ is greater in thermal conductivity than $(Al_{0.7}Ga_{0.3})_{0.5}In_{0.5}P$ as indicated by the curved lines k1 and k2 in FIG. 6. More specifically, the thermal conductivity of $Al_{0.9}Ga_{0.1}As$ (x=0.9 in FIG. 6) is 0.255 W/Kcm (as indicated by the curved line k1 in FIG. 6), and the thermal conductivity of $(Al_{0.7}Ga_{0.3})_{0.5}In_{0.5}P$ (x=0.7 in FIG. 6) is 0.056 W/Kcm. As a result, the thermal conductivity of $Al_{0.9}Ga_{0.1}As$ is approximately five times the thermal conductivity of $(Al_{0.7}Ga_{0.3})_{0.5}In_{0.5}P$.

As a result, heat generated in the active layer 104a of the surface-emitting laser device 100C is transferred to the substrate 101 using the reflective layer 102 disposed on the substrate 101 side as a heat dissipation route, so as to suppress an increase in the temperature of the active layer 104a.

Accordingly, in combination with the above-described effect of carrier confinement, the surface-emitting laser device 100C can have high output.

Thus, according to the surface-emitting laser device 1000, the low refractive index layer 1061A, which, of the low refractive index layers 1061 and 1061A forming the reflective layer 106A, is disposed closest to the active layer 104a, is formed of $(Al_{0.7}Ga_{0.3})_{0.5}In_{0.5}P$, and the low refractive index layer 1021, which, of the low refractive index layers 1021 forming the reflective layer 102, is disposed closest to the active layer 104a, is formed of $Al_{0.9}Ga_{0.1}As$ greater in thermal conductivity than $(Al_{0.7}Ga_{0.3})_{0.5}In_{0.5}P$.

In general, $(Al_{0.7}Ga_{0.3})_{0.5}In_{0.5}P$ may be $(Al_eGa_{1-e})_fIn_{1-f}P$ ($0<e\leq1$, $0\leq f\leq1$), and $Al_{0.9}Ga_{0.1}As$ may be $Al_xGa_{1-x}As$ ($0<x\leq1$).

Thus, in the surface-emitting laser device 100C, the low refractive index layer 1021, which, of the low refractive index layers 1021 forming the reflective layer 102, is disposed closest to the active layer 104a, is formed of $Al_{0.9}Ga_{0.1}As$, and the low refractive index layer 1061A, which, of the low refractive index layers 1061 and 1061A forming the reflective layer 106A, is disposed closest to the active layer 104a, is formed of $(Al_{0.7}Ga_{0.3})_{0.5}In_{0.5}P$. Accordingly, the surface-emitting laser device 100C has semiconductor materials disposed asymmetrically with respect to the active layer 104a.

The well layers 104B, 104D, and 104F of the active layer 104a are described above as formed of GaInPAs. In the present invention, however, the well layers 104B, 104D, and 104F are not limited to this, and in general, the well layers 104B, 104D, and 104F may be formed of $(Ga_aIn_{1-a})_bP_{1-b}As$ ($0\leq a\leq1$, $0\leq b\leq1$) except for GaP.

Further, the barrier layers 104A', 104C', 104E', and 104G' of the active layer 104a are described above as formed of $Ga_{0.6}In_{0.4}P$. In the present invention, however, the barrier layers 104A', 104C', 104E', and 104G' are not limited to this, and in general, the barrier layers 104A', 104C', 104E', and 104G' of the active layer 104a may be formed of $(Ga_cIn_{1-c})_dP_{1-d}As$ ($0\leq c\leq1$, $0\leq d\leq1$) greater in band gap than the well layers 104B, 104D, and 104F.

Further, in the surface-emitting laser device 100C, it is preferable to provide an intermediate layer formed of $(Al_{0.1}Ga_{0.9})_{0.5}In_{0.5}P$ between the low refractive index layer 1061A and its adjacent high refractive index layer 1062 in the reflective layer 106A.

In the heterojunction of an AlGaAs-system material and an AlGaInP-system material, a large Al composition of the AlGaInP-system material enlarges the discontinuity of valence bands. However, by inserting the intermediate layer having a small Al composition, it is possible to reduce the discontinuity of valence bands, so that it is possible to reduce the resistance of the reflective layer 106A. The intermediate layer may contain As.

The cavity spacer layer 103C may form a first cavity spacer layer, and the cavity spacer layer 105A may form a second cavity spacer layer.

Further, the reflective layer 106A may form a second reflective layer.

The surface-emitting laser device 100C is manufactured according to the processes shown in FIGS. 5A through 5H. In this case, the cavity spacer layer 103, the active layer 104, the cavity spacer layer 105, and the reflective layer 106 may be read as the cavity spacer layer 103C, the active layer 104a, the cavity spacer layer 105A, and the reflective layer 106A, respectively.

Further, according to the fourth embodiment, $(Al_{0.7}Ga_{0.3})_{0.5}In_{0.5}P$ is employed as the low refractive index layer 1061A of the p-side reflective layer 106A, which is the closest to the cavity region, while $Al_{0.9}Ga_{0.1}As$ is used for the low refractive index layers 1021 of the n-side reflective layer 102. Wide-gap $(Al_{0.7}Ga_{0.3})_{0.5}In_{0.5}P$, which is effective for confinement of electrons, may be doped. In this case, Zn or Mg is used as a dopant. However, Zn and Mg have higher rates of diffusion than C, which is used as a dopant for AlGaAs. If an $(Al_{0.7}Ga_{0.3})_{0.5}In_{0.5}P$ layer is provided in the cavity region as in the first embodiment and the $(Al_{0.7}Ga_{0.3})_{0.5}In_{0.5}P$ layer is doped, the dopant may be diffused into and adversely affect the active layer 104. However, according to the fourth embodiment, since $(Al_{0.7}Ga_{0.3})_{0.5}In_{0.5}P$ is provided in the reflective layer 106A, which is more remote than the cavity region, the adverse effect of dopant diffusion is reduced.

Conventionally, the interface of a cavity region and a reflecting mirror is positioned at an antinode of field intensity distribution at the interface of an AlGaInP-system material and an AlGaAs-system material in the upper part of the cavity region, and a semiconductor layer containing Al, In, and P as principal components is provided in the uppermost part of the cavity region. Accordingly, the interface with an upper reflecting mirror including a semiconductor layer containing Al, Ga, and As as principal components is positioned at an antinode of field intensity distribution, where there is a great effect of optical absorption. However in the case of causing crystal growth of a semiconductor layer containing Al, Ga, and As as principal components on a semiconductor layer containing Al, In, and P as principal components, separation of In, such as In carry-over, is likely to occur, which should be suppressed. This problem is conspicuous in the case of causing crystal growth of a semiconductor layer containing Al, Ga, and As as principal components on a semiconductor layer containing Al, In, and P as principal components.

On the other hand, the surface-emitting laser device 100C according to the fourth embodiment is designed so that the low refractive index layer 1061A of the reflective layer 106A closest to the cavity region is $(Al_{0.7}Ga_{0.3})_{0.5}In_{0.5}P$ so as to position the interface of the semiconductor layer containing Al, In, and P as principal components and a semiconductor layer containing Al, Ga, and As as principal components (part of the upper reflective layer 106A) at a node of field intensity distribution, thereby significantly reducing the effect of optical absorption at the interface. Accordingly, even if there is some extent of In separation, it is possible to significantly suppress an adverse effect of threshold increase.

Further, it is preferable to reduce In separation by providing a thin In separation preventing layer between the semiconductor layer containing Al, In, and P as principal components and a semiconductor layer containing Al, Ga, and As as principal components (part of the upper reflective layer 106A). In the case of stacking a high refractive index layer of $Al_yGa_{1-y}As$ ($0 \leq y < x \leq 1$) and a low refractive index layer $(Al_aGa_{1-a})_bIn_{1-b}P$ ($0 < a \leq 1$, $0 \leq b \leq 1$), an intermediate layer (In separation prevention layer) of $(Al_{a1}Ga_{1-a1})_{b1}In_{1-b1}P$ ($0 \leq a1 < a < 1$, $0 \leq b1 \leq 1$) smaller in Al composition than $(Al_aGa_{1-a})_bIn_{1-b}P$ ($0 < a \leq 1$, $0 \leq b \leq 1$) may be provided at their interface.

In the case of stacking a high refractive index layer of $Al_yGa_{1-y}As$ ($0 \leq y < x \leq 1$) on a low refractive index layer $(Al_aGa_{1-a})_bIn_{1-b}P$ ($0 < a \leq 1$, $0 \leq b \leq 1$), interposition of the intermediate layer smaller in Al composition therebetween reduces the Al composition at their interface. Accordingly, the high refractive index layer of $Al_yGa_{1-y}As$ ($0 \leq y < x \leq 1$) can be formed with ease on the low refractive index layer $(Al_aGa_{1-a})_bIn_{1-b}P$ ($0 < a \leq 1$, $0 \leq b \leq 1$) with a wider range of conditions.

Further, in the heterojunction of an AlGaAs-system material and an AlGaInP-system material, a large Al composition of the AlGaInP-system material enlarges the discontinuity of valence bands. However, by inserting the intermediate layer having a small Al composition, it is possible to reduce the discontinuity of valence bands, so that it is possible to reduce resistance in the case of applying current in a layer-stacking direction.

Otherwise, the fourth embodiment is the same as the first embodiment.

Fifth Embodiment

Figure 13:
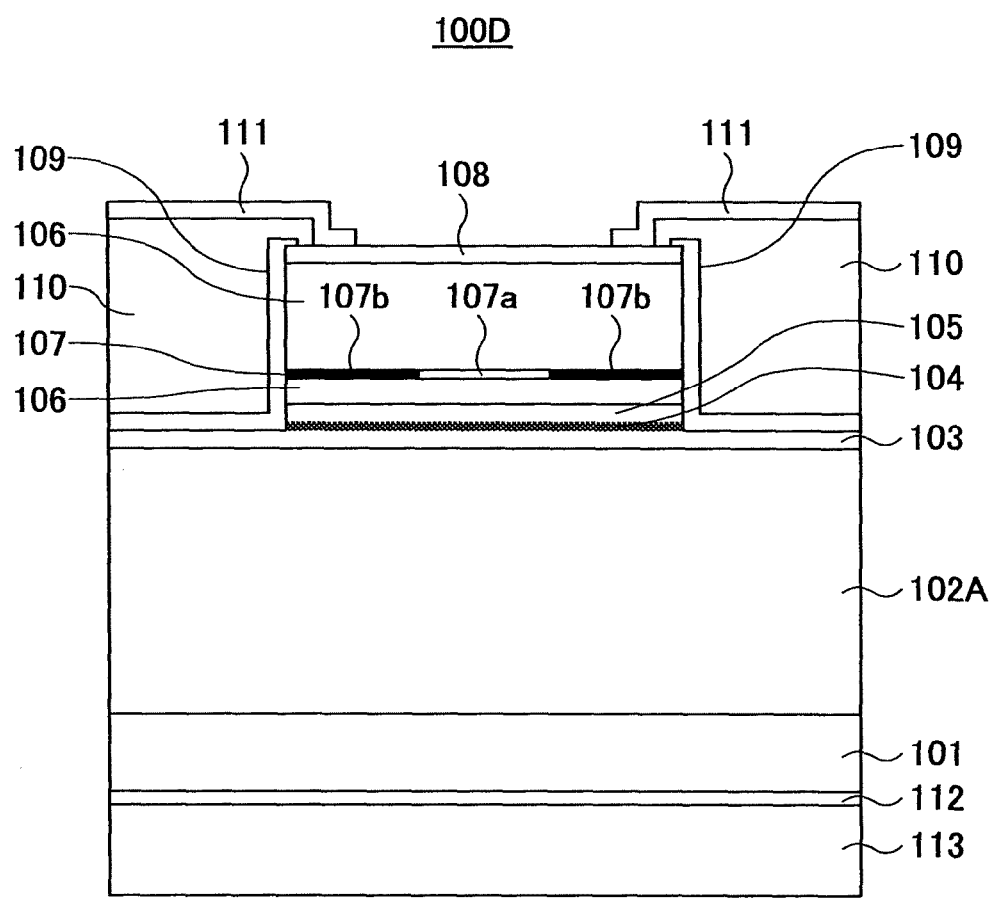
FIG. 13 is a schematic cross-sectional view of a surface-emitting laser device according to a fifth embodiment of the present invention.

FIG. 13 is a schematic cross-sectional view of a surface-emitting laser device 100D according to a fifth embodiment of the present invention. Referring to FIG. 13, the surface-emitting laser device 100D is the same as the surface-emitting laser device 100 shown in FIG. 1 except that the reflective layer 102 of the surface-emitting laser device 100 is replaced with a reflective layer 102A. The reflective layer 102A is formed in contact with the substrate 101 and the cavity spacer layer 103. According to the fifth embodiment, the etching bottom of the mesa is formed so as to be deeper than the selectively oxidized layer 107 but not reach the reflective layer 102A.

Figure 14:
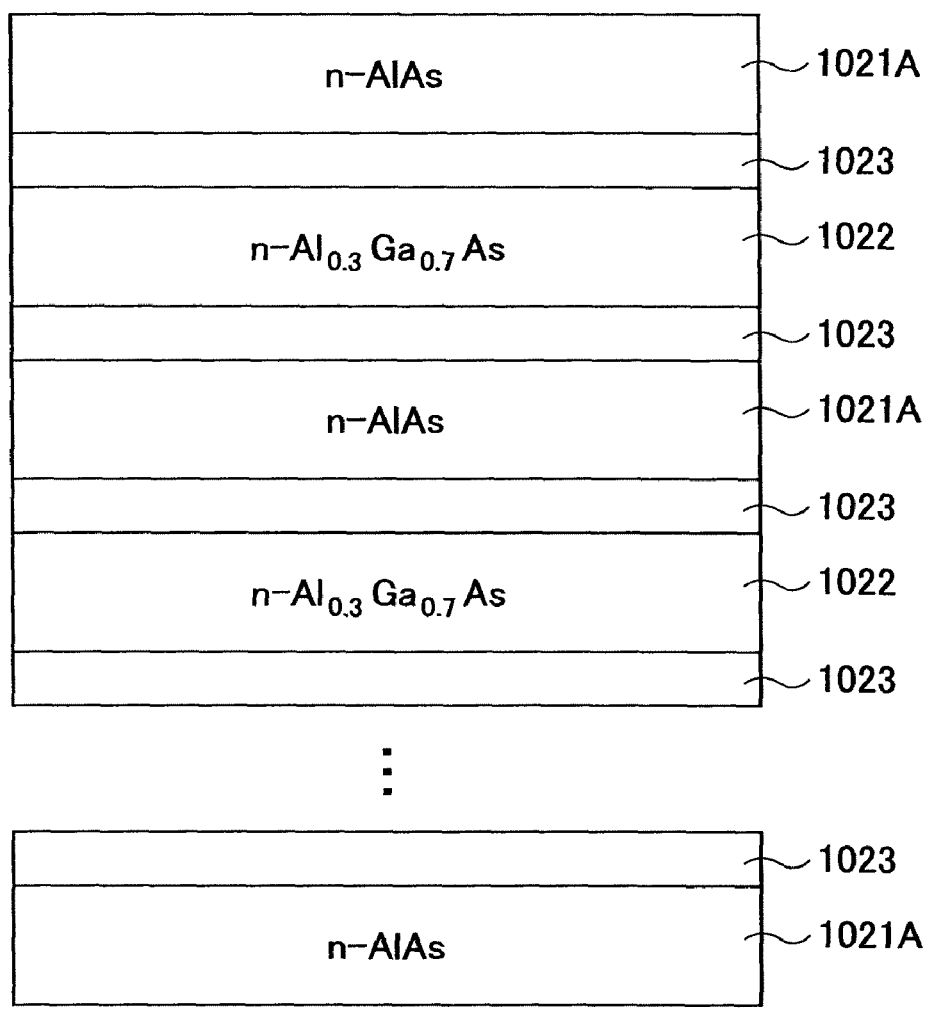
FIG. 14 is a cross-sectional view of a reflective layer shown in FIG. 13 according to the fifth embodiment of the present invention.

FIG. 14 is a cross-sectional view of the reflective layer 102A shown in FIG. 13. Referring to FIG. 14, the reflective layer 102A is the same as the reflective layer 102 shown in FIG. 3 except that the low refractive index layers 1021 of the reflective layer 102 are replaced with low refractive index layers 1021A. The low refractive index layers 1021A are formed of AlAs.

In the AlGaAs system, AlAs has the highest thermal conductivity (=0.91 W/Kcm). (See the curved line k1 of FIG. 6.) The thermal conductivity of AlAs is 3.5 times that of $Al_{0.9}Ga_{0.1}As$ or more.

Accordingly, by forming of AlAs the low refractive index layers 1021A of the reflective layer 102A disposed on the substrate 101 side of the active layer 104, it is possible to transfer heat generated in the active layer 104 to the substrate 101 through the reflective layer 102A, thereby suppressing an increase in the temperature of the active layer 104. As a result, the surface-emitting laser device 100C has good temperature characteristics and high output.

The surface-emitting laser device 100D is manufactured according to the processes shown in FIGS. 5A through 5H. In this case, the reflective layer 102 may be read as the reflective layer 102A.

However, since the surface-emitting laser device 100D has the low refractive index layers 1021A formed of AlAs, there is concern that etching may reach as deep as one or more of the low refractive index layers 1021A (=AlAs) of the reflective layer 102A so as to expose the edge parts of the low refractive index layers 1021A at the time of forming a mesa shape by dry etching.

However, AlGaInP-system materials are used in the regions of the cavity spacer layers 103 and 105 and the active layer 104 of the surface-emitting laser device 100D, and the rate of dry etching can be lower for a material containing In than for semiconductor distributed Bragg reflectors (the reflecting layers 102A and 106) formed of AlGaAs-system materials because the vapor pressure of an In chloride is low. That is, the cavity region formed of the cavity spacer layers 103 and 105 and the active layer 104 can be used as an etch stop layer depending on etching conditions. Therefore, it is possible to absorb variations in etching rate among lots and the in-plane distribution of etching rate, so that it is possible to etch the selectively oxidized layer 107 and also to prevent etching depth from reaching the reflective layer 102A. For such a reason, the peripheral parts of the active layer 104, the cavity spacer layer 105, the reflective layer 106, the selectively oxidized layer 107, and the contact layer 108 are etched by dry etching using a halogen gas.

Accordingly, by performing dry etching using a halogen gas, it is possible to lower the etching rate in the region of the cavity spacer layer 103, the active layer 104, and the cavity spacer layer 105, so that it is possible to stop etching in the region of the cavity spacer layer 103, the active layer 104, and the cavity spacer layer 105 formed on the upper side of the reflective layer 102A.

Further, at the time of etching, it is also possible to stop the etching in the region of the cavity spacer layers 103 and 105 and the active layer 104 formed on the upper side of the reflective layer 102A by obtaining the ratio of light emission of In (451 nm) to light emission of Al (396 nm) using a plasma emission spectrometer and monitoring a change over time in the ratio.

The surface-emitting laser device 100D according to the fifth embodiment may be an application of the reflective layer 102A to the surface-emitting laser device 100A, 100B, or 100C. The reflective layer 102A may form a first reflective layer.

Otherwise, the fifth embodiment is the same as the first through fourth embodiments.

Sixth Embodiment

Figure 15:
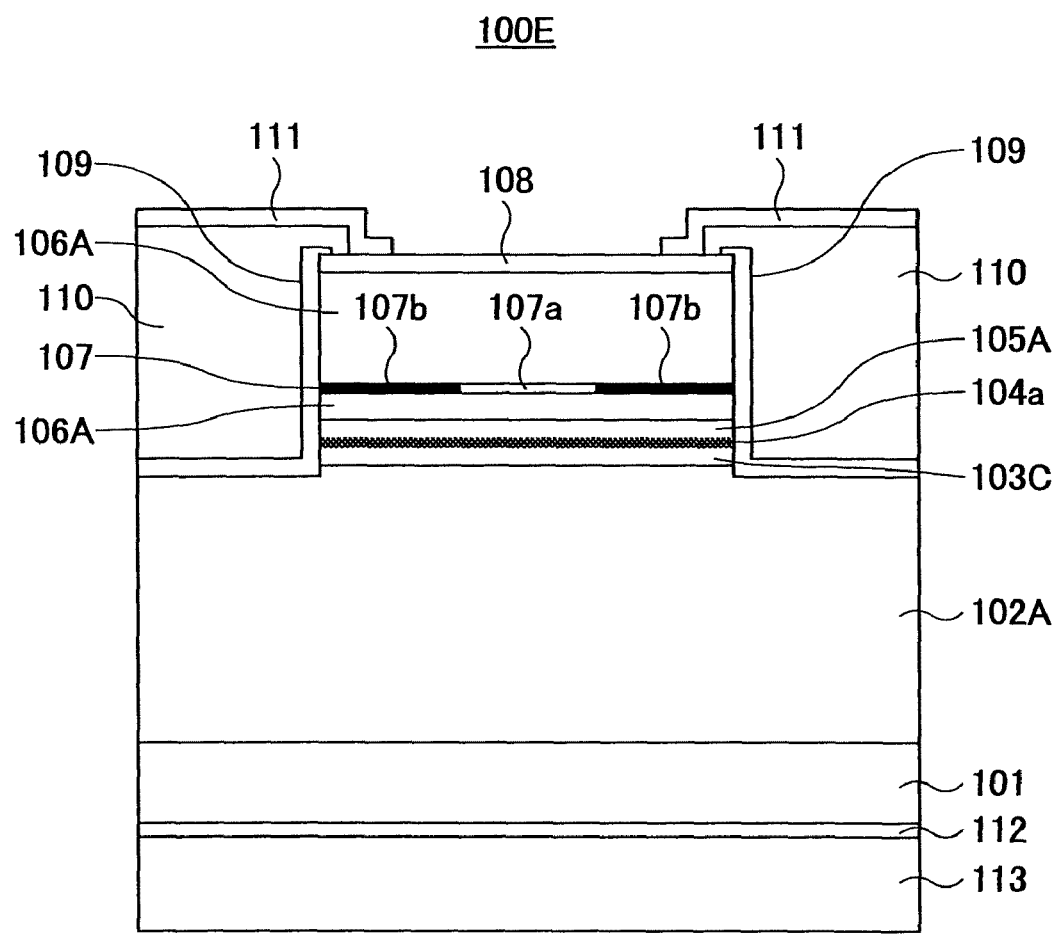
FIG. 15 is a schematic cross-sectional view of a surface-emitting laser device according to a sixth embodiment of the present invention.

FIG. 15 is a schematic cross-sectional view of a surface-emitting laser device 100E according to a sixth embodiment of the present invention. Referring to FIG. 15, the surface-emitting laser device 100E is the same as the surface-emitting laser device 100C shown in FIG. 10 except that the reflective layer 102 of the surface-emitting laser device 100C is replaced with the reflective layer 102A. The reflective layer 102A is as shown in FIG. 14.

According to the surface-emitting laser device 100E, the low refractive index layer 1061A of the p-side reflective layer 106A, which is the closest to the cavity region (a region formed of the cavity spacer layer 103C, the active layer 104a, and the cavity spacer layer 105A), is formed of p-$(Al_{0.7}Ga_{0.3})_{0.5}In_{0.5}P$ while the low refractive index layers 1021A of the n-side reflective layer 102A are formed of AlAs. This $(Al_{0.7}Ga_{0.3})_{0.5}In_{0.5}P$, which is a wide-gap semiconductor material effective for confinement of electrons, may be doped. In this case, Zn or Mg is used as a dopant. However, Zn and Mg have higher rates of diffusion than C, which is used as a dopant for AlGaAs. If an $(Al_{0.7}Ga_{0.3})_{0.5}In_{0.5}P$ layer is provided in the cavity region (a region formed of the cavity spacer layer 103, the active layer 104, and the cavity spacer layer 105) as in the surface-emitting laser device 100 according to the first embodiment, and the $(Al_{0.7}Ga_{0.3})_{0.5}In_{0.5}P$ layer is doped with Zn or Mg, Zn or Mg may be diffused into and adversely affect the active layer 104. However, according to the sixth embodiment, since the low refractive index layer 1061A (FIG. 11) formed of Zn- or Mg-doped p-$(Al_{0.7}Ga_{0.3})_{0.5}In_{0.5}P$ is provided in the reflective layer 106A, which is more remote than the cavity region (a region formed of the cavity spacer layer 103C, the active layer 104a, and the cavity spacer layer 105A), the adverse effect of Zn or Mg diffusion into the active layer 104a is reduced.

Further, AlAs has the greatest thermal conductivity (=0.91 W/Kcm) in the AlGaAs system, and the thermal conductivity of AlAs is 3.5 times that of $Al_{0.9}Ga_{0.1}As$ or more. Accordingly, by forming of AlAs the low refractive index layers 1021A of the reflective layer 102A disposed on the substrate 101 side of the active layer 104a, it is possible to efficiently transfer heat generated in the active layer 104a to the substrate 101 through the reflective layer 102A, thereby suppressing an increase in the temperature of the active layer 104a. As a result, the surface-emitting laser device 100E has good temperature characteristics and high output.

Seventh Embodiment

Figure 16:
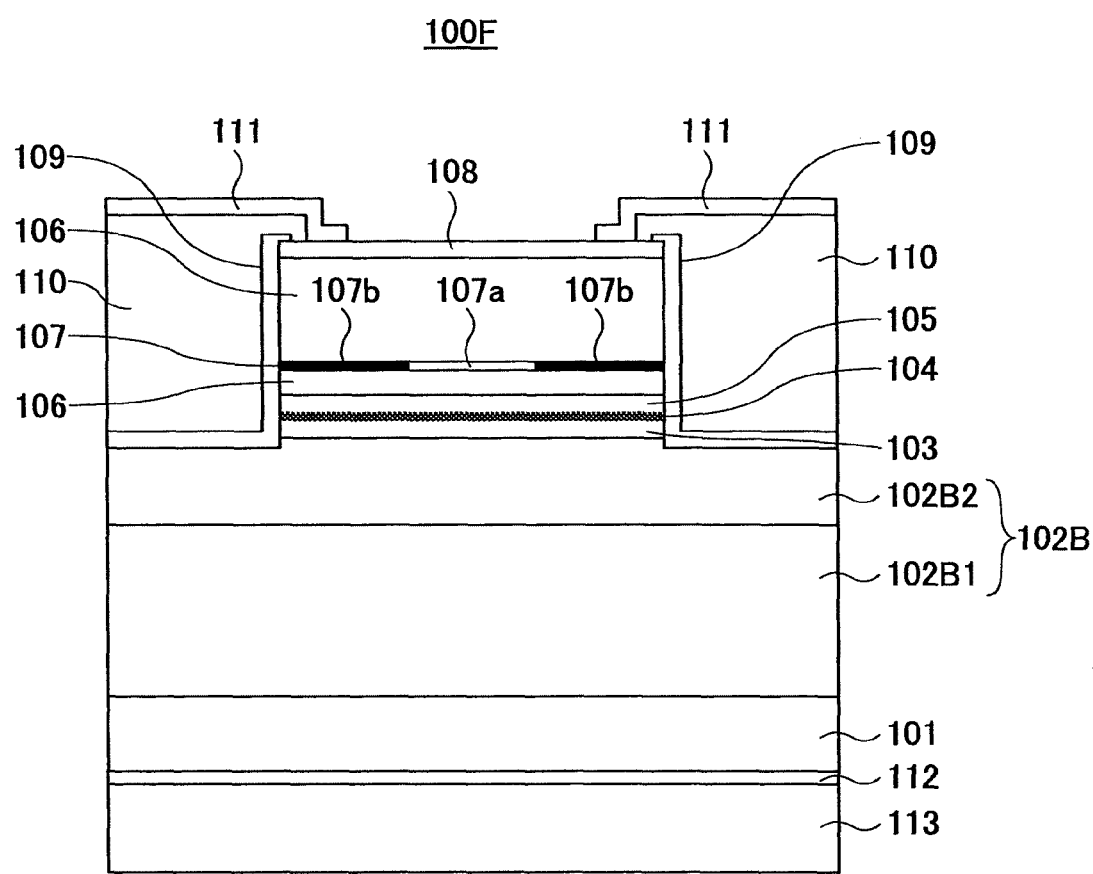
FIG. 16 is a schematic cross-sectional view of a surface-emitting laser device according to a seventh embodiment of the present invention.

FIG. 16 is a schematic cross-sectional view of a surface-emitting laser device 100F according to a seventh embodiment of the present invention. Referring to FIG. 16, the surface-emitting laser device 100F is the same as the surface-emitting laser device 100 shown in FIG. 1 except that the reflective layer 102 of the surface-emitting laser device 100 is replaced with a reflective layer 102B.

The reflective layer 102B includes a reflective part 102B1 and 102B2. The reflective part 102B1 is formed in contact with the substrate 101 and the reflective part 102B2 is formed in contact with the reflective part 102B1 and the cavity spacer layer 103.

Figure 17:
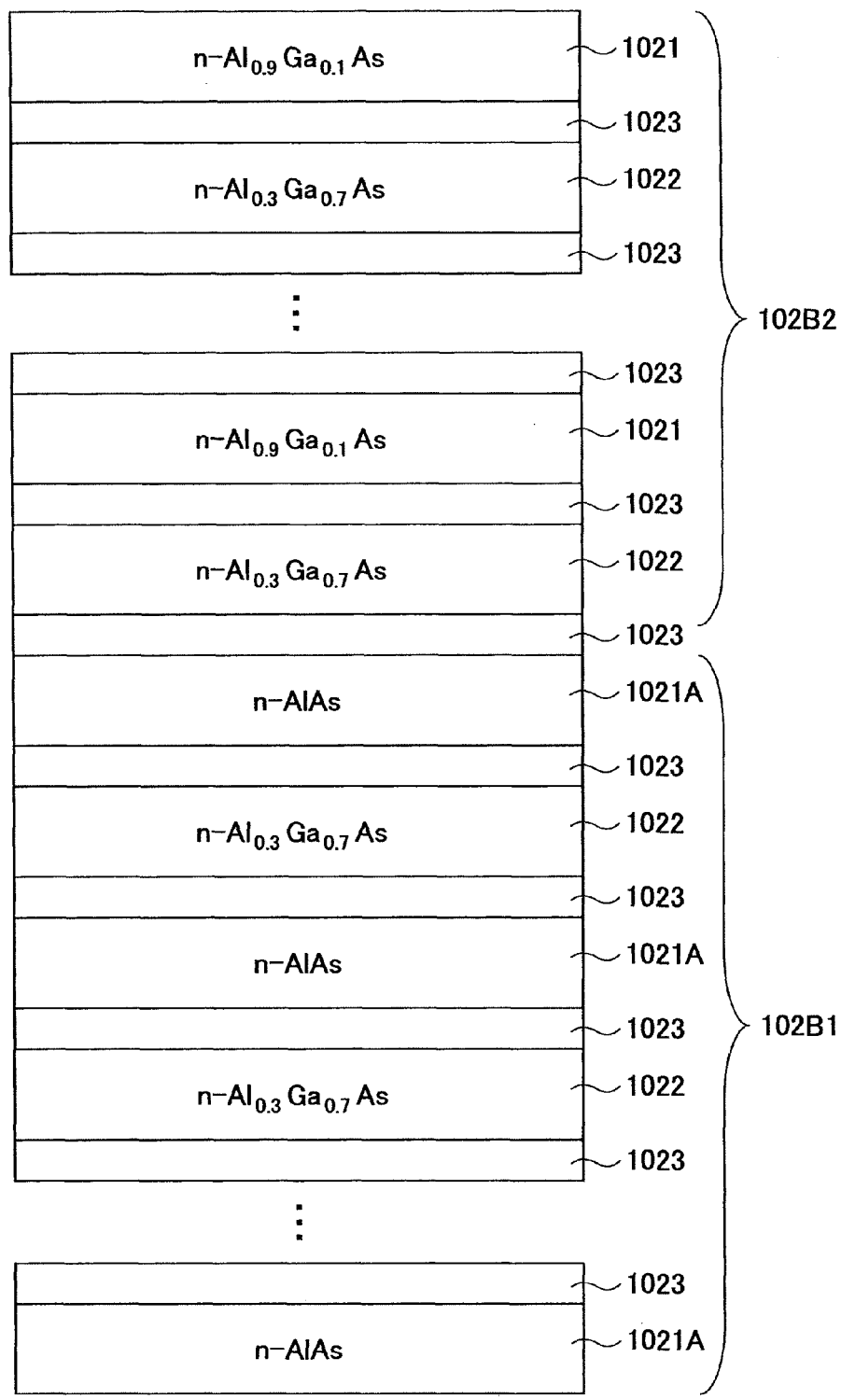
FIG. 17 is a cross-sectional view of a reflective layer shown in FIG. 16 according to the seventh embodiment of the present invention.

FIG. 17 is a cross-sectional view of the reflective layer 102B shown in FIG. 16. Referring to FIG. 17, the reflective part 102B1 is a lamination of 31 periods of the low refractive index layer 1021A, the high refractive index layer 1022, and the composition gradient layer 1023.

The low refractive index layers 1021A, the high refractive index layers 1022, and the composition gradient layers 1023 are as described above. That is, the reflective part 102B1 has the same composition as the reflective layer 102A described in the fifth embodiment, and is different therefrom only in the number of stacked layers.

The reflective part 102B2 is a lamination of 9.5 periods of the low refractive index layer 1021, the high refractive index layer 1022, and the composition gradient layer 1023.

The low refractive index layers 1021, the high refractive index layers 1022, and the composition gradient layers 1023 are as described above. That is, the reflective part 102B2 has the same composition as the reflective layer 102 described in the first embodiment, and is different therefrom only in the number of stacked layers.

In the surface-emitting laser device 100F, the reflective part 102B1 having the low refractive index layers 1021A formed of AlAs having high thermal conductivity is formed in contact with the substrate 101, and the reflective part 102B2 having $Al_{0.9}Ga_{0.1}As$ whose etching rate is lower than AlAs is provided on the upper side of the reflective part 102B1.

Accordingly, it is possible to prevent etching depth from reaching the reflective part 102B1 at the time of forming a mesa shape in the process of manufacturing the surface-emitting laser device 100F, so that the surface-emitting laser device 100F can be manufactured more easily than the surface-emitting laser device 100D.

Further, it is possible to transfer heat generated in the active layer 104 to the substrate 101 through the reflective part 102B1, so that it is possible to prevent an increase in the temperature of the active layer 104. As a result, the surface-emitting laser device 100F can have high output.

The surface-emitting laser device 100D is manufactured according to the processes shown in FIGS. 5A through 5H. In this case, the reflective layer 102 may be read as the reflective layer 102B.

The surface-emitting laser device 100F according to the seventh embodiment may be an application of the reflective layer 102B to the surface-emitting laser device 100A, 100B, 100C, 100D, or 100E. The reflective layer 102B may form a first reflective layer.

Otherwise, the seventh embodiment is the same as the first through sixth embodiments.

Eighth Embodiment

Application

Figure 18:
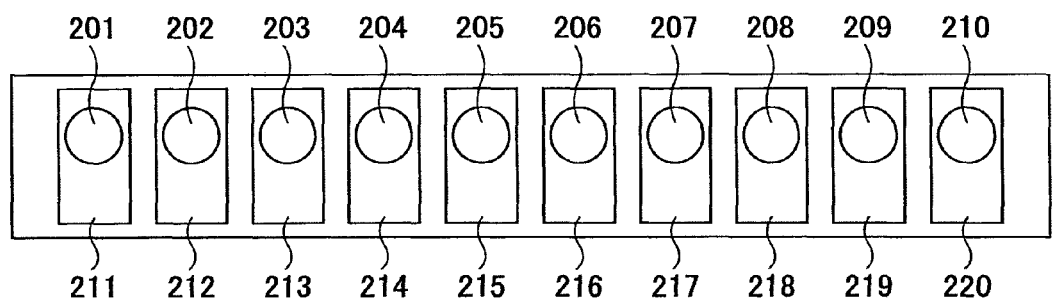
FIG. 18 is a plan view of a surface-emitting laser array using the surface-emitting laser device shown in FIG. 1 according to an eighth embodiment of the present invention.

FIG. 18 is a plan view of a surface-emitting laser array 200 using the surface-emitting laser device 100 shown in FIG. 1 according to an eighth embodiment of the present invention. Referring to FIG. 18, the surface-emitting laser array 200 includes surface-emitting laser devices 201 through 210 and electrode pads 211 through 220.

Each of the surface-emitting laser devices 201 through 210 is formed of the surface-emitting laser device 100 shown in FIG. 1. The surface-emitting laser devices 201 through 210 are disposed one-dimensionally. The electrode pads 211 through 220 are provided in correspondence to the surface-emitting laser devices 201 through 210, respectively.

Since the surface-emitting laser devices 100 are of a surface-emitting type, the surface-emitting laser devices 100 can be arrayed easily with high device position accuracy. Further, the surface-emitting laser devices 100 have a structure with an improved heat dissipation characteristic as described above. Accordingly, the surface-emitting laser array 200 can be reduced in device interval with high device density compared with the conventional surface-emitting laser array. As a result, an increased number of chips can be taken, so that it is possible to reduce cost.

Further, when applied to a write optical system, integration of multiple surface-emitting laser devices 100 capable of performing a high output operation onto the same substrate facilitates simultaneous writing with multiple beams so as to remarkably increase writing rate, so that it is possible to perform printing without reduction in printing rate even if there is an increase in writing dot density. If the writing dot density remains the same, it is possible to increase printing rate. Further, in an application to communications, it is possible to perform simultaneous data transmission with multiple beams, so that it is possible to perform high-speed communication. Further, the surface-emitting laser device 100 operates with low power consumption, and in particular, can reduce an increase in temperature if incorporated and used in an apparatus.

In the surface-emitting laser array 200, each of the surface-emitting laser devices 201 through 210 may also be formed of any of the surface-emitting laser devices 100A, 100B, 100C, 100D, 100E, and 100F.

Further, the surface-emitting laser array 200 may also have multiple surface-emitting laser devices arranged two-dimensionally.

Ninth Embodiment

Application

Figure 19:
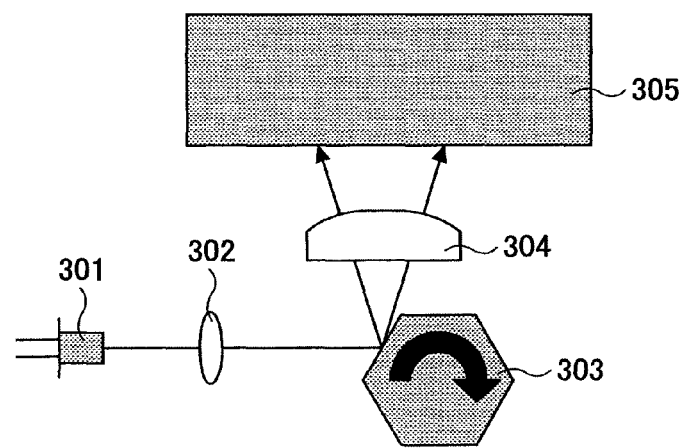
FIG. 19 is a schematic diagram showing an image forming apparatus according to a ninth embodiment of the present invention.

FIG. 19 is a schematic diagram showing an image forming apparatus 300 according to a ninth embodiment of the present invention. Referring to FIG. 19, the image forming apparatus 300 includes a surface-emitting laser array 301, lenses 302 and 304, a polygon mirror 303, and a photosensitive body 305.

The surface-emitting laser array 301 emits multiple beams. The lens 302 guides the beams emitted from the surface-emitting laser array 301 to the polygon mirror 303.

The polygon mirror 303 rotates clockwise at a predetermined speed so as to cause the multiple beams received from the lens 302 to scan in the main scanning direction and the sub scanning direction and guide the beams to the lens 304. The lens 304 guides the beams reflected from the polygon mirror 303 to the photosensitive body 305.

Thus, according to the image forming apparatus 300, multiple beams from the surface-emitting laser array 301 are focused into multiple light spots separated in the sub scanning direction on the photosensitive body 305 serving as a scanned surface by causing the polygon mirror 303 to rotate at high speed and adjusting lighting timing for dot positions, using the same optical system formed of the lenses 302 and 304 and the polygon mirror 303.

Figure 20:
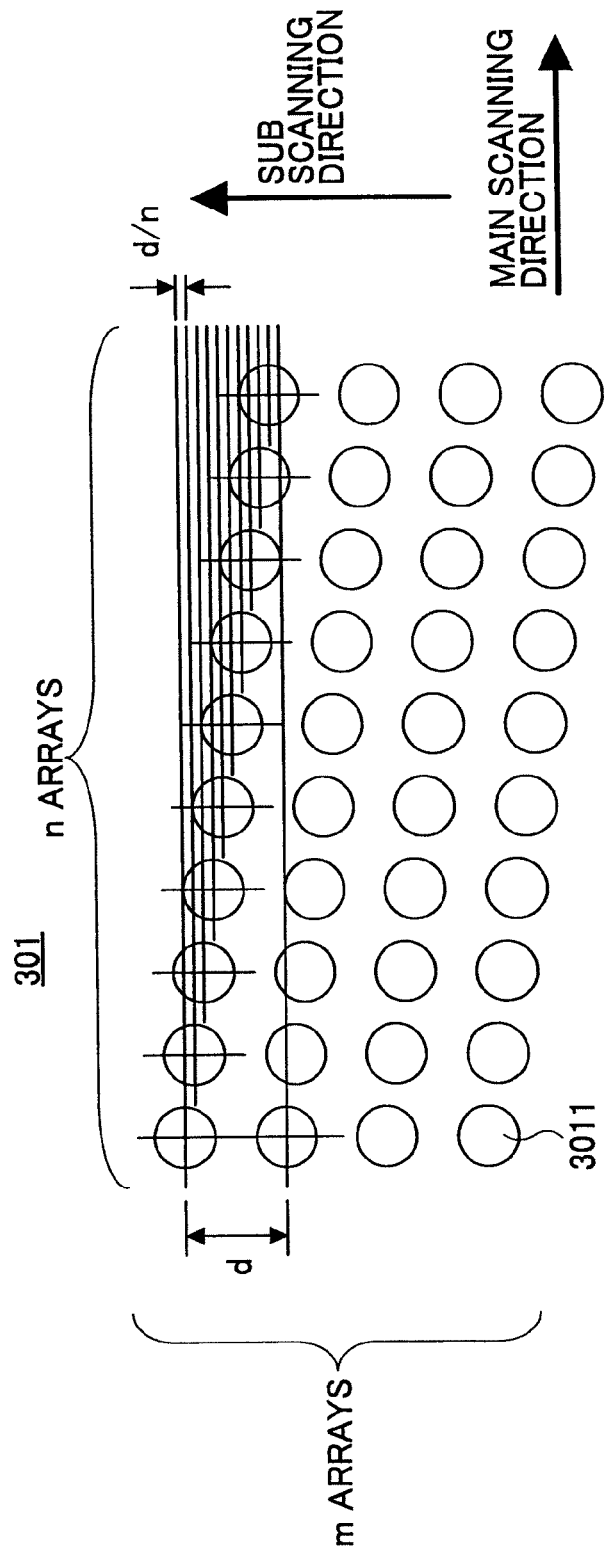
FIG. 20 is a plan view of the surface-emitting laser array shown in FIG. 19 according to the ninth embodiment of the present invention.

FIG. 20 is a plan view of the surface-emitting laser array 301 shown in FIG. 19. Referring to FIG. 20, the surface-emitting laser array 301 has m×n surface-emitting laser devices 3011 arranged substantially diamondwise. More specifically, the surface-emitting laser array 301 has the 40 surface-emitting laser devices 3011 arranged in four (m=4) rows (horizontal arrays) and ten (n=10) columns (vertical arrays). Each of the surface-emitting laser devices 3011 is formed of any of the surface-emitting laser devices 100, 100A, 100B, 100C, 100D, 100E, and 100F.

Letting the interval (distance) between each vertically adjacent two of the surface-emitting laser devices 3011 be d, the recording density is determined by d/n. Accordingly, in the surface-emitting laser array 301, the interval d and the number of arrays (lines) n in the main scanning direction are determined in consideration of recording density.

In the case of FIG. 20, the 40 surface-emitting laser devices 3011 are arranged at the intervals d of 40 μm in the sub scanning direction and at intervals of 40 μm in the main scanning direction so that the columns (vertical arrays) of the surface emitting laser devices 3011 are successively offset in the sub scanning direction by 4 μm each.

By controlling the lighting timing of the 40 surface-emitting laser devices 3011, it is possible to write 40 dots at regular intervals in the sub scanning direction on the photosensitive body 305.

If the power of the optical system remains the same, writing density can be higher with a narrower interval d of the surface-emitting laser array 301 in the sub scanning direction. Since each of the surface-emitting laser devices 3011 is formed of any of the surface-emitting laser devices 100, 100A, 100B, 100C, 100D, 100E, and 100F, the surface-emitting laser devices 3011 can be arranged with high density in the surface-emitting laser array 301. As a result, it is possible to perform high-density writing in the image forming apparatus 300.

Further, it is possible to perform high-speed printing with 40 dots being writable at the same time. Further, it is possible to further increase printing rate by increasing the number of arrays.

Further, since the output of each surface-emitting laser device 3011 is higher than that of the conventional surface-emitting laser device, the printing rate can be higher than in the case of forming an array of as many conventional surface-emitting laser devices.

Each of the surface-emitting laser arrays 200 and 301 and the surface-emitting laser devices 100, 100A, 100B, 100C, 100D, 100E, and 100F may also be mounted on an optical pickup unit. As a result, it is possible to use the surface-emitting laser arrays 200 and 301 and the surface-emitting laser devices 100, 100A, 100B, 100C, 100D, 100E, and 100F as light sources for recording data on and/or reproducing data from optical disks.

Tenth Embodiment

Application

Figure 21:
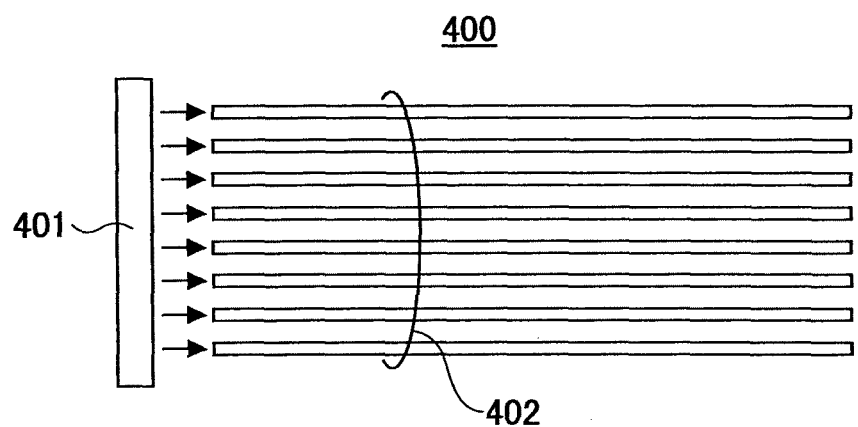
FIG. 21 is a schematic diagram showing an optical transmitter module according to a tenth embodiment of the present invention.

FIG. 21 is a schematic diagram showing an optical transmitter module 400 according to a tenth embodiment of the present invention. Referring to FIG. 21, the optical transmitter module 400 includes a surface-emitting laser array 401 and an optical fiber 402. The surface-emitting laser array 401 has multiple surface-emitting laser devices, which may be the surface-emitting laser devices 100, 100A, 100B, 100C, 100D, 100E, or 100F, arranged one-dimensionally. The optical fiber 402 includes multiple plastic optical fibers (POFs). The multiple plastic optical fibers are disposed in correspondence to the multiple surface-emitting laser devices 100, 100A, 100B, 100C, 100D, 100E, or 100F of the surface-emitting laser array 401.

In the optical transmitter module 400, laser light emitted from each of the surface-emitting laser devices 100, 100A, 100B, 100C, 100D, 100E, or 100F is transmitted to the corresponding plastic optical fiber. Acrylic plastic optical fibers have the bottom of absorption loss at 650 nm, and studies have been made of a 650 nm surface-emitting laser device, which has not been put into practical use because of poor high-temperature characteristics.

An LED (Light Emitting Diode) has been used as a light source, but it is difficult to modulate the LED at high speed. A semiconductor laser is required in order to realize high-speed transmission faster than 1 Gbps.

The above-described surface-emitting laser devices 100, 100A, 100B, 100C, 100D, 100E, and 100F have an oscillation wavelength of 780 nm, but have an improved heat dissipation characteristic, high output, and excellent high-temperature characteristics. Although the absorption loss of an optical fiber increases, transmission is performable if the distance is short.

In the field of optical communications, parallel transmission using a laser array integrating multiple semiconductor lasers has been attempted in order to transmit more data at the same time. As a result, it is possible to perform high-speed parallel transmission, so that it is possible to simultaneously transmit more data than conventionally.

In the optical transmitter module 400, the surface-emitting laser devices 100, 100A, 100B, 100C, 100D, 100E, or 100F and the plastic optical fibers are provided with one-to-one correspondence. On the other hand, it is possible to further increase transmission rate by performing wavelength multiplexing transmission by disposing multiple surface-emitting laser devices having different oscillation wavelengths in a one-dimensional or two-dimensional array.

Further, the optical transmitter module 400 can be formed at low cost by combining the surface-emitting laser devices 100, 100A, 100B, 100C, 100D, 100E, or 100F with inexpensive POFs, and by using the low-cost optical transmitter module 400 in an optical communication system, the optical communication system can be realized at low cost. Since the cost is extremely low, the optical transmitter module 400 and the optical communication system using the same are effective in short-distance data communications at home, in an office, and inside an apparatus.

11th Embodiment

Application

Figure 22:
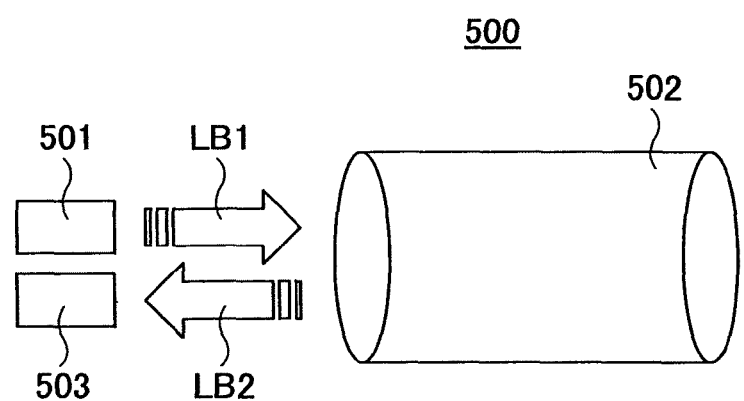
FIG. 22 is a schematic diagram showing an optical transmitter receiver module according to an $11^{th}$ embodiment of the present invention.

FIG. 22 is a schematic diagram showing an optical transmitter receiver module 500 according to an 11th embodiment of the present invention. Referring to FIG. 22, the optical transmitter receiver module 500 includes a surface-emitting laser device 501, an optical fiber 502, and a light-receiving element 503.

The surface-emitting laser device 501 is formed of any of the surface-emitting laser devices 100, 100A, 100B, 100C, 100D, 100E, and 100F, and emits laser light LB1 of 780 nm to the optical fiber 502. The optical fiber 502 is formed of a plastic optical fiber. The optical fiber 502 receives the laser light LB1 from the surface-emitting laser device 501, and transmits the received laser light LB1 to a receiver module (not graphically illustrated). Further, the optical fiber 502 transmits laser light received from another transmitter module (not graphically illustrated), and emits laser light LB2 to the light-receiving element 503. The light-receiving element 503 receives the laser light LB2 from the optical fiber 502, and converts the received laser light LB2 into an electrical signal.

Thus, the transmitter receiver module 500 emits the laser light LB1 and has the laser light LB1 transmitted by the optical fiber 502, and receives the laser light LB2 from another transmitter module and converts the received laser light LB2 into an electrical signal.

Since the transmitter receiver module 500 is manufactured using the surface-emitting laser device 100, 100A, 100B, 100C, 110D, 100E, or 100F and an inexpensive plastic optical fiber, it is possible to realize an optical communication system at low cost. Further, since the optical fiber 502 has a large diameter, the surface-emitting laser device 501 and the optical fiber 502 can be coupled with ease, so that it is possible to reduce mounting cost. As a result, it is possible to realize an extremely low-cost optical transmitter receiver module.

Further, the surface-emitting laser device 501 (=the surface-emitting laser device 100, 100A, 100B, 100C, 100D, 100E, or 100F) has an improved heat dissipation characteristic, high output, and excellent high-temperature characteristics, the surface-emitting laser device 501 can be used up to high temperature without cooling, and can realize an optical transmitter receiver module at lower cost.

An optical communication system using the above-described surface-emitting laser device 100, 100A, 100B, 100C, 100D, 100E, or 100F can be used as an optical interconnection in particular for short-distance communications in the transmission between apparatuses such as computers of a LAN (Local Area Network) using an optical fiber and in data transmission between boards in an apparatus, between LSIs on a board, and between devices in an LSI.

The processing performance of LSIs has been improved in these years, and the transmission rate at the connection of LSIs is to be rate-determining in the future. It is possible to realize a very-high-speed computer system by changing signal connection in a system from conventional electric connection to optical connection, for example, by connecting boards in a computer system, LSIs on a board, and devices in an LSI using the optical transmitter module 400 or the optical transmitter receiver module 500.

Further, it is possible to construct a very-high-speed network system by connecting multiple computer systems using the optical transmitter module 400 or the optical transmitter receiver module 500. In particular, since the surface-emitting laser can be remarkably lower in power consumption and is remarkably easier to arrange in a two-dimensional array than the edge-emitting laser, the surface-emitting laser is suitable for a parallel-transmission optical communication system.

12th Embodiment

Figure 23:
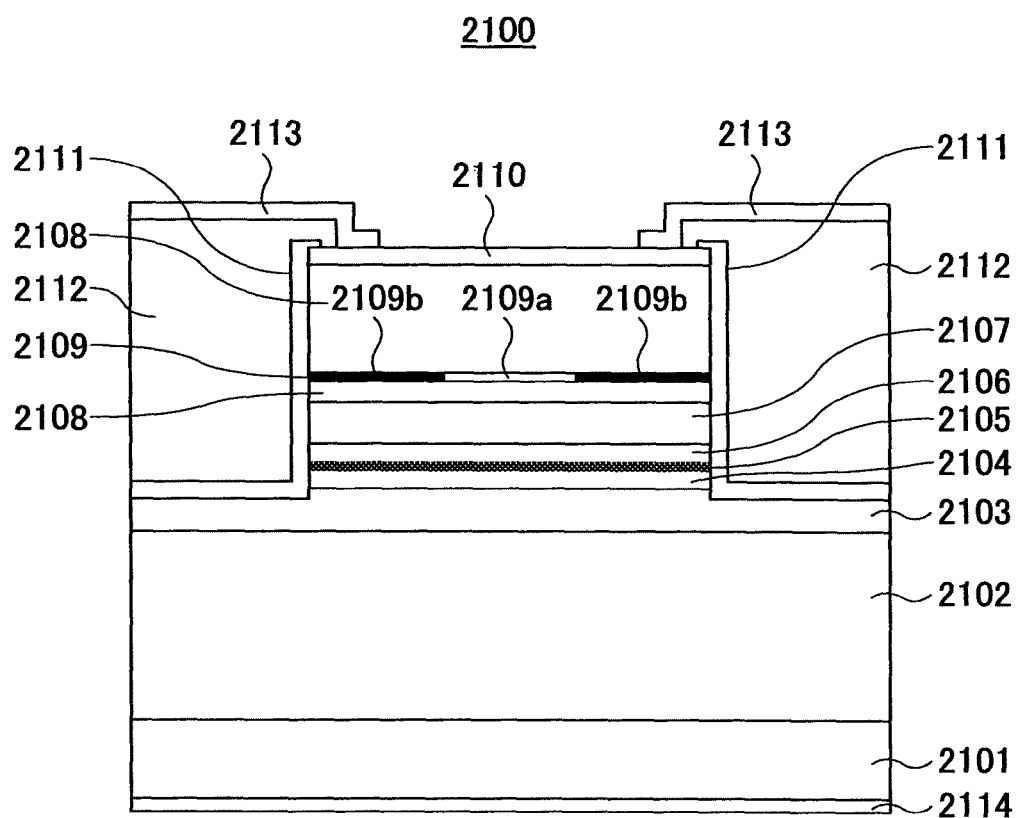
FIG. 23 is a schematic cross-sectional view of a surface-emitting laser device according to a $12^{th}$ embodiment of the present invention.

FIG. 23 is a schematic cross-sectional view of a surface-emitting laser device 2100 according to a 12th embodiment of the present invention. Referring to FIG. 23, the surface-emitting laser device 2100 includes a substrate 2101, reflective layers 2102, 2103, 2107, and 2108, cavity spacer layers 2104 and 2106, an active layer 2105, a selectively oxidized layer 2109, a contact layer 2110, a $SiO_2$ layer 2101, insulating resin 2112, a p-side electrode 2113, and an n-side electrode 2114. The surface-emitting laser device 2100 is a 780 nm band surface-emitting laser device.

The substrate 2101 is formed of (100) n-type gallium arsenide (n-GaAs) whose surface orientation is inclined at an inclination angle of 15 degrees to the direction of a (111)A surface. The reflective layer 2102 is formed of 35.5 periods of [n-$Al_{0.95}Ga_{0.05}As$/n-$Al_{0.35}Ga_{0.65}As$], letting a pair of n-$Al_{0.95}Ga_{0.05}As$/n-$Al_{0.35}Ga_{0.65}As$ be one period, and is formed on a principal plane of the substrate 2101. Letting the oscillation wavelength of the surface-emitting laser device 2100 be λ, the film thickness of each of n-$Al_{0.95}Ga_{0.05}As$ and n-$Al_{0.35}Ga_{0.65}As$ is λ/4n (where n is the refractive index of each semiconductor layer).

The reflective layer 2103 is formed of an AlGaInP-system material in contact with the reflective layer 2102. The cavity spacer layer 2104 is formed of $(Al_{0.1}Ga_{0.9})_{0.5}In_{0.5}P$ in contact with the reflective layer 2103. The active layer 2105 is formed of three periods of [$Ga_{0.6}In_{0.2}P_{0.2}As_{0.6}$/$(Al_{0.1}Ga_{0.9})_{0.5}In_{0.5}P$], letting a pair of $Ga_{0.6}In_{0.2}P_{0.2}As_{0.6}$/$(Al_{0.1}Ga_{0.9})_{0.5}In_{0.5}P$ be one period, and is formed in contact with the cavity spacer layer 2104.

The cavity spacer layer 2106 is formed of $(Al_{0.1}Ga_{0.9})_{0.5}In_{0.5}P$ in contact with the active layer 2105. The reflective layer 2107 is formed of an AlGaInP-system material in contact with the cavity spacer layer 2106.

The reflective layer 2108 is formed of 29.5 periods of [p-$Al_{0.95}Ga_{0.05}As$/p-$Al_{0.35}Ga_{0.65}As$], letting a pair of p-$Al_{0.95}Ga_{0.05}As$/p-$Al_{0.35}Ga_{0.65}As$ be one period, and is formed on the reflective layer 2107. The film thickness of each of p-$Al_{0.95}Ga_{0.05}As$ and p-$Al_{0.35}Ga_{0.65}As$ is λ/4 (where n is the refractive index of each semiconductor layer).

The selectively oxidized layer 2109 is formed of p-AlAs and provided in the reflective layer 2108. The selectively oxidized layer 2109 includes an unoxidized region 2109a and an oxidized region 2109b, and is 20 nm in film thickness.

The contact layer 2110 is formed of p-GaAs on the reflective layer 2108. The $SiO_2$ layer 2111 is formed so as to cover part of a principal plane of the reflective layer 2103 and the edge surfaces of the cavity spacer layer 2104, the active layer 2105, the cavity spacer layer 2106, the reflective layers 2107 and 2108, the selectively oxidized layer 2109 and the contact layer 2110.

The insulating resin 2112 is formed in contact with the $SiO_2$ layer 2111. The p-side electrode 2113 is formed on part of the contact layer 2110 and the insulating resin 2112. The n-side electrode 2114 is formed on the bottom side of the substrate 2101.

Each of the reflective layers 2102, 2103, 2107, and 2108 forms a semiconductor distributed Bragg reflector that reflects oscillating light that has oscillated in the active layer 2105 by multiple Bragg reflections so as to confine the oscillating light in the active layer 2105.

The oxidized region 2109b has a smaller refractive index than the unoxidized region 2109a. The oxidized region 2109b forms a current confinement part that limits to the unoxidized region 2109a the path through which a current injected from the p-side electrode 2113 flows to the active layer 2105, and confines the oscillating light that has oscillated in the active layer 2105 in the unoxidized region 2109a. Thereby, the surface-emitting laser device 2100 is enabled to perform oscillation with low threshold current.

Figure 24:
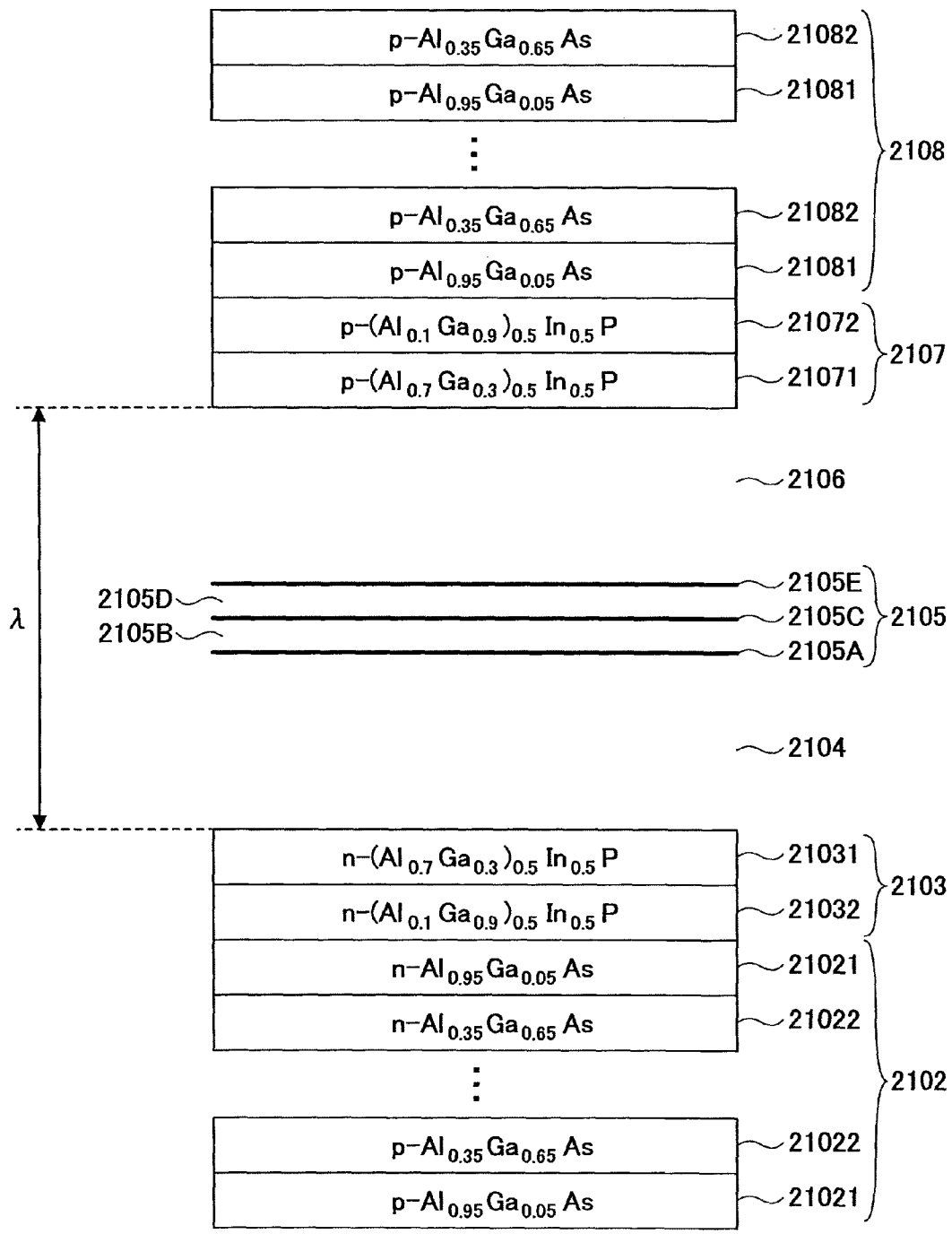
FIG. 24 is a cross-sectional view of four reflective layers, two cavity spacer layers, and an active layer shown in FIG. 23 according to the $12^{th}$ embodiment of the present invention.

FIG. 24 is a cross-sectional view of the four reflective layers 2102, 2103, 2107, and 2108, the two cavity spacer layers 2104 and 2106, and the active layer 2105 shown in FIG. 23. Referring to FIG. 24, the active layer 2105 includes well layers 2105A, 2105C, and 2105E and barrier layers 2105B and 2105D. Each of the well layers 2105A, 2105C, and 2105E is formed of $Ga_{0.8}In_{0.2}P_{0.2}As_{0.8}$ and each of the barrier layers 2105B and 2105D is formed of $(Al_{0.1}Ga_{0.9})_{0.5}In_{0.5}P$. Thus, the active layer 2105 is formed of three well layers and two barrier layers. The well layer 2105A is in contact with the cavity spacer layer 2104, and the well layer 2105E is in contact with the cavity spacer layer 2106.

The reflective layer 2102 is formed of low refractive index layers 21021 and high refractive index layers 21022 that are alternately stacked. The low refractive index layers 21021 are formed of n-$Al_{0.95}Ga_{0.05}As$ and the high refractive index layers 21022 are formed of n-$Al_{0.35}Ga_{0.65}As$. The lowermost one of the low refractive index layers 21021 is in contact with the substrate 2101.

The reflective layer 2103 is formed of a low refractive index layer 21031 and a high refractive index layer 21032. The low refractive index layer 21031 is formed of n-$(Al_{0.7}Ga_{0.3})_{0.5}In_{0.5}P$ and the high refractive index layer 21032 is formed of n-$(Al_{0.1}Ga_{0.9})_{0.5}In_{0.5}P$. The high refractive index layer 21032 (=n-$(Al_{0.1}Ga_{0.9})_{0.5}In_{0.5}P$) is formed in contact with the uppermost one of the low refractive index layers 21021 (=n-$Al_{0.95}Ga_{0.05}As$) of the reflective layer 2102. The low refractive index layer 21031 (=n-$(Al_{0.7}Ga_{0.3})_{0.5}In_{0.5}P$) is formed in contact with the cavity spacer layer 2104 (=$(Al_{0.1}Ga_{0.9})_{0.5}In_{0.5}P$).

The reflective layer 2107 is formed of a low refractive index layer 21071 and a high refractive index layer 21072. The low refractive index layer 21071 is formed of p-$(Al_{0.7}Ga_{0.3})_{0.5}In_{0.5}P$ and the high refractive index layer 21072 is formed of p-$(Al_{0.1}Ga_{0.9})_{0.5}In_{0.5}P$.

The reflective layer 2108 is formed of low refractive index layers 21081 and high refractive index layers 21082 that are alternately stacked. The low refractive index layers 21081 are formed of p-$Al_{0.95}Ga_{0.05}As$ and the high refractive index layers 21082 are formed of p-$Al_{0.35}Ga_{0.65}As$. The uppermost one of the high refractive index layers 21082 is in contact with the contact layer 2110.

The high refractive index layer 21072 (=p-$(Al_{0.1}Ga_{0.9})_{0.5}In_{0.5}P$) in the reflective layer 2107 is formed in contact with the lowermost one of the low refractive index layers 21081 (=p-$Al_{0.95}Ga_{0.05}As$) of the reflective layer 2108. The low refractive index layer 21071 (=p-$(Al_{0.7}Ga_{0.3})_{0.5}In_{0.5}P$) in the reflective layer 2107 is formed in contact with the cavity spacer layer 2106 (=$(Al_{0.1}Ga_{0.9})_{0.5}In_{0.5}P$).

In the surface-emitting laser device 2100, the cavity spacer layers 2104 and 2106 and the active layer 2105 form a cavity (resonator), and the length of the cavity is one wavelength (=λ).

Figure 25:
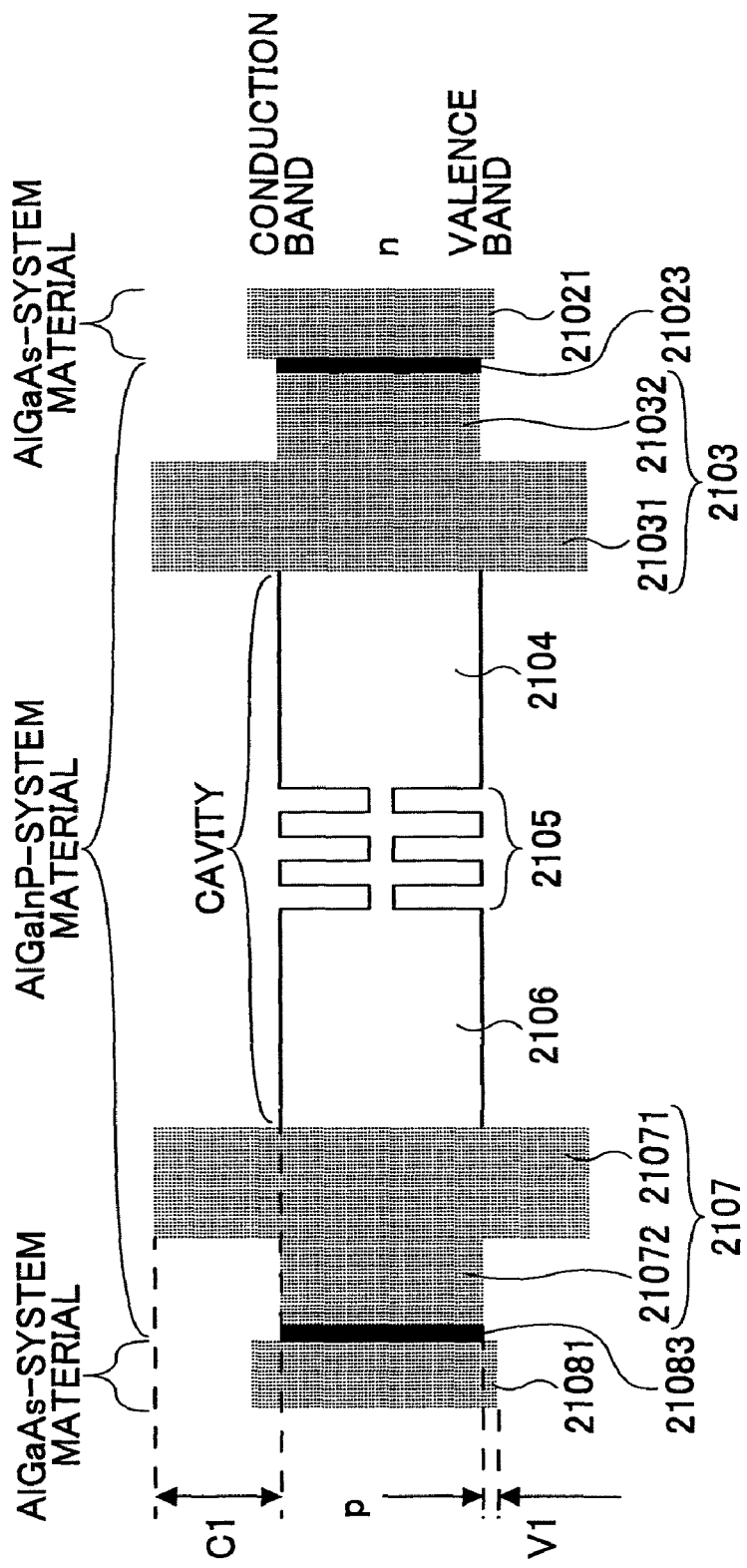
FIG. 25 is an energy band diagram of part of the two reflective layers, the two reflective layers, and a cavity (=the cavity spacer layers and the active layer) shown in FIG. 24 according to the $12^{th}$ embodiment of the present invention.

FIG. 25 is an energy band diagram of part of the two reflective layers 2102 and 2108, the two reflective layers 2103 and 2107, and the cavity (=the cavity spacer layers 2104 and 2106 and the active layer 2105) shown in FIG. 24.

Figure 26:
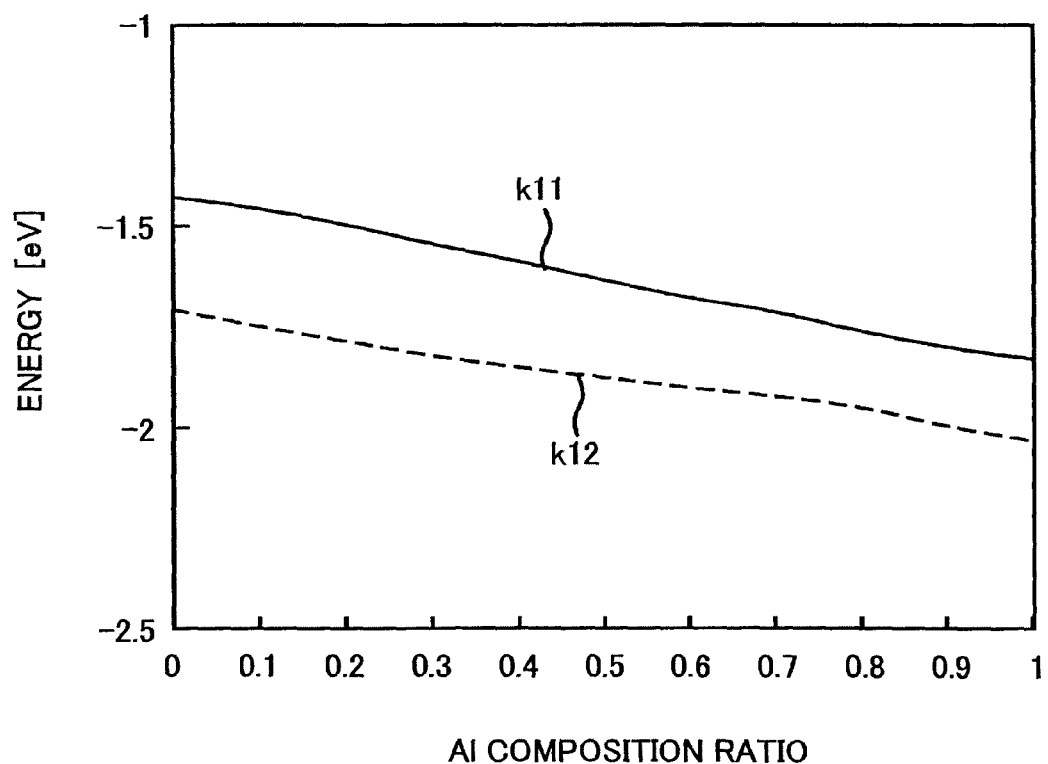
FIG. 26 is a graph showing the relationship between aluminum (Al) composition ratio x and potential energy according to the $12^{th}$ embodiment of the present invention.

Further, FIG. 26 is a graph showing the relationship between the composition ratio of aluminum (Al) x and potential energy. In FIG. 26, the vertical axis represents potential energy and the horizontal axis represents the Al composition ratio x. A curved line k11 shows the relationship between the potential energy and the Al composition ratio x of $Al_xGa_{1-x}As$ ($0 \leq x \leq 1$), and a curved line k12 shows the relationship between the potential energy and the Al composition ratio x of $(Al_xGa_{1-x})_{0.5}In_{0.5}P$ ($0 \leq x \leq 1$).

Referring to FIG. 25, the low refractive index layer 21031 of the reflective layer 2103 is formed of n-$(Al_{0.7}Ga_{0.3})_{0.5}In_{0.5}P$, the low refractive index layer 21071 of the reflective layer 2107 is formed of p-$(Al_{0.7}Ga_{0.3})_{0.5}In_{0.5}P$, each of the well layers 2105A, 2105C, and 2105E of the active layer 2105 is formed of $Ga_{0.8}In_{0.2}P_{0.2}As_{0.8}$, and each of the barrier layers 2105B and 2105D of the active layer 2105 is formed of $(Al_{0.1}Ga_{0.9})_{0.5}In_{0.5}P$. As a result, the potential energy of the conduction band of the cavity is approximately 0.22 eV, and the potential energy of the conduction band of each of the low refractive index layers 21031 and 21071 is approximately 0.38 eV, so that there is a difference of 0.16 eV therebetween.

Further, each of the high refractive index layer 21032 formed of n-$(Al_{0.1}Ga_{0.9})_{0.5}In_{0.5}P$ and the high refractive index layer 21072 formed of p-$(Al_{0.1}Ga_{0.9})_{0.5}In_{0.5}P$ has a valence band potential energy of approximately −1.75 eV. (See the curved line k12 of FIG. 26.) Further, each of the low refractive index layer 21021 formed of n-$Al_{0.95}Ga_{0.05}As$ and the low refractive index layer 21081 formed of p-$Al_{0.95}Ga_{0.05}As$ has a valence band potential energy of approximately −1.84 eV. (See the curved line k11 of FIG. 26.) Therefore, there is an energy difference of −0.09 eV therebetween.

Each of FIGS. 27A and 27B is an energy band diagram of the cavity and the reflective layers of a conventional surface-emitting laser device. Referring to FIG. 27A, in a conventional surface-emitting laser device 2200, the cavity is formed of $Ga_{0.5}In_{0.5}P$ (in general, an AlGaInP-system material), and low refractive index layers 2200a1 (high Al structure) are formed of $Al_{0.95}Ga_{0.05}As$ (in general, an AlGaAs-system material). As a result, in the surface-emitting laser device 2200, the potential energy of the conduction band of the cavity is approximately 0.22 eV, and the potential energy of each low refractive index layer 2200a1 is approximately 0.30 eV, so that there is an energy difference of 0.08 eV therebetween. In FIG. 27A, reference numeral 2200a2 denotes high refractive index layers (low Al structure).

Further, referring to FIG. 27B, in a conventional surface-emitting laser device 2200A, the cavity is formed of $Ga_{0.5}In_{0.5}P$ (in general, an AlGaInP-system material), low refractive index layers 2200Ab1 (high Al composition) are formed of $(Al_{0.7}Ga_{0.3})_{0.5}In_{0.5}P$ (in general, an AlGaInP-system material), and high refractive index layers 2200Ab2 (low Al composition) are formed of $Al_{0.35}Ga_{0.65}As$ (in general, an AlGaAs-system material). As a result, the potential energy of the valence band of each low refractive index layer 2200Ab1 is approximately −1.94 eV, and the potential energy of the valence band of each high refractive index layer 2200Ab2 is approximately −1.57 eV, so that there is an energy difference of −0.37 eV therebetween. In FIG. 27B, reference numeral 2200Ab3 denotes low refractive index layers (high Al composition).

Accordingly, the difference in energy between conduction bands at the interface of the cavity and each of the reflective layers 2103 and 2107 of the surface-emitting laser device 2100 according to this embodiment can be greater than that of the conventional surface-emitting laser device 2200. Further, the difference in energy between the low refractive index layer 21031 and the high refractive index layer 21032 of the surface-emitting laser device 2100 can be smaller than that of the conventional surface-emitting laser device 2200A. As a result, in the surface-emitting laser device 2100, it is possible to confine more carriers in the active layer 2105 and to make the resistance of the reflective layers 2103 and 2107 significantly lower than in the conventional surface-emitting laser device, so that it is possible to obtain high output.

Further, the high refractive index layer 21032 of the reflective layer 2103 is formed of n-$(Al_{0.1}Ga_{0.9})_{0.5}In_{0.5}P$, and the low refractive index layers 21021 of the refractive layer 2102 are formed of n-$Al_{0.95}Ga_{0.05}As$. Accordingly, a P-containing material/As-containing material junction interface 21023 (FIG. 25) is formed at the interface of the high refractive index layer 21032 of the reflective layer 2103 and the uppermost low refractive index layer 21021 of the refractive layer 2102.

Further, the high refractive index layer 21072 of the reflective layer 2107 is formed of p-$(Al_{0.1}Ga_{0.9})_{0.5}In_{0.5}P$, and the low refractive index layers 21081 of the refractive layer 2108 are formed of p-$Al_{0.95}Ga_{0.05}As$. Accordingly, a P-containing material/As-containing material junction interface 21083 (FIG. 25) is formed at the interface of the high refractive index layer 21072 of the reflective layer 2107 and the lowermost low refractive index layer 21081 of the refractive layer 2108.

On the other hand, the P-containing material/As-containing material junction interface exists at the interface of the cavity and each low refractive index layer 2200a1 in the conventional surface-emitting laser device 2200, and at the interface of each low refractive index layer 2200Ab1 and its adjacent high refractive index layer 2200Ab2 in the conventional surface-emitting laser device 2200A.

Accordingly, in the surface-emitting laser device 2100, the P-containing material/As-containing material junction interfaces 21023 and 21083 are positioned more remotely from the active layer 2105 than in the conventional surface-emitting laser devices 2200 and 2200A. As a result, the surface-emitting laser device 2100 can enjoy a longer useful service life.

The number of pairs of [low refractive index layer 21031/high refractive index layer 21032] of the reflective layer 2103 and the number of pairs of [low refractive index layer 21071/high refractive index layer 21072] of the reflective layer 2107 are not limited to one, and may be two or more.

Figure 28:
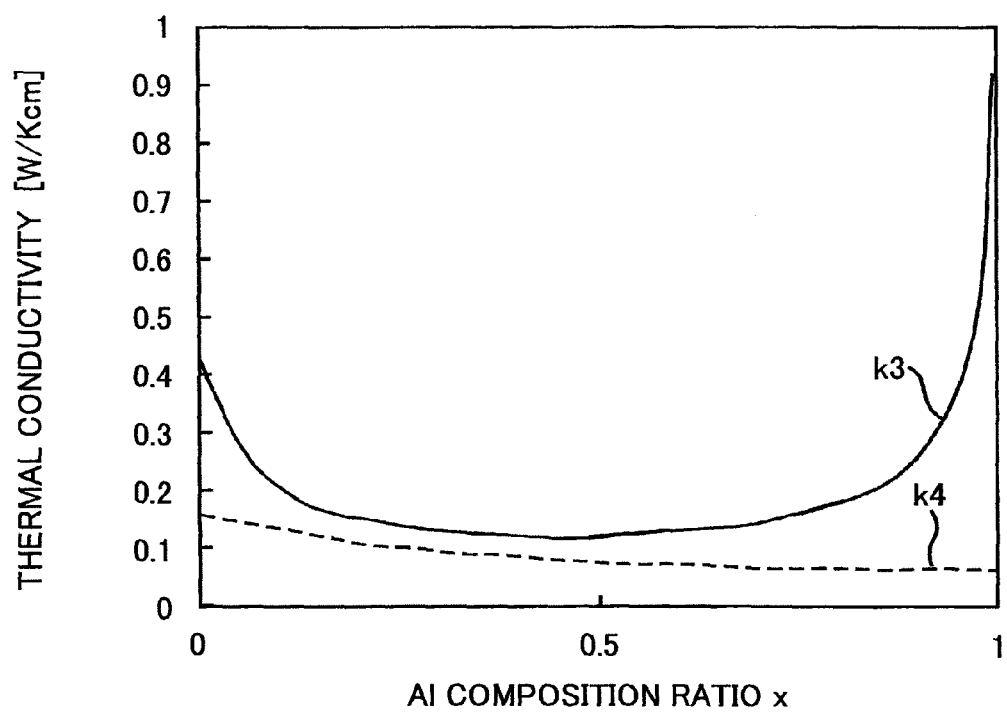
FIG. 28 is a graph showing the relationship between thermal conductivity and the Al composition ratio x according to the $12^{th}$ embodiment of the present invention.

FIG. 28 is a graph showing the relationship between thermal conductivity and Al composition ratio x. In FIG. 28, the vertical axis represents thermal conductivity, and the horizontal axis represents Al composition ratio x. Further, a curved line k3 shows the relationship between the thermal conductivity and the Al composition ratio x of $Al_xGa_{1-x}As$ ($0 \leq x \leq 1$), and a curved line k4 shows the relationship between the thermal conductivity and the Al composition ratio x of $(Al_xGa_{1-x})_{0.5}In_{0.5}P$ ($0 \leq x \leq 1$).

In the case of using an $(Al_xGa_{1-x})_{0.5}In_{0.5}P$-system material ($0 \leq x \leq 1$) for the reflective layers 2103 and 2107, the thermal conductivities of the reflective layers 2103 and 2107 are lower than in the case of using an $Al_xGa_{1-x}As$-system material ($0 \leq x \leq 1$) therefor. (See the curved lines k3 and k4.) Accordingly, the number of pairs of [low refractive index layer 21031/high refractive index layer 21032] of the reflective layer 2103 and the number of pairs of [low refractive index layer 21071/high refractive index layer 21072] of the reflective layer 2107 are determined to be as small as possible in consideration of heat dissipation characteristics.

Figure 29A:
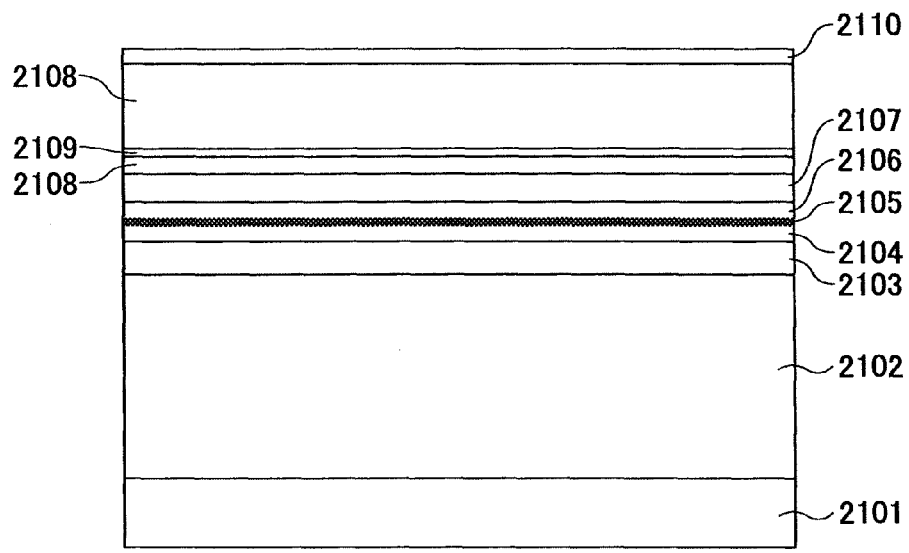
FIGS. 29A through 29H are diagrams showing a method of manufacturing the surface-emitting laser device shown in FIG. 23 according to the $12^{th}$ embodiment of the present invention.

FIGS. 29A through 29H are diagrams showing a method of manufacturing the surface-emitting laser device 2100 shown in FIG. 23. Referring to FIG. 29A, when a series of operations starts, the reflective layers 2102 and 2103, the cavity spacer layer 2104, the active layer 2105, the cavity spacer layer 2106, the reflective layers 2107 and 2108, a p-AlAs layer to serve as the selectively oxidized layer 2109, and the contact layer 2110 are successively stacked on the substrate 2101 using MOCVD (Metal Organic Chemical Vapor Deposition).

In this case, n-$Al_{0.95}Ga_{0.05}As$ and n-$Al_{0.35}Ga_{0.65}As$ of the reflective layer 2102 are formed using trimethylaluminum (TMA), trimethylgallium (TMG), arsine ($AsH_3$), and hydrogen selenide ($H_2Se$) as materials, and n-$(Al_{0.7}Ga_{0.3})_{0.5}In_{0.5}P$ and n-$(Al_{0.1}Ga_{0.9})_{0.5}In_{0.5}P$ are formed using trimethylaluminum (TMA), trimethylgallium (TMG), trimethylindium (TMI), phosphine ($PH_3$), and hydrogen selenide ($H_2Se$) as materials.

Further, $(Al_{0.7}Ga_{0.3})_{0.5}In_{0.5}P$ of the cavity spacer layer 2104 is formed using trimethylaluminum (TMA), trimethylgallium (TMG), trimethylindium (TMI), and phosphine ($PH_3$) as materials.

Further, $Ga_{0.8}In_{0.2}P_{0.2}As_{0.8}$ of the active layer 2105 is formed using trimethylgallium (TMG), trimethylindium (TMI), phosphine ($PH_3$), and arsine ($AsH_3$) as materials, and $(Al_{0.1}Ga_{0.9})_{0.5}In_{0.5}P$ of the active layer 2105 is formed using trimethylaluminum (TMA), trimethylgallium (TMG), trimethylindium (TMI), and phosphine ($PH_3$) as materials.

Further, $(Al_{0.7}Ga_{0.3})_{0.5}In_{0.5}P$ of the cavity spacer layer 2106 is formed using trimethylaluminum (TMA), trimethylgallium (TMG), trimethylindium (TMI), and phosphine ($PH_3$) as materials.

Further, p-$(Al_{0.7}Ga_{0.3})_{0.5}In_{0.5}P$ and p-$(Al_{0.1}Ga_{0.9})_{0.5}In_{0.5}P$ of the reflective layer 2107 are formed using trimethylaluminum (TMA), trimethylgallium (TMG), trimethylindium (TMI), phosphine ($PH_3$), and carbon tetrabromide ($CBr_4$) as materials. Carbon tetrabromide ($CBr_4$) may be replaced by dimethyl zinc (DMZn).

Further, p-$Al_{0.95}Ga_{0.05}As$ and p-$Al_{0.35}Ga_{0.65}As$ of the reflective layer 2108 are formed using trimethylaluminum (TMA), trimethylgallium (TMG), arsine ($AsH_3$), and carbon tetrabromide ($CBr_4$) as materials. In this case, carbon tetrabromide ($CBr_4$) may also be replaced by dimethyl zinc (DMZn).

Further, p-AlAs of the selectively oxidized layer 2109 is formed using trimethylaluminum (TMA), arsine ($AsH_3$), and carbon tetrabromide ($CBr_4$) as materials, and p-GaAs of the contact layer 2110 is formed using trimethylaluminum (TMA), arsine ($AsH_3$), and carbon tetrabromide ($CBr_4$) as materials. In this case, carbon tetrabromide ($CBr_4$) may also be replaced by dimethyl zinc (DMZn).

Figure 29B:
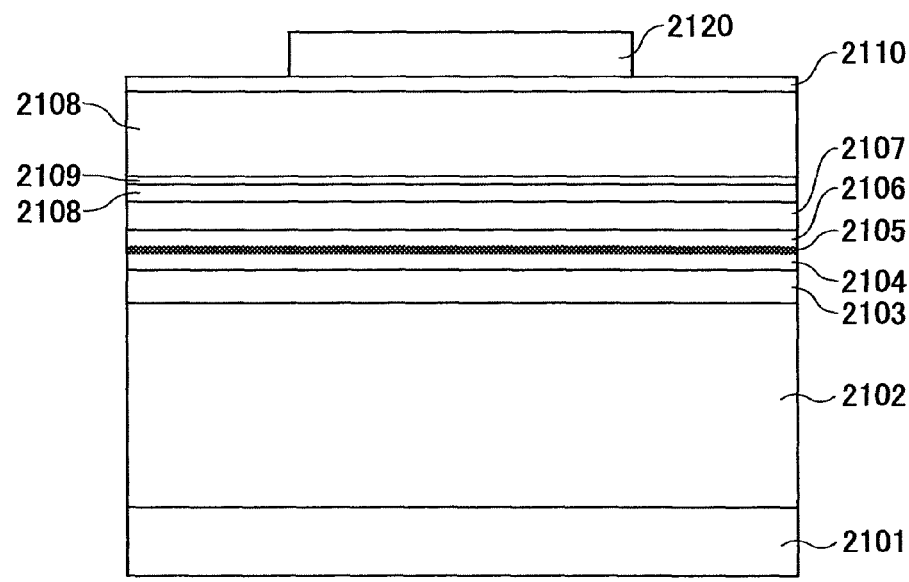

Thereafter, resist is applied on the contact layer 2110, and a resist pattern 2120 is formed on the contact layer 2110 using a photomechanical process as shown in FIG. 29B.

Figure 29C:
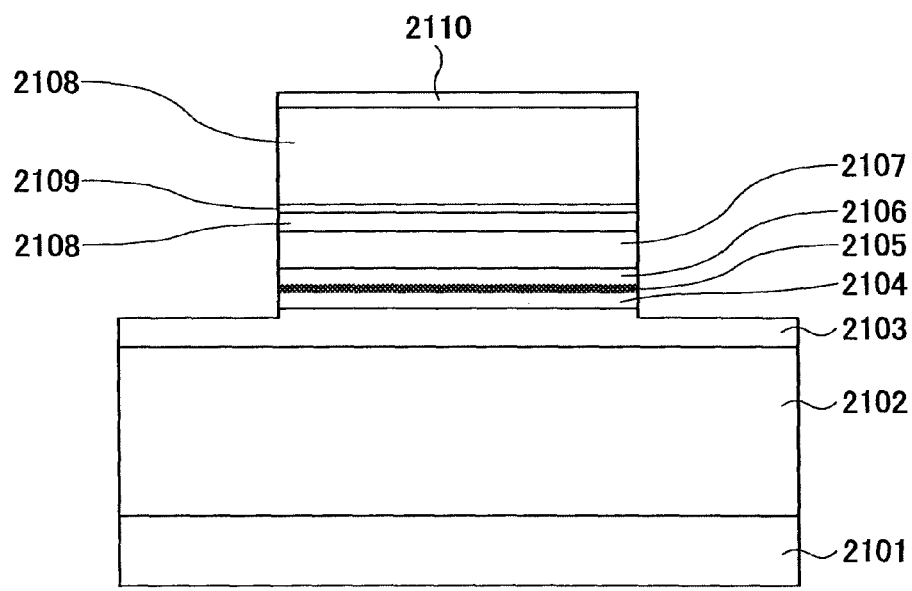

Once the resist pattern 2120 is formed, part of the reflective layer 2103 and the peripheral parts of the cavity spacer layer 2104, the active layer 2105, the cavity spacer layer 2106, the reflective layers 2107 and 2108, the p-AlAs layer to serve as the selectively oxidized layer 2109, and the contact layer 2110 are removed by dry etching using the formed resist pattern 2120 as a mask, and the resist pattern 2120 is thereafter removed as shown in FIG. 29C.

The dry etching is performed introducing a halogen-based gas such as $Cl_2$, $BCl_3$, or $SiCl_4$ and using plasma according to RIBE (Reactive Ion Beam Etching), ICP (Inductively Coupled Plasma) etching, or RIE (Reactive Ion Etching).

In the regions of the reflective layers 2103 and 2107, the cavity spacer layers 2104 and 2106 and the active layer 2105 of the surface-emitting laser device 2100, AlGaInP-system materials are used. The rate of dry etching can be lower for a material containing In than for semiconductor distributed Bragg reflectors (the reflecting layers 2102 and 2108) formed of AlGaAs-system materials because the vapor pressure of an In chloride is low. That is, the cavity region formed of the cavity spacer layers 2104 and 2106 and the active layer 2105 can be used as an etch stop layer depending on etching conditions. Therefore, it is possible to absorb variations in etching rate among lots and the in-plane distribution of etching rate, so that it is possible to etch the p-AlAs layer to serve as the selectively oxidized layer 2109 and also to prevent etching depth from reaching the reflective layer 2102. For such a reason, part of the reflective layer 2103 and the peripheral parts of the cavity spacer layer 2104, the active layer 2105, the cavity spacer layer 2106, the reflective layers 2107 and 2108, the p-AlAs layer to serve as the selectively oxidized layer 2109, and the contact layer 2110 are etched by dry etching using a halogen gas.

Figure 29D:
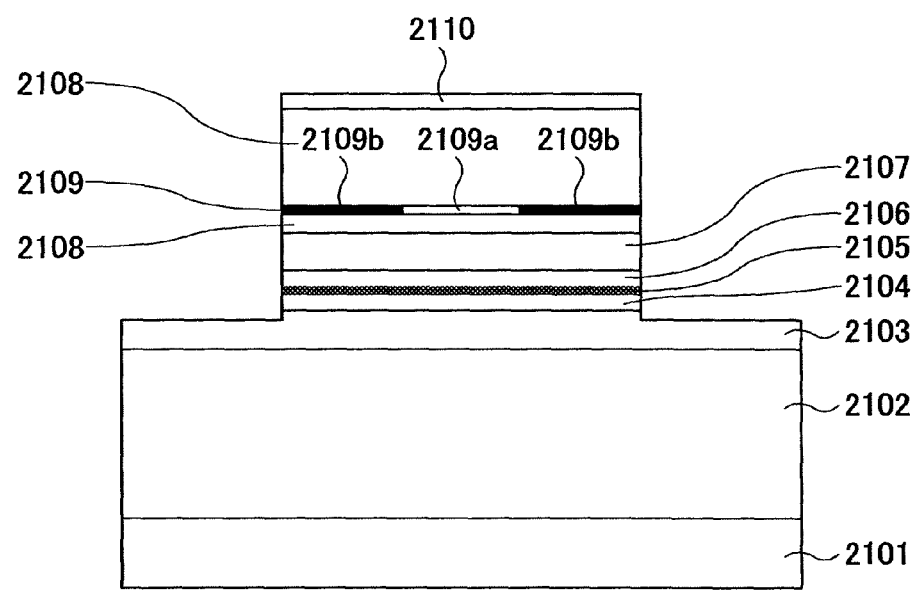

After the process shown in FIG. 29C, the p-AlAs layer to serve as the selectively oxidized layer 2109 is oxidized from its periphery to center by heating the sample (structure) to 425° C. in an atmosphere where water heated to 85° C. is bubbled with nitrogen gas, thereby forming the unoxidized region 2109a and the oxidized region 2109b in the p-AlAs layer 2109 (selectively oxidized layer 2109) as shown in FIG. 29D.

Figure 29E:
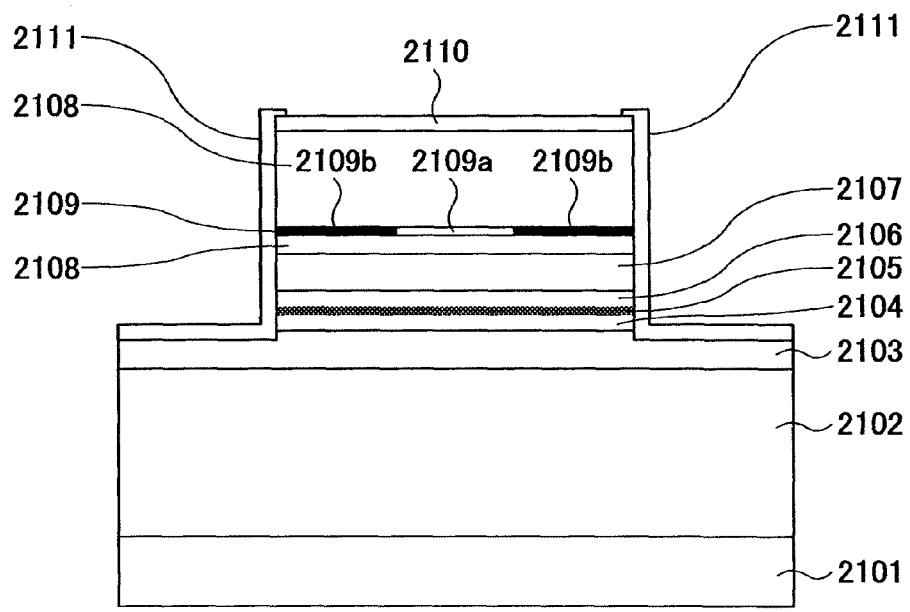

Thereafter, the $SiO_2$ layer 2111 is formed on the entire surface of the sample using CVD (Chemical Vapor Deposition), and the $SiO_2$ layer 2111 is removed from a region to serve as a light exit part and its surrounding region using a photomechanical process as shown in FIG. 29E.

Figure 29F:
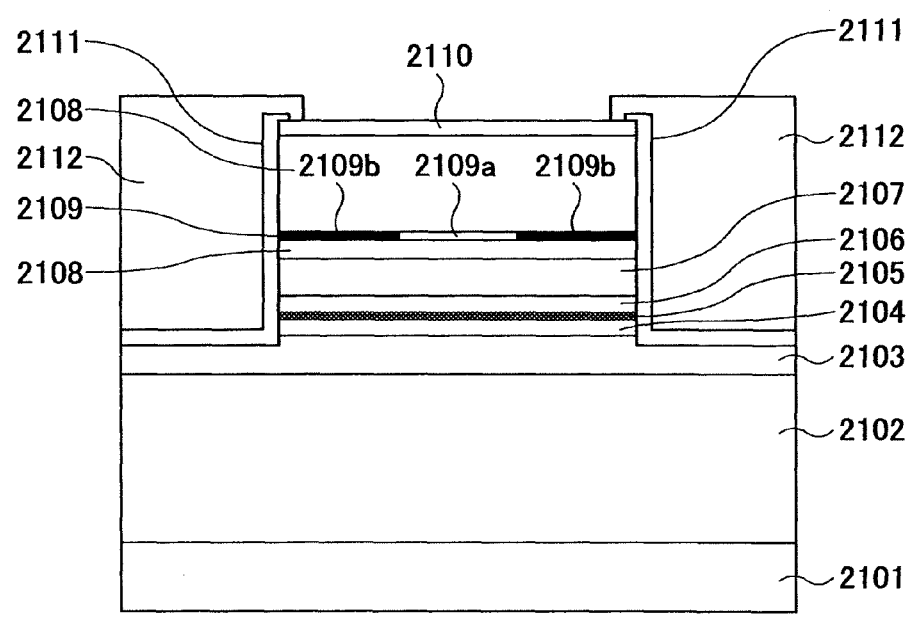

Next, the insulating resin 2112 is applied on the entire sample by spin coating, and the insulating resin 2112 is removed from the region to serve as the light exit part as shown in FIG. 29F.

Figure 29G:
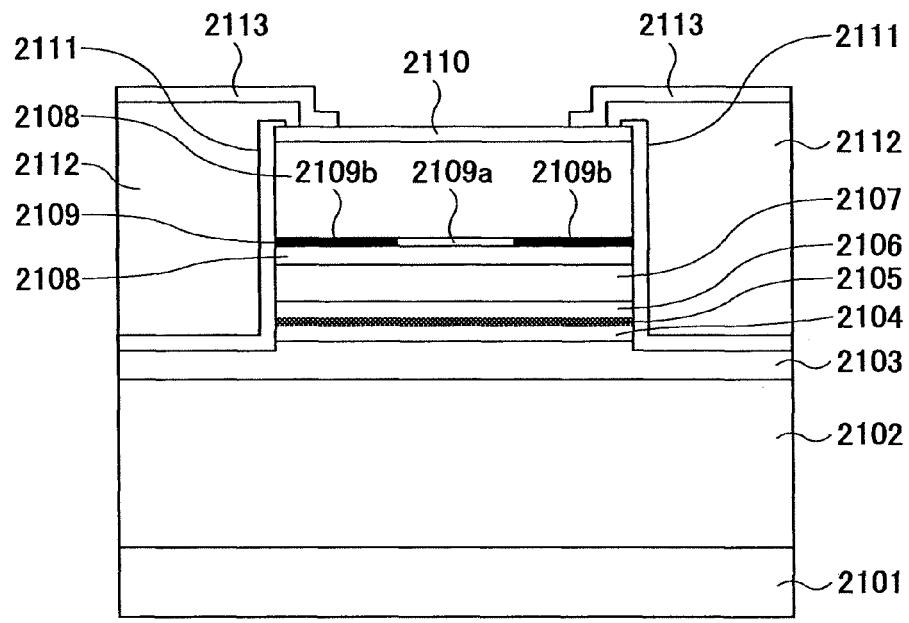
Figure 29H:
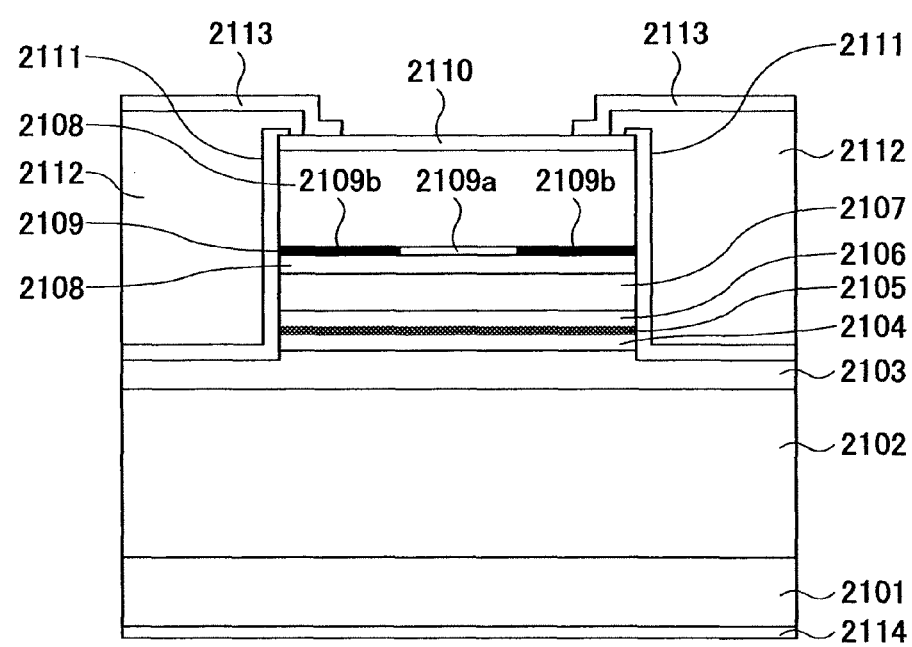

After forming the insulating resin 2112, a resist pattern having a predetermined size is formed on the region to serve as the light exit part, and a p-side electrode material is formed on the entire surface of the sample by vapor deposition. Then, the p-side electrode material on the resist pattern is removed by lift-off, so that the p-side electrode 2113 is formed as shown in FIG. 29G. Then, as shown in FIG. 29H, the bottom side of the substrate 2101 is ground, and the n-side electrode 2114 is formed on the bottom side of the substrate 2101. Further, ohmic conduction is made between the p-side electrode 2113 and the n-side electrode 2114 by annealing. Thereby, the surface-emitting laser device 2100 is manufactured.

As described above, according to the surface-emitting laser device 2100, the difference in energy between conduction bands at the interface between the cavity and each of the reflective layers 2103 and 2107 can be greater than in the conventional surface-emitting laser device, and the difference in energy between valence bands in each of the reflective layers 2103 and 2107 can be smaller than in the conventional surface-emitting laser device. As a result, in the surface-emitting laser device 2100, it is possible to confine more carriers in the active layer 2105, so that it is possible to obtain high output.

Further, the low refractive index layer 21031 of the reflective layer 2103 and the low refractive index layer 21071 of the reflective layer 2107 are described above as formed of $(Al_{0.7}Ga_{0.3})_{0.5}In_{0.5}P$. In the present invention, however, the low refractive index layers 21031 and 21071 are not limited to this, and in general, may be formed of $(Al_xGa_{1-x})_{0.5}In_{0.5}P$ ($0 \leq x \leq 1$).

Further, the high refractive index layer 21032 of the reflective layer 2103 and the high refractive index layer 21072 of the reflective layer 2107 are described above as formed of $(Al_{0.1}Ga_{0.9})_{0.5}In_{0.5}P$. In the present invention, however, the high refractive index layers 21032 and 21072 are not limited to this, and in general, may be formed of $(Al_yGa_{1-y})_{0.5}In_{0.5}P$ ($0 \leq y < x \leq 1$).

13$^{th}$ Embodiment

Figure 30:
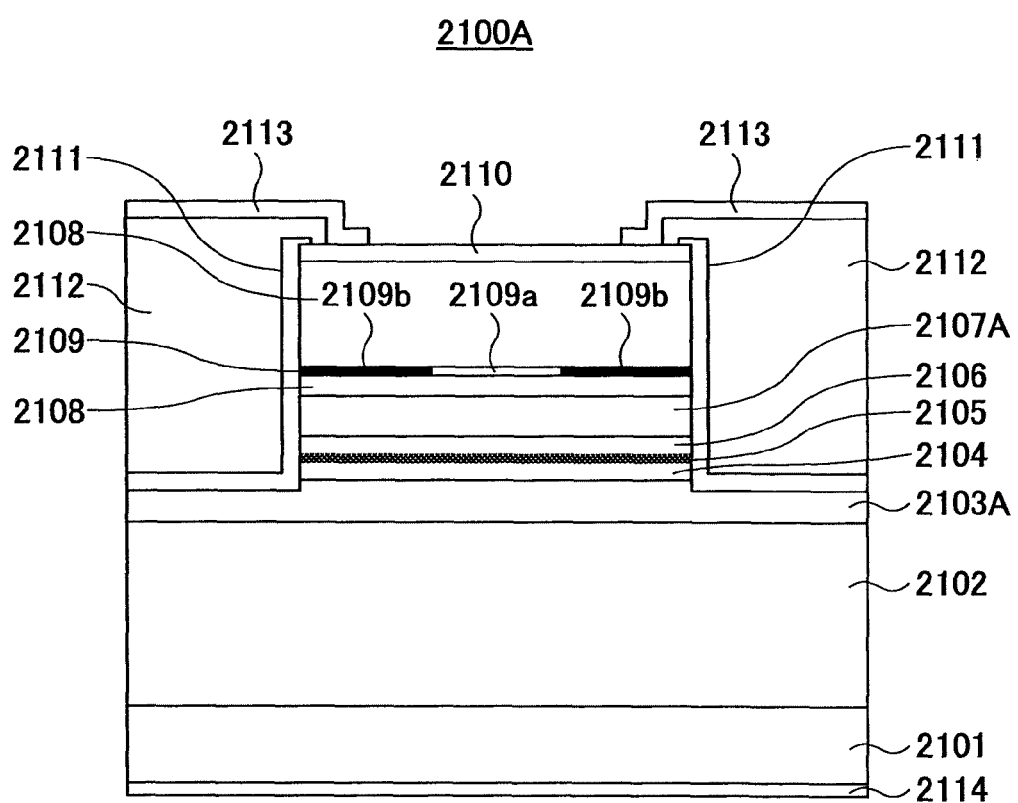
FIG. 30 is a schematic cross-sectional view of a surface-emitting laser device according to a $13^{th}$ embodiment of the present invention.

FIG. 30 is a schematic cross-sectional view of a surface-emitting laser device 2100A according to a 13$^{th}$ embodiment of the present invention. Referring to FIG. 30, the surface-emitting laser device 2100A is the same as the surface-emitting laser device 2100 shown in FIG. 23 except that the reflective layers 2103 and 2107 of the surface-emitting laser device 2100 are replaced with reflective layers 2103A and 2107A, respectively.

Figure 31:
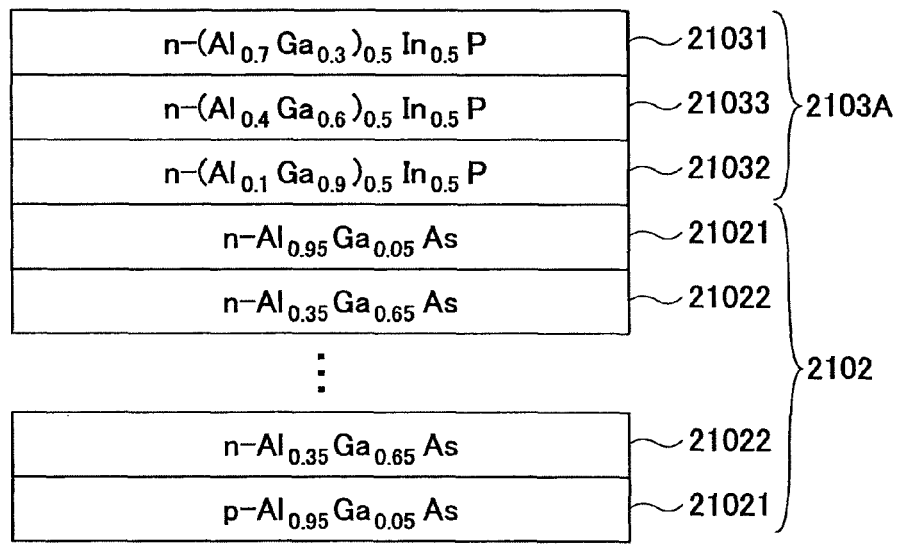
FIG. 31 is a cross-sectional view of two reflective layers shown in FIG. 30 according to the $13^{th}$ embodiment of the present invention.

FIG. 31 is a cross-sectional view of the two reflective layers 2102 and 2103A shown in FIG. 30. Referring to FIG. 31, the reflective layer 2103A is the same as the reflective layer 2103 shown in FIG. 24 except that the reflective layer 2103A additionally includes an intermediate layer 21033.

The intermediate layer 21033 is formed of n-$(Al_{0.4}Ga_{0.6})_{0.5}In_{0.5}P$ between the low refractive index layer 21031 and the high refractive index layer 21032.

Figure 32:
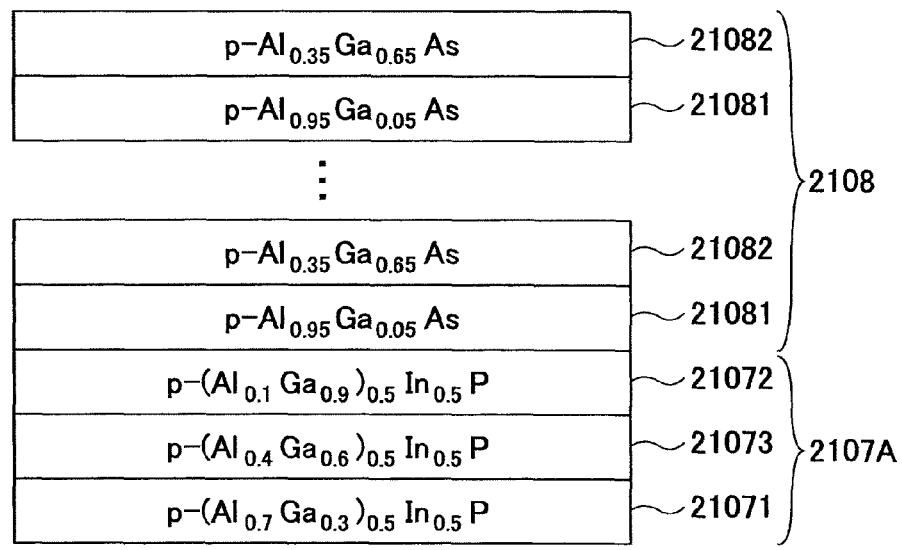
FIG. 32 is a cross-sectional view of two other reflective layers shown in FIG. 30 according to the $13^{th}$ embodiment of the present invention.

FIG. 32 is a cross-sectional view of the two reflective layers 2107A and 2108 shown in FIG. 30. Referring to FIG. 32, the reflective layer 2107A is the same as the reflective layer 2107 shown in FIG. 24 except that the reflective layer 2107A additionally includes an intermediate layer 21073.

The intermediate layer 21073 is formed of p-$(Al_{0.4}Ga_{0.6})_{0.5}In_{0.5}P$ between the low refractive index layer 21071 and the high refractive index layer 21072.

Figure 33:
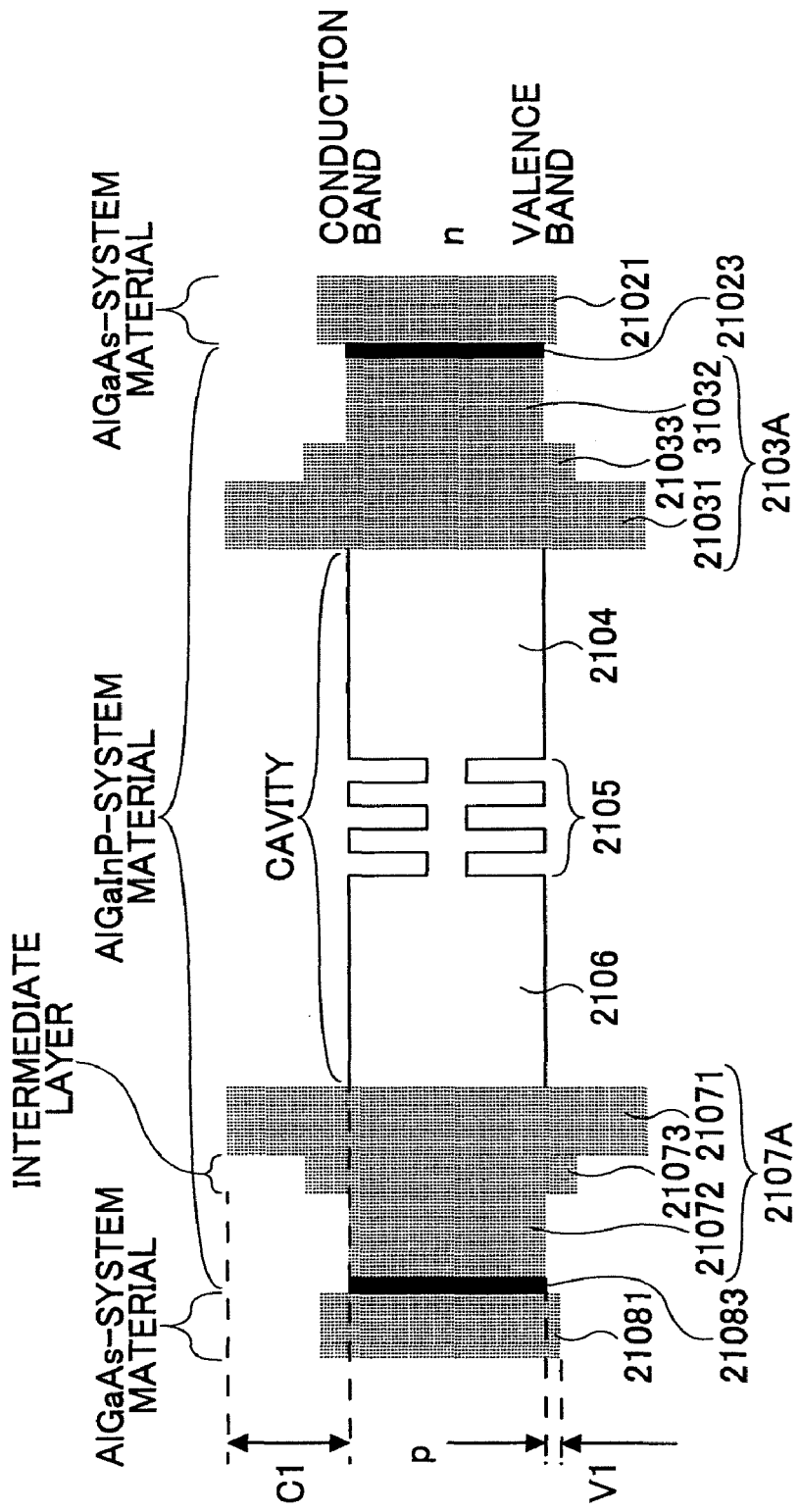
FIG. 33 is an energy band diagram of part of the two reflective layers, the two reflective layers, and the cavity (=the cavity spacer layers and the active layer) shown in FIG. 30 according to the $13^{th}$ embodiment of the present invention.

FIG. 33 is an energy band diagram of part of the two reflective layers 2102 and 2108, the two reflective layers 2103A and 2107A, and the cavity (=the cavity spacer layers 2104 and 2106 and the active layer 2105) shown in FIG. 30.

Referring to FIG. 33, the intermediate layer 21033 has a band gap that is between the band gap of the high refractive index layer 21032 and the band gap of the low refractive index layer 21031. Further, the intermediate layer 21073 has a band gap that is between the band gap of the high refractive index layer 21072 and the band gap of the low refractive index layer 21071.

A great difference between the Al composition ratio of the low refractive index layer 21031 and the Al composition ratio of the high refractive index layer 21032 results in a great discontinuity between valence bands in the reflective layer 2103. Accordingly, the intermediate layer 21033 having an intermediate Al composition ratio between the Al composition ratio of the low refractive index layer 21031 and the Al composition ratio of the high refractive index layer 21032 is interposed between the low refractive index layer 21031 and the high refractive index layer 21032. As a result, the valence band discontinuity in the reflective layer 2103A is reduced, so that it is possible to reduce the resistance of the reflective layer 2103A.

Further, a great difference between the Al composition ratio of the low refractive index layer 21071 and the Al composition ratio of the high refractive index layer 21072 results in a great discontinuity between valence bands in the reflective layer 2107. Accordingly, the intermediate layer 21073 having an intermediate Al composition ratio between the Al composition ratio of the low refractive index layer 21071 and the Al composition ratio of the high refractive index layer 21072 is interposed between the low refractive index layer 21071 and the high refractive index layer 21072. As a result, the valence band discontinuity in the reflective layer 2107A is reduced, so that it is possible to reduce the resistance of the reflective layer 2107A.

Accordingly, by providing the intermediate layers 21033 and 21073 in the reflective layers 2103A and 2107A, respectively, the resistance of each of the reflective layers 2103A and 2107A is reduced, so that the surface-emitting laser device 2100A can have high output.

The surface-emitting laser device 2100A is manufactured according to the processes shown in FIGS. 29A through 29H. In this case, the reflective layers 2103A and 2107A are stacked in place of the reflective layers 2103 and 2107, respectively, in the process of FIG. 29A.

Further, the intermediate layer 21033 is described above as formed of n-$(Al_{0.4}Ga_{0.6})_{0.5}In_{0.5}P$ and the intermediate layer 21073 is described above as formed of p-$(Al_{0.4}Ga_{0.6})_{0.5}In_{0.5}P$. In the present invention, however, the intermediate layers 21033 and 21073 are not limited to these. The intermediate layer 21033 may be formed of n-$(Al_zGa_{1-z})_{0.5}In_{0.5}P$ ($0 \leq z \leq 1$, $y < z < x$) and the intermediate layer 21073 may be formed of p-$(Al_zGa_{1-z})_{0.5}In_{0.5}P$ ($0 \leq z \leq 1$, $y < z < x$).

Further, the intermediate layer 21033 may be formed of multiple n-$(Al_zGa_{1-z})_{0.5}In_{0.5}P$ layers that are reduced continuously or stepwise in band gap from the low refractive index layer 21031 toward the high refractive index layer 21032. Further, the intermediate layer 21073 may be formed of multiple p-$(Al_zGa_{1-z})_{0.5}In_{0.5}P$ layers that are reduced continuously or stepwise in band gap from the low refractive index layer 21071 toward the high refractive index layer 21072.

Otherwise, the 13$^{th}$ embodiment is the same as the 12$^{th}$ embodiment.

14$^{th}$ Embodiment

Figure 34:
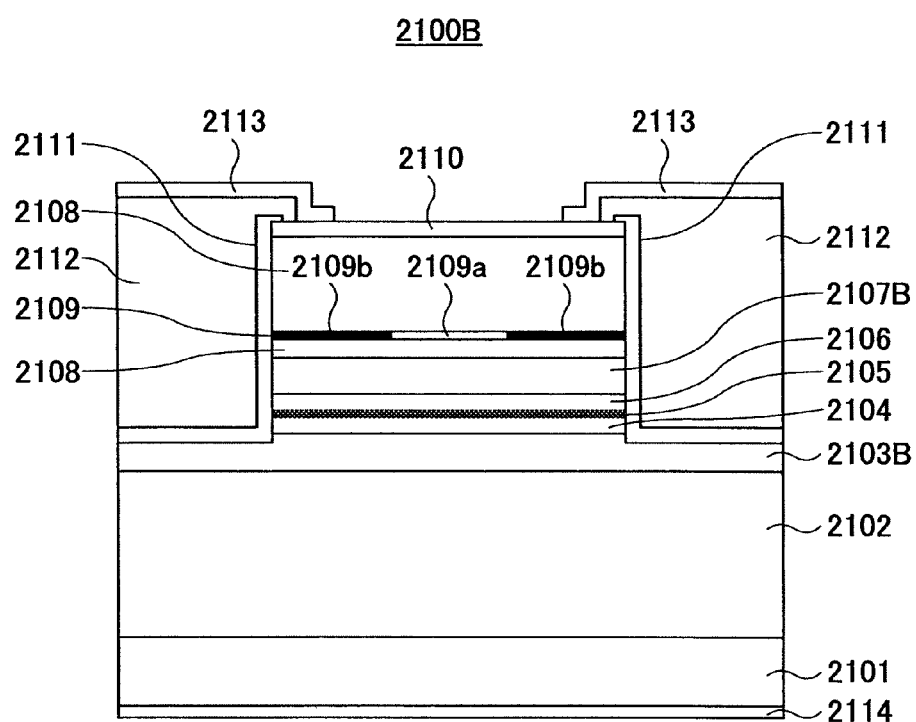
FIG. 34 is a schematic cross-sectional view of a surface-emitting laser device according to a $14^{th}$ embodiment of the present invention.

FIG. 34 is a schematic cross-sectional view of a surface-emitting laser device 2100B according to a 14$^{th}$ embodiment of the present invention. Referring to FIG. 34, the surface-emitting laser device 2100B is the same as the surface-emitting laser device 2100 shown in FIG. 23 except that the reflective layers 2103 and 2107 of the surface-emitting laser device 2100 are replaced with reflective layers 2103B and 2107B, respectively.

Figure 35:
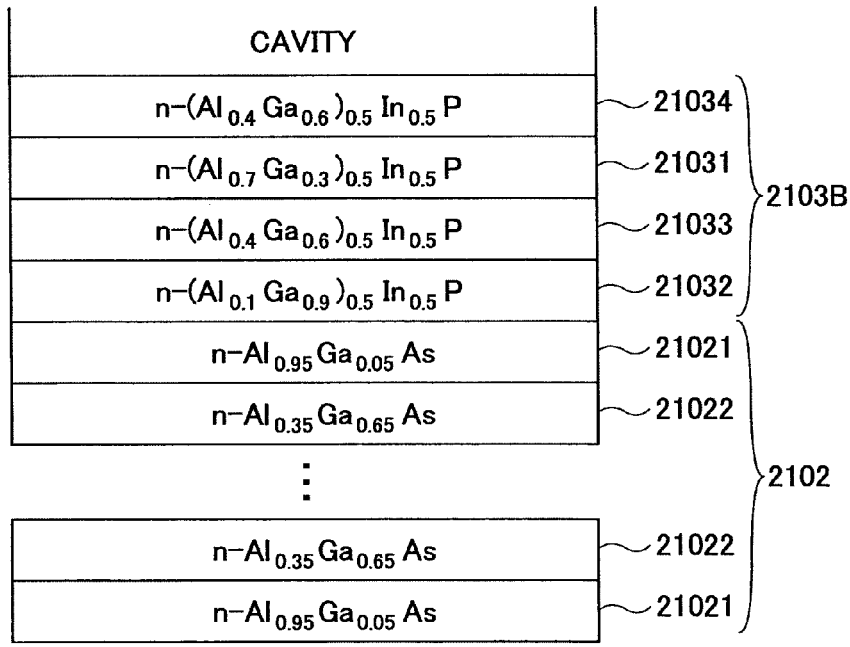
FIG. 35 is a cross-sectional view of two reflective layers shown in FIG. 34 according to the $14^{th}$ embodiment of the present invention.

FIG. 35 is a cross-sectional view of the two reflective layers 2102 and 2103B shown in FIG. 34. Referring to FIG. 35, the reflective layer 2103B is the same as the reflective layer 2103A shown in FIG. 31 except that the reflective layer 2103B further includes an additional intermediate layer 21034.

The intermediate layer 21034 is formed of n-$(Al_{0.4}Ga_{0.6})_{0.5}In_{0.5}P$ between the low refractive index layer 21031 and the cavity.

Figure 36:
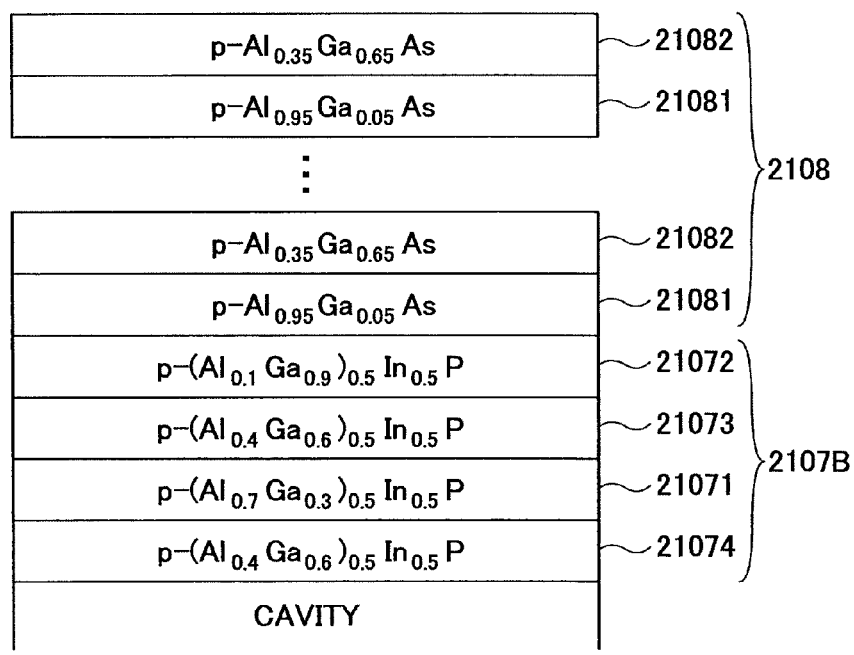
FIG. 36 is a cross-sectional view of two other reflective layers shown in FIG. 34 according to the $14^{th}$ embodiment of the present invention.

FIG. 36 is a cross-sectional view of the two reflective layers 2107B and 2108 shown in FIG. 34. Referring to FIG. 34, the reflective layer 2107B is the same as the reflective layer 2107A shown in FIG. 32 except that the reflective layer 2107B further includes an additional intermediate layer 21074.

The intermediate layer 21074 is formed of p-$(Al_{0.4}Ga_{0.6})_{0.5}In_{0.5}P$ between the low refractive index layer 21071 and the cavity.

Figure 37:
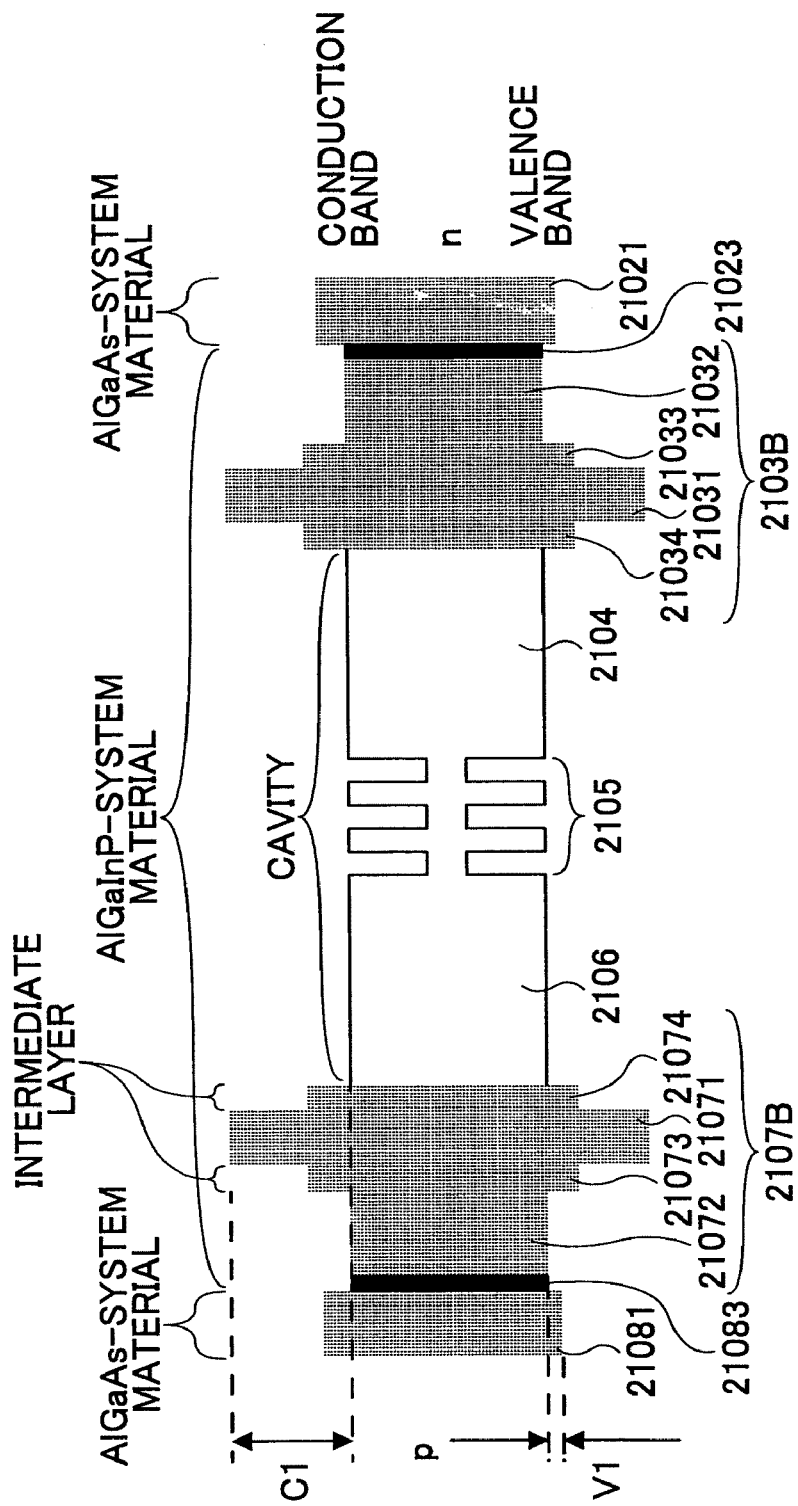
FIG. 37 is an energy band diagram of part of the two reflective layers, the two reflective layers, and the cavity (=the cavity spacer layers and the active layer) shown in FIG. 34 according to the $14^{th}$ embodiment of the present invention.

FIG. 37 is an energy band diagram of part of the two reflective layers 2102 and 2108, the two reflective layers 2103B and 2107B, and the cavity (=the cavity spacer layers 2104 and 2106 and the active layer 2105) shown in FIG. 34.

Referring to FIG. 37, the intermediate layer 21034 has a band gap that is between the band gap of the cavity spacer layer 2104 of the cavity and the band gap of the low refractive index layer 21031. Further, the intermediate layer 21074 has a band gap that is between the band gap of the cavity spacer layer 2106 and the band gap of the low refractive index layer 21071.

A great difference between the Al composition ratio of the cavity spacer layer 2104 and the Al composition ratio of the low refractive index layer 21031 results in a great discontinuity between valence bands in the reflective layer 2103A. Accordingly, the intermediate layer 21034 having an intermediate Al composition ratio between the Al composition ratio of the cavity spacer layer 2104 and the Al composition ratio of the low refractive index layer 21031 is interposed between the cavity spacer layer 2104 and the low refractive index layer 21031. As a result, the valence band discontinuity in the reflective layer 2103B is reduced, so that it is possible to reduce the resistance of the reflective layer 2103B.

Further, a great difference between the Al composition ratio of the cavity spacer layer 2106 and the Al composition ratio of the low refractive index layer 21071 results in a great discontinuity between valence bands in the reflective layer 2107A. Accordingly, the intermediate layer 21074 having an intermediate Al composition ratio between the Al composition ratio of the cavity spacer layer 2106 and the Al composition ratio of the low refractive index layer 21071 is interposed between the cavity spacer layer 2106 and the low refractive index layer 21071. As a result, the valence band discontinuity in the reflective layer 2107B is reduced, so that it is possible to reduce the resistance of the reflective layer 2107B.

Accordingly, by providing the intermediate layers 21034 and 21074 in the reflective layers 2103B and 2107B, respectively, the resistance of each of the reflective layers 2103B and 2107B is reduced, so that the surface-emitting laser device 2100B can have high output.

The surface-emitting laser device 2100B is manufactured according to the processes shown in FIGS. 29A through 29H. In this case, the reflective layers 2103B and 2107B are stacked in place of the reflective layers 2103 and 2107, respectively, in the process of FIG. 29A.

Further, the intermediate layer 21034 is described above as formed of n-$(Al_{0.4}Ga_{0.6})_{0.5}In_{0.5}P$ and the intermediate layer 21074 is described above as formed of p-$(Al_{0.4}Ga_{0.6})_{0.5}In_{0.5}P$. In the present invention, however, the intermediate layers 21034 and 21074 are not limited to these. The intermediate layer 21034 may be formed of n-$(Al_zGa_{1-z})_{0.5}In_{0.5}P$ ($0 \leq z \leq 1$, $y<z<x$) and the intermediate layer 21074 may be formed of p-$(Al_zGa_{1-z})_{0.5}In_{0.5}P$ ($0 \leq z \leq 1$, $y<z<x$).

Further, the intermediate layer 21034 may be formed of multiple n-$(Al_zGa_{1-z})_{0.5}In_{0.5}P$ layers that are reduced continuously or stepwise in band gap from the low refractive index layer 21031 toward the cavity spacer layer 2104. Further, the intermediate layer 21074 may be formed of multiple p-$(Al_zGa_{1-z})_{0.5}In_{0.5}P$ layers that are reduced continuously or stepwise in band gap from the low refractive index layer 21071 toward the cavity spacer layer 2106.

Otherwise, the 14$^{th}$ embodiment is the same as the 12$^{th}$ embodiment.

15$^{th}$ Embodiment

Figure 38:
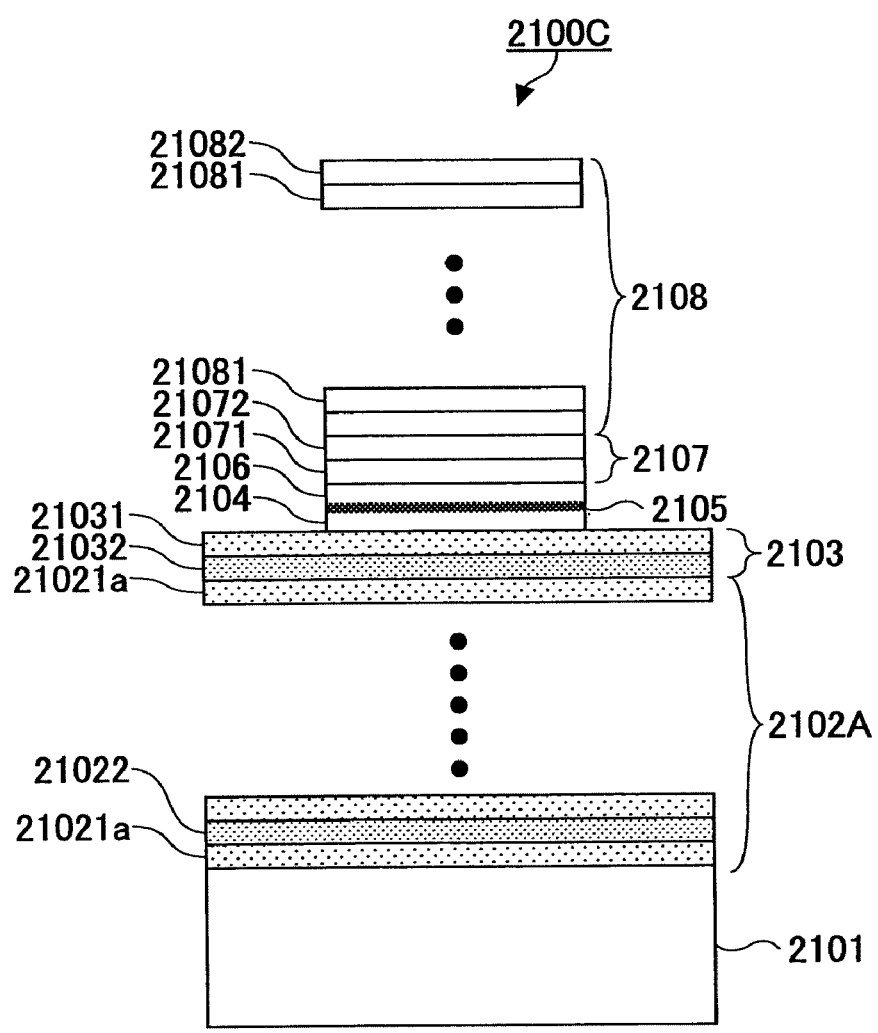
FIG. 38 is a diagram for illustrating a surface-emitting laser device according to a $15^{th}$ embodiment of the present invention.

Next, a description is given of a 15$^{th}$ embodiment of the present invention. Referring to FIG. 38, a surface-emitting laser device 2100C according to the 15$^{th}$ embodiment is the same as the surface-emitting laser device 2100 shown in FIG. 23 except that the reflective layer 2102 of the surface-emitting laser device 2100 is replaced with a reflective layer 2102A.

The reflective layer 2102A has 35.5 pairs of a low refractive index layer 21021a formed of n-AlAs and the high refractive index layer 21022 formed of n-$Al_{0.35}Ga_{0.65}As$. That is, the reflective layer 2102A is formed by replacing the low refractive index layers 21021 with the low refractive index layers 21021a in the reflective layer 2102 of the above-described surface-emitting laser device 2100.

According to this 15$^{th}$ embodiment, AlAs layers lower in thermal resistance than AlGaAs-system material are used for the low refractive index layers 21021a of the reflective layer 2102A. Therefore, it is possible to more effectively dissipate heat generated in the active layer 2105 to the substrate 2101 side. Accordingly, it is possible to suppress an increase in the temperature of the active layer 2105, so that it is possible to achieve improvements in the characteristics of a VCSEL (Vertical-Cavity Surface-Emitting Laser), such as an increase in light output.

In view of only thermal characteristics, it is more preferable that the high refractive index layers 21022 be formed of GaAs. However, if the light emission wavelength in the active layer 2105 is less than or equal to 850 nm, GaAs cannot be used because there is absorption in a GaAs layer.

Figure 39:
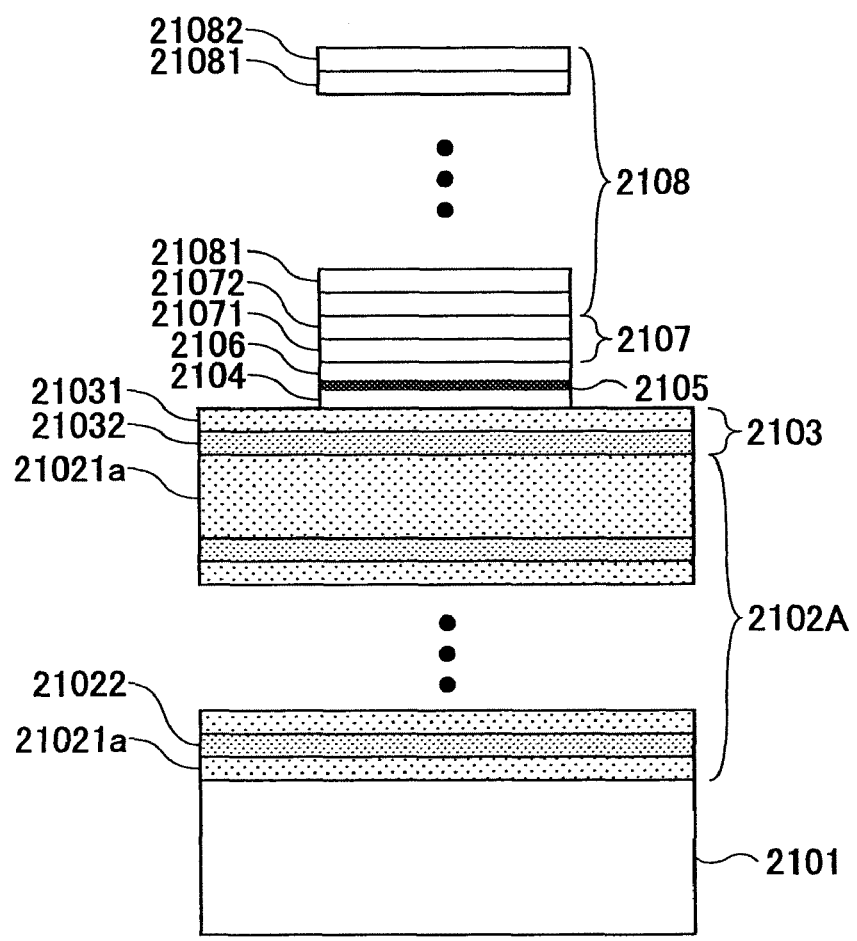
FIG. 39 is a diagram for illustrating a first variation of the surface-emitting laser device of FIG. 38 according to the $15^{th}$ embodiment of the present invention.

In the 15$^{th}$ embodiment, a description is given of the case where the optical thickness of each low refractive index layer 21021a is $\lambda/4$ in the reflective layer 2102A. However, the optical thickness of the low refractive index layers 21021a is not limited to this. For example, as shown in FIG. 39, the low refractive index layer 21021a that is in contact with the reflective layer 2103 and that is in the reflective layer 2102A may have an optical thickness of $3\lambda/4$. As a result, it is possible to emit heat generated in the active layer 2105 to the substrate 2101 side with further efficiency.

In this case, the optical thickness of the low refractive index layer 21021a in contact with the reflective layer 2103 may alternatively be $5\lambda/4$ or $7\lambda/4$. That is, the optical thickness of the low refractive index layer 21021a in contact with the reflective layer 2103 may be greater than or equal to $\lambda/4$.

Further, in this case, it is also possible to make two or more of the low refractive index layers 21021a close to the reflective layer 2103, instead of only the low refractive index layer 21021a in contact with the reflective layer 2103, have an optical thickness of $\lambda/4$ or more.

Figure 40:
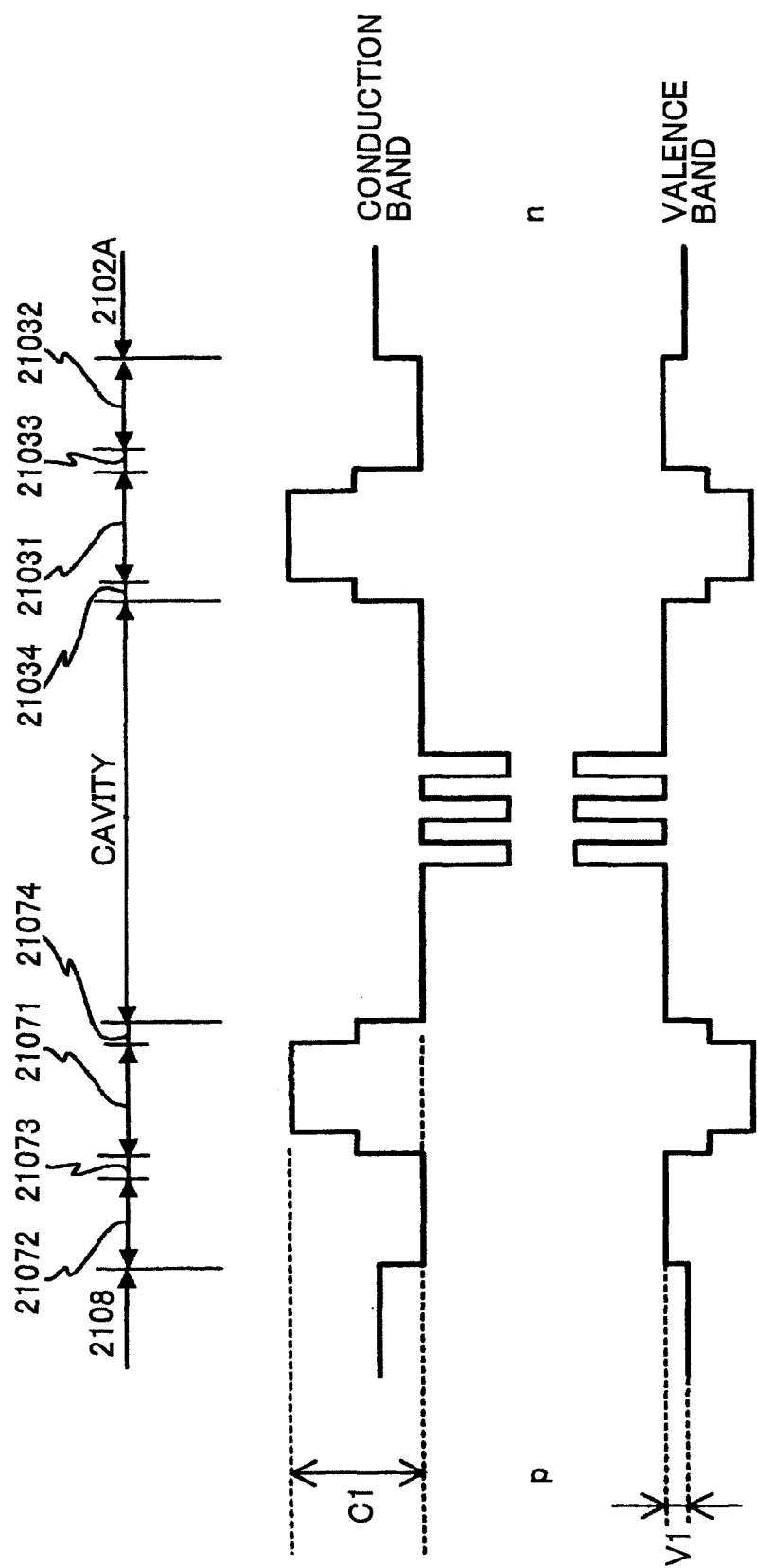
FIG. 40 is an energy band diagram of a second variation of the surface-emitting laser device of FIG. 38 according to the $15^{th}$ embodiment of the present invention.

Further, if there is a great difference in Al composition between the low refractive index layer 21031 and the high refractive index layer 21032 in the reflective layer 2103, the above-described intermediate layer 21033 may be interposed between the low refractive index layer 21031 and the high refractive index layer 21032 as shown in FIG. 40 the same as in the above-described surface-emitting laser device 2100A. This reduces band discontinuity, so that it is possible to reduce device resistance. The intermediate layer 21033 may be formed of multiple semiconductor layers so that the band gap gradually changes stepwise in the intermediate layer 21033.

Further, if there is a great difference in Al composition between the low refractive index layer 21071 and the high refractive index layer 21072 in the reflective layer 2107, the above-described intermediate layer 21073 may be interposed between the low refractive index layer 21071 and the high refractive index layer 21072 as shown in FIG. 40 the same as in the above-described surface-emitting laser device 2100A. This reduces band discontinuity, so that it is possible to reduce device resistance. The intermediate layer 21073 may be formed of multiple semiconductor layers so that the band gap gradually changes stepwise in the intermediate layer 21073.

Further, if there is a great difference in Al composition between the low refractive index layer 21031 of the reflective layer 2103 and the spacer layer 2104, the above-described intermediate layer 21034 serving as a joining layer may be interposed between the low refractive index layer 21031 and the spacer layer 2104 as shown in FIG. 40 the same as in the above-described surface-emitting laser device 2100B. This reduces band discontinuity, so that it is possible to reduce device resistance. The intermediate layer 21034 may be formed of multiple semiconductor layers so that the band gap gradually changes stepwise in the intermediate layer 21034.

Further, if there is a great difference in Al composition between the low refractive index layer 21071 of the reflective layer 2107 and the spacer layer 2106, the above-described intermediate layer 21074 serving as a joining layer may be interposed between the low refractive index layer 21071 and the spacer layer 2106 as shown in FIG. 40 the same as in the above-described surface-emitting laser device 2100B. This reduces band discontinuity, so that it is possible to reduce device resistance. The intermediate layer 21074 may be formed of multiple semiconductor layers so that the band gap gradually changes stepwise in the intermediate layer 21074.

16th Embodiment

Figure 41:
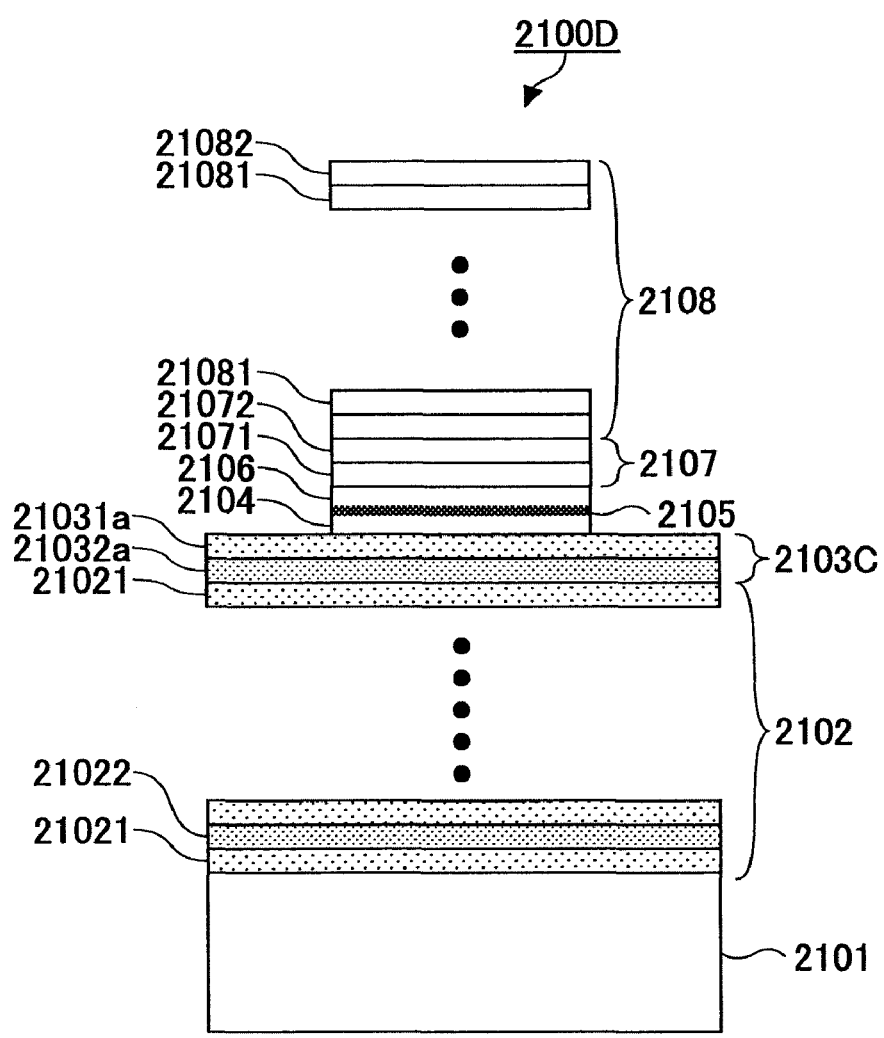
FIG. 41 is a diagram for illustrating a surface-emitting laser device according to a $16^{th}$ embodiment of the present invention.

Next, a description is given of a 16th embodiment of the present invention. Referring to FIG. 41, a surface-emitting laser device 2100D according to the 16th embodiment is the same as the surface-emitting laser device 2100 shown in FIG. 23 except that the reflective layer 2103 of the surface-emitting laser device 2100 is replaced with a reflective layer 2103C.

The reflective layer 2103C includes a low refractive index layer 21031a formed of an AlGaAs-system material (for example, n-$Al_{0.95}Ga_{0.05}As$, the same as the above-described low refractive index layers 21021) and a high refractive index layer 21032a formed of an AlGaAs-system material (for example, n-$Al_{0.35}Ga_{0.65}As$, the same as the above-described high refractive index layers 21022). If the low refractive index layer 21031a is n-$Al_{0.95}Ga_{0.05}As$ and the high refractive index layer 21032a is n-$Al_{0.35}Ga_{0.65}As$, the reflective layer 2102 and the reflective layer 2103C are formed of the same low refractive index layers and the same high refractive index layers. Accordingly, the reflective layer 2102 and the reflective layer 2103C may be regarded as a single reflective layer.

As a result, the reflective layers 2102 and 2103C between the substrate 2101 and the cavity are formed of only AlGaAs-system materials. As shown in FIG. 28, the AlGaAs-system material is lower in thermal resistance than an AlGaInP-system material of any composition. Accordingly, it is possible to effectively dissipate heat generated in the active layer 2105 to the substrate 2101 side.

Figure 42:
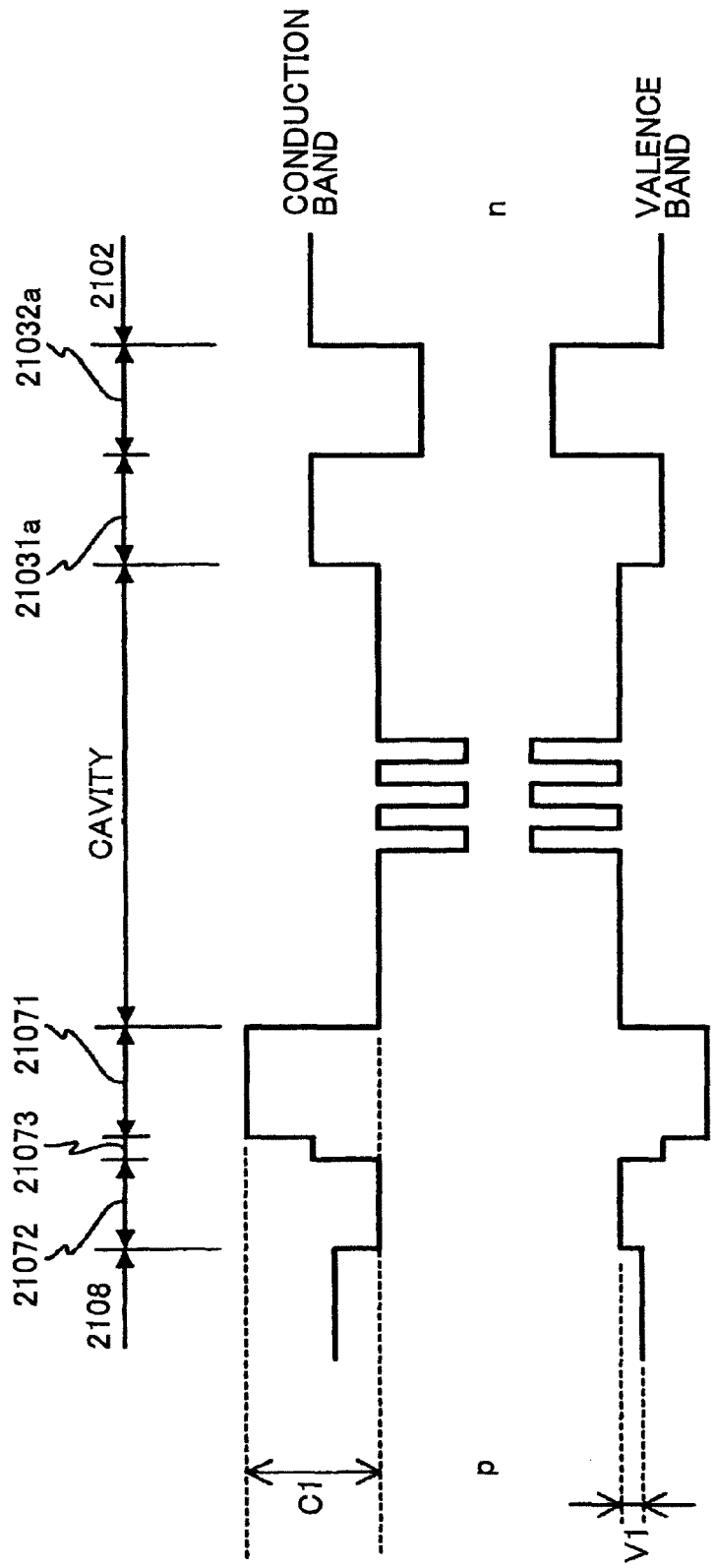
FIG. 42 is an energy band diagram of a first variation of the surface-emitting laser device of FIG. 41 according to the $16^{th}$ embodiment of the present invention.

Further, if there is a great difference in Al composition between the low refractive index layer 21071 and the high refractive index layer 21072 in the reflective layer 2107, the above-described intermediate layer 21073 may be interposed between the low refractive index layer 21071 and the high refractive index layer 21072 as shown in FIG. 42 the same as in the above-described surface-emitting laser device 2100A. This reduces band discontinuity, so that it is possible to reduce device resistance. The intermediate layer 21073 may be formed of multiple semiconductor layers so that the band gap gradually changes stepwise in the intermediate layer 21073.

Figure 43:
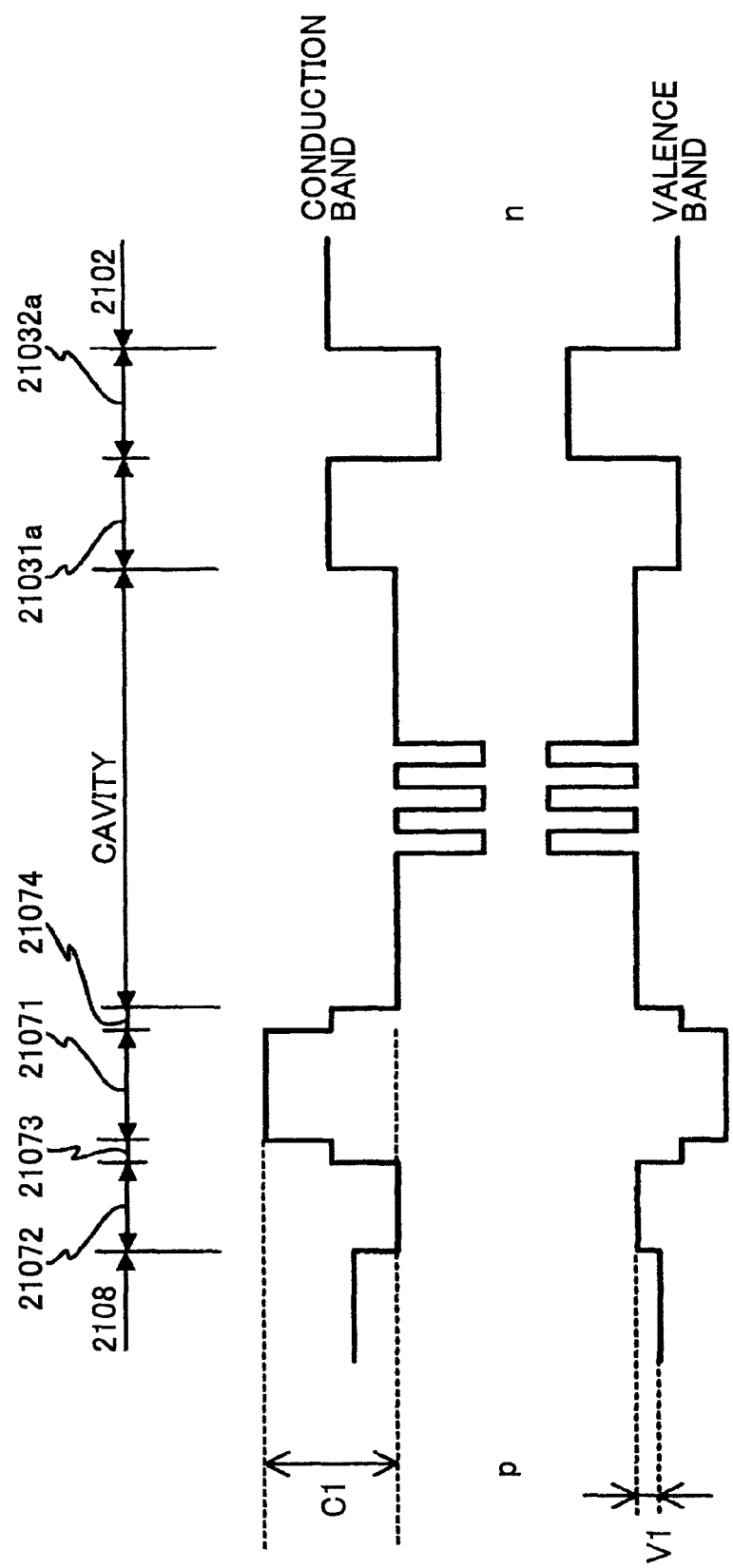
FIG. 43 is an energy band diagram of a second variation of the surface-emitting laser device of FIG. 41 according to the $16^{th}$ embodiment of the present invention.

Further, if there is a great difference in Al composition between the low refractive index layer 21071 of the reflective layer 2107 and the spacer layer 2106, the above-described intermediate layer 21074 serving as a joining layer may be interposed between the low refractive index layer 21071 and the spacer layer 2106 as shown in FIG. 43 the same as in the above-described surface-emitting laser device 2100B. This reduces band discontinuity, so that it is possible to reduce device resistance. The intermediate layer 21074 may be formed of multiple semiconductor layers so that the band gap gradually changes stepwise in the intermediate layer 21074.

17th Embodiment

Figure 44:
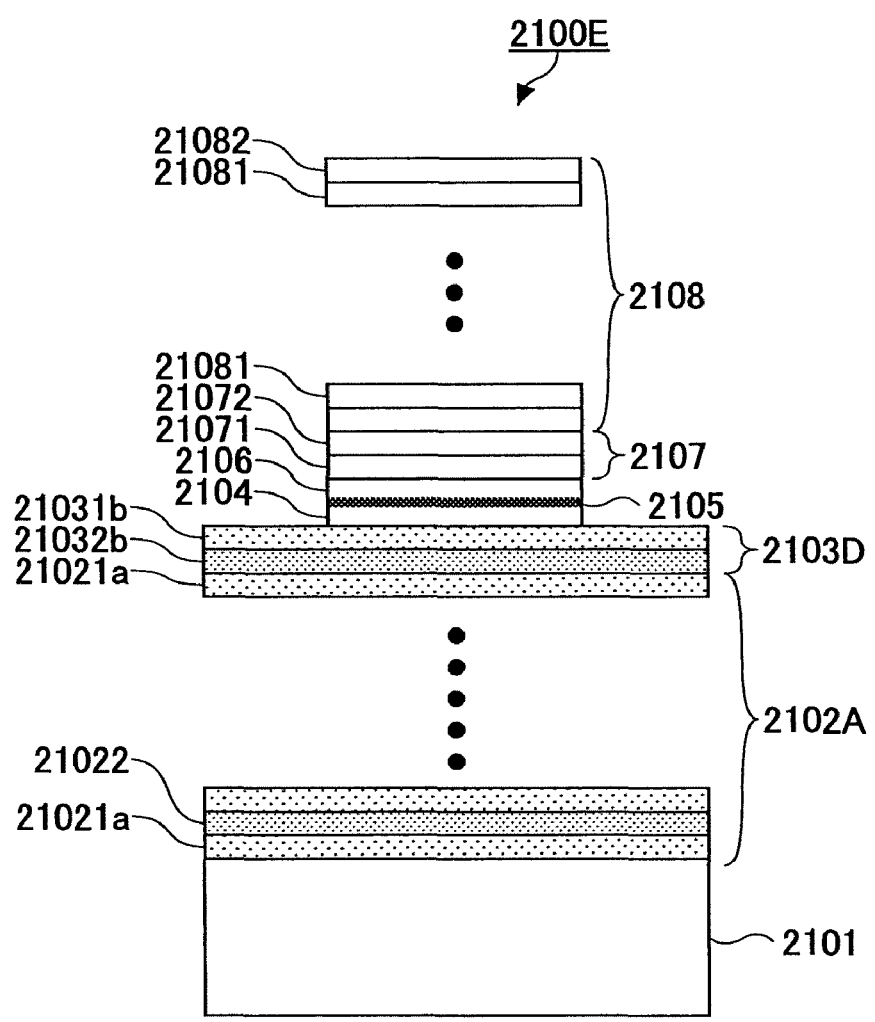
FIG. 44 is a diagram for illustrating a surface-emitting laser device according to a $17^{th}$ embodiment of the present invention.

Next, a description is given of a 17th embodiment of the present invention. Referring to FIG. 44, a surface-emitting laser device 2100E according to the 17th embodiment is the same as the surface-emitting laser device 2100C shown in FIG. 38 except that the reflective layer 2103 of the surface-emitting laser device 2100C is replaced with a reflective layer 2103D.

The reflective layer 2103D includes a low refractive index layer 21031b formed of n-AlAs and the high refractive index layer 21032b formed of n-$Al_{0.35}Ga_{0.65}As$. That is, the low refractive index layer 21031b is the same as the low refractive index layers 21021a of the reflective layer 2102A, and the high refractive index layer 21032b is the same as the high refractive index layers 21022 of the reflective layer 2102A. Therefore, the reflective layer 2102A and the reflective layer 2103D are formed of the same low refractive index layers and the same high refractive index layers. Accordingly, the reflective layer 2102A and the reflective layer 2103D may be regarded as a single reflective layer.

According to this 17th Embodiment, AlAs, which is lower in thermal resistance than AlGaAs-system material, is used for the low refractive index layer 21031b of the reflective layer 2103D. Therefore, it is possible to effectively dissipate heat generated in the active layer 2105 to the substrate 2101 side. Accordingly, it is possible to suppress an increase in the temperature of the active layer 2105, so that it is possible to achieve improvements in the characteristics of a VCSEL, such as an increase in light output.

In view of only thermal characteristics, it is more preferable that the high refractive index layers 21022 be formed of GaAs. However, if the light emission wavelength in the active layer 2105 is less than or equal to 850 nm, GaAs cannot be used because there is absorption in a GaAs layer.

Figure 45:
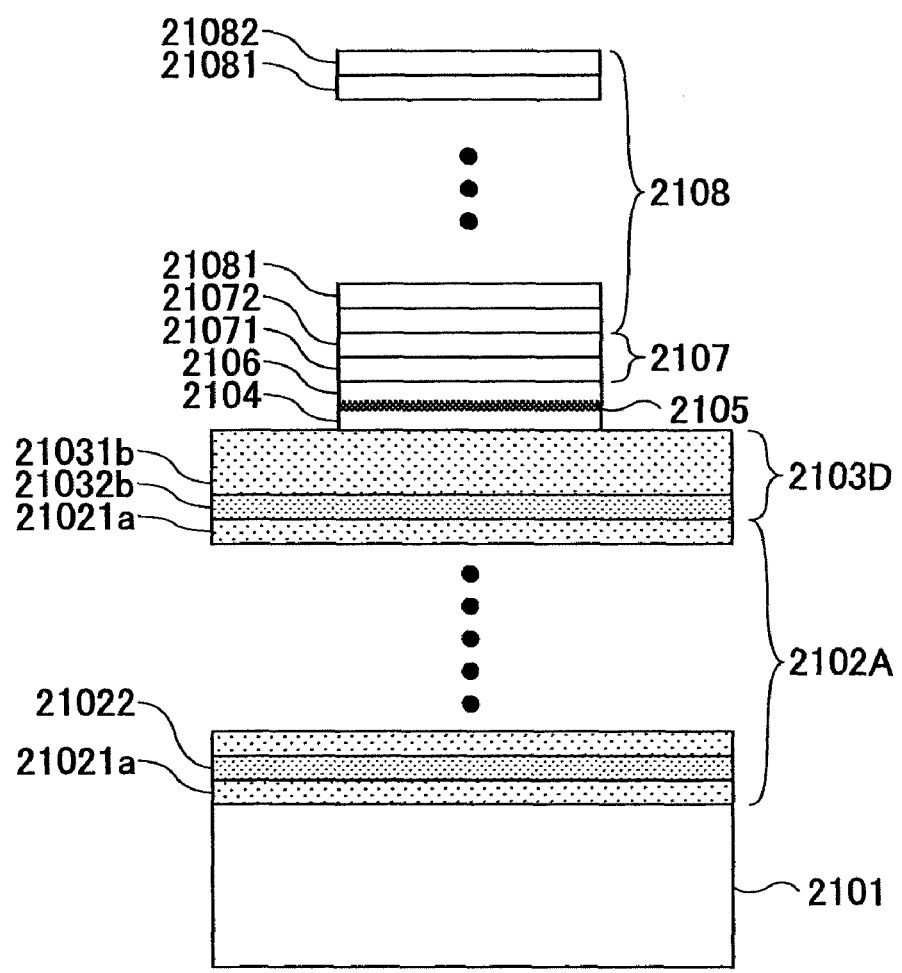
FIG. 45 is a diagram for illustrating a first variation of the surface-emitting laser device of FIG. 44 according to the $17^{th}$ embodiment of the present invention.
Figure 46:
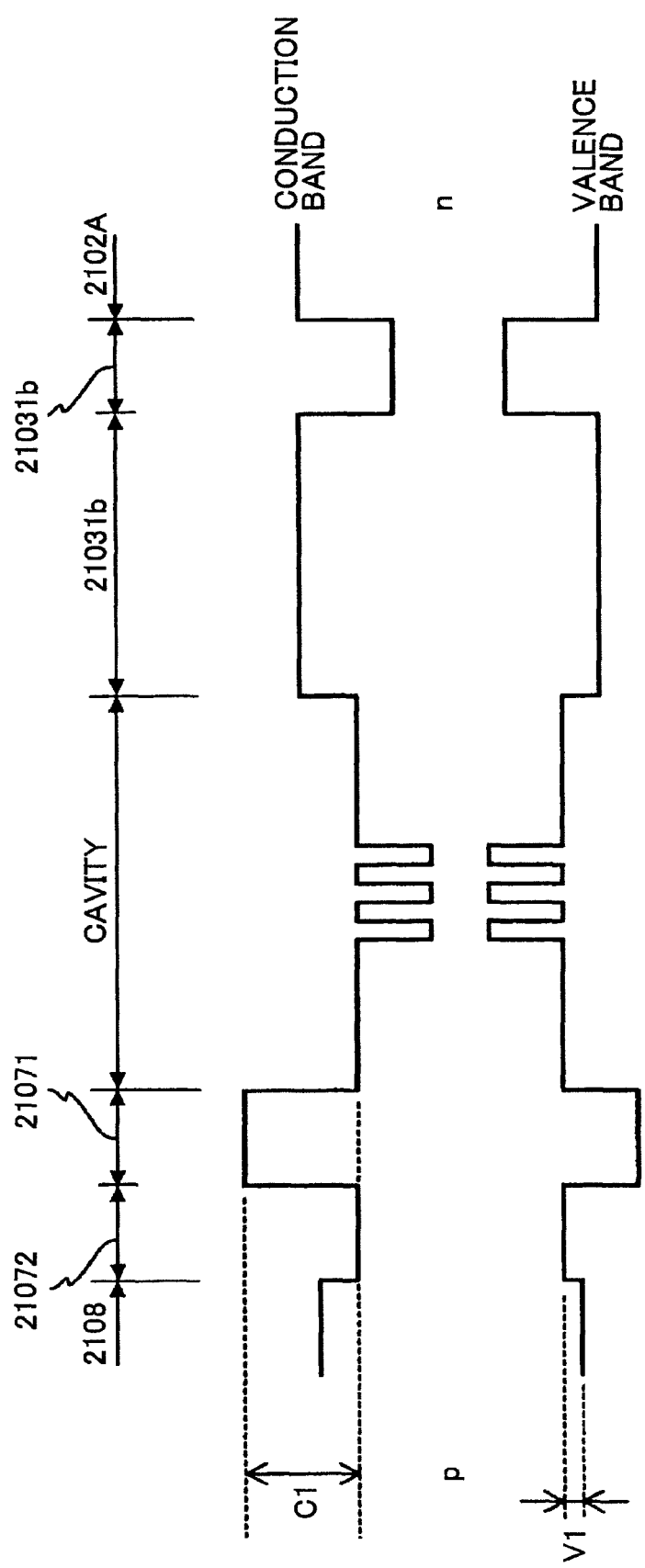
FIG. 46 is an energy band diagram of a second variation of the surface-emitting laser device of FIG. 44 according to the 17th embodiment of the present invention.

In the 17th embodiment, a description is given of the case where the optical thickness of the low refractive index layer 21031b in contact with the cavity and in the reflective layer 2103D is $\lambda/4$. However, the optical thickness of the low refractive index layer 21031b in contact with the cavity is not limited to this. For example, as shown in FIGS. 45 and 46, the low refractive index layer 21031b in contact with the cavity may have an optical thickness of $3\lambda/4$. As a result, it is possible to dissipate heat generated in the active layer 2105 to the substrate 2101 side with further efficiency.

In this case, the optical thickness of the low refractive index layer 21031b in contact with the cavity may alternatively be $5\lambda/4$ or $7\lambda/4$. That is, the optical thickness of the low refractive index layer 21031b in contact with the cavity may be greater than or equal to $\lambda/4$.

Figure 47:
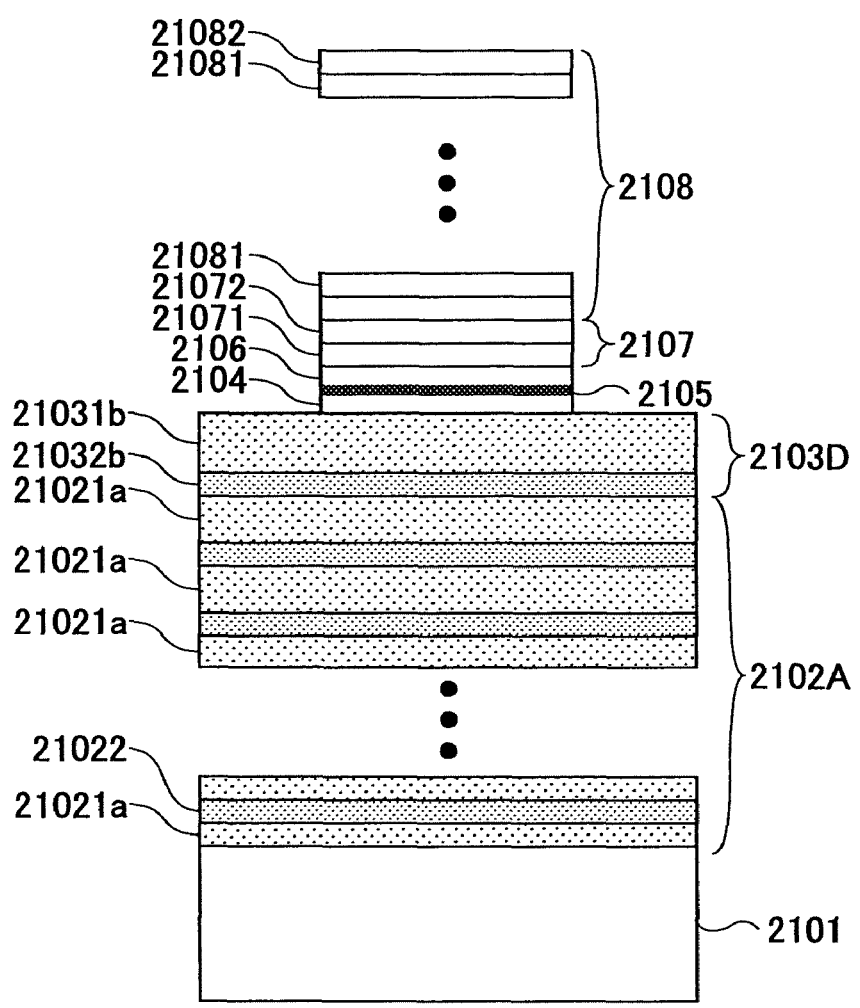
FIG. 47 is a diagram for illustrating a third variation of the surface-emitting laser device of FIG. 44 according to the 17th embodiment of the present invention.

Further, in this case, not only the low refractive index layer 21031b in contact with the cavity but also two or more of the low refractive index layers 21021a close to the cavity in the reflective layer 2102A may have an optical thickness of $\lambda/4$ or more as shown in FIG. 47.

In the configuration shown in FIG. 47, the potential energy of the conduction band of the cavity is approximately 0.22 eV, and the potential energy of the conduction band of the low refractive index layer 21071 is approximately 0.38 eV, so that there is an energy difference of 0.16 eV therebetween. Thus, it is possible to substantially improve carrier confinement. If the low refractive index layer 21071 is p-$Al_{0.95}Ga_{0.05}As$ and the high refractive index layer 21072 is p-$Al_{0.35}Ga_{0.65}As$, the potential energy of the conduction band of the cavity is approximately 0.22 eV and the potential energy of the conduction band of the low refractive index layer 21071 is approximately 0.30 eV, so that there is an energy difference of 0.08 eV therebetween.

Further, in the configuration shown in FIG. 47, the potential energy of the valence band of the high refractive index layer 21072 is approximately −1.75 eV, and the potential energy of the valence band of the low refractive index layer 21071 is approximately −1.84 eV, so that there is an energy difference of −0.09 eV. Thus, it is possible to substantially reduce device resistance. If the low refractive index layer 21071 is p-$(Al_{0.7}Ga_{0.3})_{0.5}In_{0.5}P$ and the high refractive index layer 21072 is p-$Al_{0.35}Ga_{0.65}As$, the potential energy of the valence band of the low refractive index layer 21071 is approximately −1.94 eV and the potential energy of the valence band of the high refractive index layer 21072 is approximately −1.57 eV, so that there is an energy difference of −0.37 eV therebetween.

Thus, according to the 17$^{th}$ embodiment, a characteristic better than conventionally can be expected with respect to each of improvement of carrier confinement, reduction in device resistance, and improvement of heat dissipation characteristics.

18$^{th}$ Embodiment

Application

Figure 48:
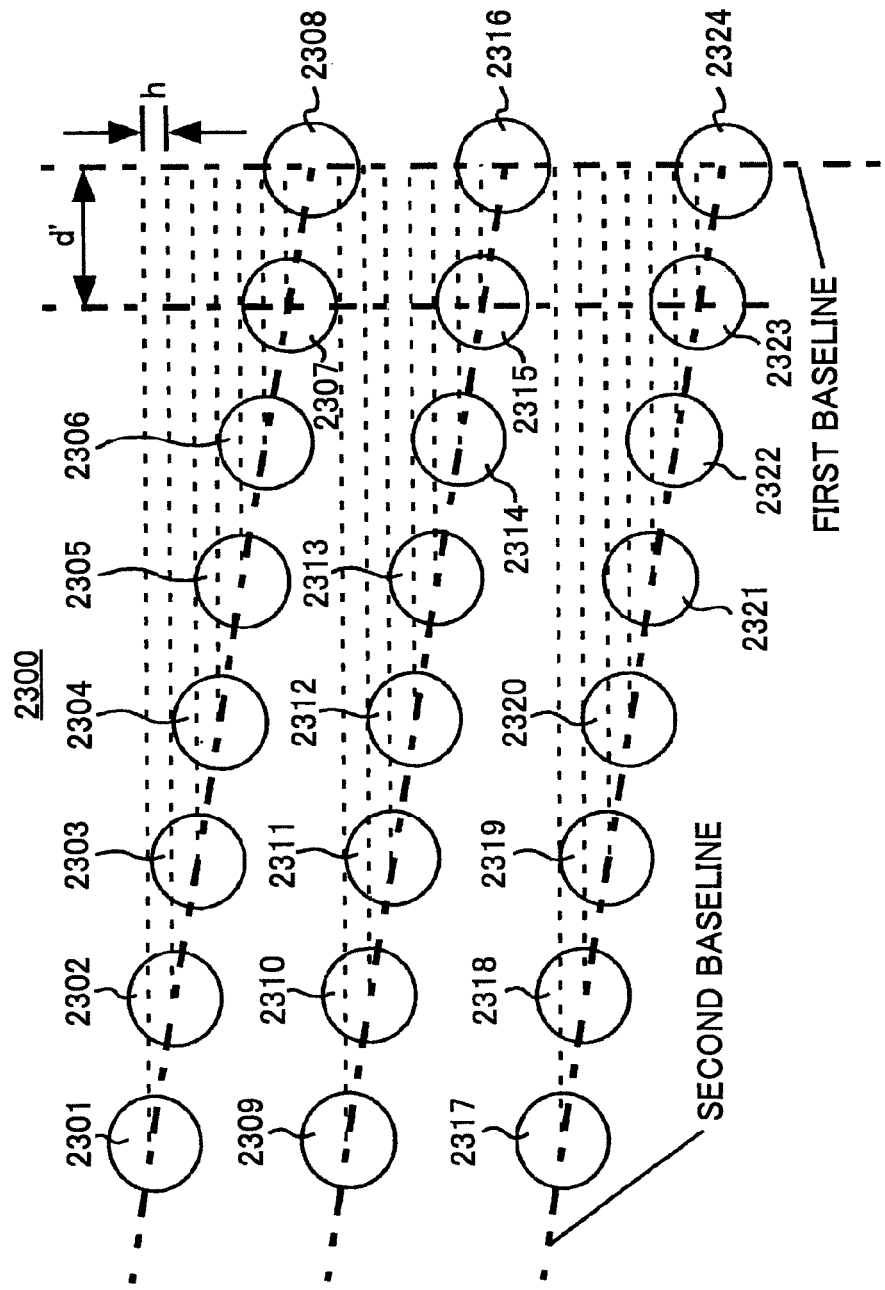
FIG. 48 is a plan view of a surface-emitting laser array using the surface-emitting laser device shown in FIG. 23 according to an 18th embodiment of the present invention.

FIG. 48 is a plan view of a surface-emitting laser array 2300 using the surface-emitting laser device 2100 shown in FIG. 23 according to an 18$^{th}$ embodiment of the present invention. Referring to FIG. 48, the surface-emitting laser array 2300 includes 24 surface-emitting laser devices 2301 through 2324.

Each of the 24 surface-emitting laser devices 2301 through 2324 is formed of the surface-emitting laser device 2100 shown in FIG. 23. The surface-emitting laser devices 2301 through 2324 are disposed two-dimensionally. Sets of three surface-emitting lasers, that is, the surface-emitting laser devices 2301, 2309, and 2317; the surface-emitting laser devices 2302, 2310, and 2318; the surface-emitting laser devices 2303, 2311, and 2319; the surface-emitting laser devices 2304, 2312, and 2320; the surface-emitting laser devices 2305, 2313, and 2321; the surface-emitting laser devices 2306, 2314, and 2322; the surface-emitting laser devices 2307, 2315, and 2323; and the surface-emitting laser devices 2308, 2316, and 2324, are disposed at equal intervals along first baselines.

Further, sets of eight surface-emitting laser devices, that is, the surface-emitting laser devices 2301 through 2308; the surface-emitting laser devices 2309 through 2316; and the surface-emitting laser devices 2317 through 2324, are disposed at equal intervals along second baselines. In this case, each adjacent two of the surface-emitting laser devices 2301 through 2324 along the second baselines are disposed at an interval of d' as shown in FIG. 48.

Further, each first baseline forms a predetermined angle with each second baseline. Accordingly, in the case of projecting the center points of each eight surface-emitting laser devices 2301 through 2308, 2309 through 2316, or 2317 through 2324 onto the first baselines, the eight center points are projected at equal intervals of h.

Since the surface-emitting laser devices 2100 are of a surface-emitting type, the surface-emitting laser devices 2100 can be arrayed easily with high device position accuracy. Further, in the surface-emitting laser device 2100, the resistances of the reflective layers 2103 and 2107 are reduced so as to suppress heat generation as described above. Accordingly, the surface-emitting laser array 2300 can be reduced in device interval with high device density compared with the conventional surface-emitting laser array. As a result, an increased number of chips are taken, so that it is possible to reduce cost.

Further, when applied to a write optical system, integration of multiple surface-emitting laser devices 2100 capable of performing a high output operation onto the same substrate facilitates simultaneous writing with multiple beams so as to remarkably increase writing rate, so that it is possible to perform printing without reduction in printing rate even if there is an increase in writing dot density. If the writing dot density remains the same, it is possible to increase printing rate.

That is, usually, all the surface-emitting laser devices 2301 through 2324 are lighted in accordance with image data in a single main scan, and thereafter, sub scanning is performed. By repeating these processes, image recording is performed. That is, letting the total number of surface-emitting laser devices included in the surface-emitting laser array 2300 be n, image recording of n lines' worth is performed in a single main scan, so that an image can be recorded in 1/n times as much time as in the case of using a single laser light source having the same output.

In the surface-emitting laser array 2300, each of the surface-emitting laser devices 2301 through 2324 may also be formed of any of the surface-emitting laser devices 2100A and 2100B.

19$^{th}$ Embodiment

Figure 49:
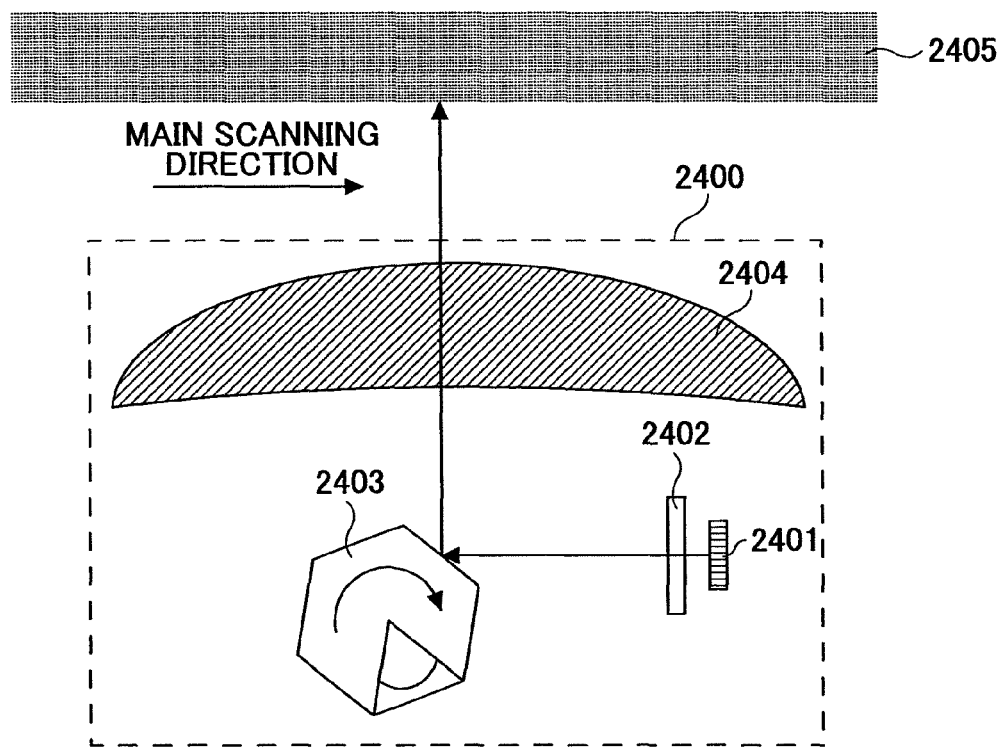
FIG. 49 is a schematic diagram showing an optical scanner according to a 19th embodiment of the present invention.

FIG. 49 is a schematic diagram showing an optical scanner 2400 according to a 19$^{th}$ embodiment of the present invention. Referring to FIG. 49, the optical scanner 2400 includes a surface-emitting laser array 2401, a collimator lens 2402, a polygon mirror 2403, and an fθ lens 2404.

The surface-emitting laser array 2401 is formed of the surface-emitting laser array 2300 shown in FIG. 48, and emits multiple beams. The collimator lens 2402 collimates the multiple beams emitted from the surface-emitting laser array 2401, and guides the collimated beams to the polygon mirror 2403.

The polygon mirror 2403 rotates clockwise at a predetermined speed so as to cause the multiple beams received from the collimator lens 2402 to scan in the main scanning direction and the sub scanning direction and guide the beams to the fθ lens 2404. The fθ lens 2404 guides the multiple beams reflected from the polygon mirror 403 to a photosensitive body 2405. In this case, the fθ lens 2404 guides the multiple beams reflected from the polygon mirror 2403 so that the beams are focused on the photosensitive body 2405.

Thus, according to the image optical scanner 2400, multiple beams from the surface-emitting laser array 2401 are focused into multiple light spots separated in the sub scanning direction on the photosensitive body 2405 serving as a scanned surface by causing the polygon mirror 2403 to rotate at high speed and adjusting lighting timing for dot positions, using the same optical system formed of the collimator lens 2402 and the polygon mirror 2403.

In the case of writing an image using the optical scanner 2400, it is possible to dispose the beams from the surface-emitting laser devices 2301 through 2324 on a single straight line on the photosensitive body 2405 by considering the respective offsets of the surface-emitting laser devices 2301 through 2324 with respect to the first baselines.

Further, in an optical writing system, if the number of laser beams is increased from one to n, the writing time required to cause the photosensitive body 2405 to make one rotation is reduced to 1/n if the light output and the rotation speed of a polygon mirror remain the same. Thus, writing can be performed at a much higher rate than conventionally.

20$^{th}$ Embodiment

Figure 50:
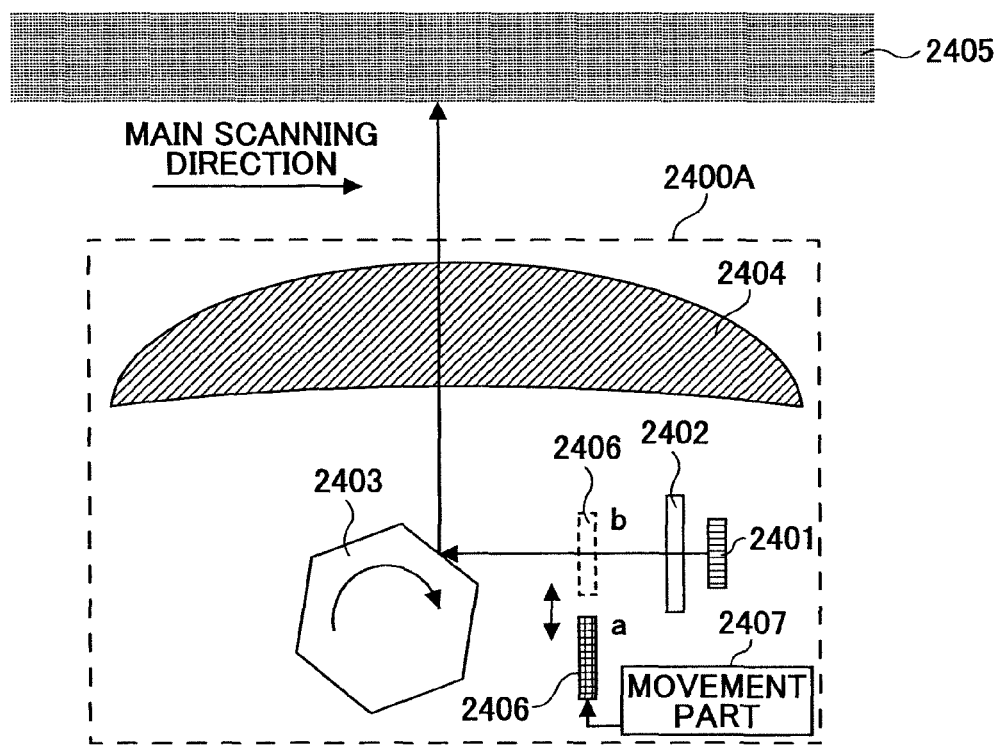
FIG. 50 is a schematic diagram showing an optical scanner according to a 20th embodiment of the present invention.

FIG. 50 is a schematic diagram showing an optical scanner 2400A according to a 20$^{th}$ embodiment of the present invention. Referring to FIG. 50, the optical scanner 2400A is the same as the optical scanner 2400 shown in FIG. 49 except that the optical scanner 2400A additionally includes a light-receiving element 2406 and a movement part 2407.

The movement part 2407 moves the light-receiving element 2406 between a position a outside the optical path of laser light and a position b on the optical axis of the laser light. When the light-receiving element 2406 is moved to the position b on the optical axis of the laser light, the light-receiving element 2406 detects laser light emitted from the surface-emitting laser array 2401 and measures its output.

When the optical scanner 2400A is writing an image, the movement part 2407 places the light-receiving element 2406 at the position a outside the optical path of the laser light. When the optical scanner 2400A does not write an image, the movement part 2407 places the light-receiving element 2406 at the position b on the optical axis of the laser light.

It has been confirmed with semiconductor lasers that as a general rule, output gradually decreases with energization or emission time on a long-term basis. This phenomenon more or less applies to every semiconductor laser. Variations in laser output appear as variations in electric potential on the photosensitive body 2405 in formation of a latent image, and are finally observed as unevenness of image density. Accordingly, laser light output should be made uniform in order to form an image of uniform density.

Therefore, when the optical scanner 2400A is not in an image recording operation, the light-receiving element 2406 is moved to be positioned on the optical axis of laser light, so that the outputs of multiple laser beams emitted from the surface-emitting laser array 2401 can be measured. By controlling currents injected into the multiple surface-emitting laser devices of the surface-emitting laser array 2401 based on the measurements so that the outputs of the multiple laser beams are kept substantially the same, it is possible to form an image of uniform density on the photosensitive body 2405.

Otherwise, the same description as for FIG. 49 applies.

21$^{st}$ Embodiment

Figure 51:
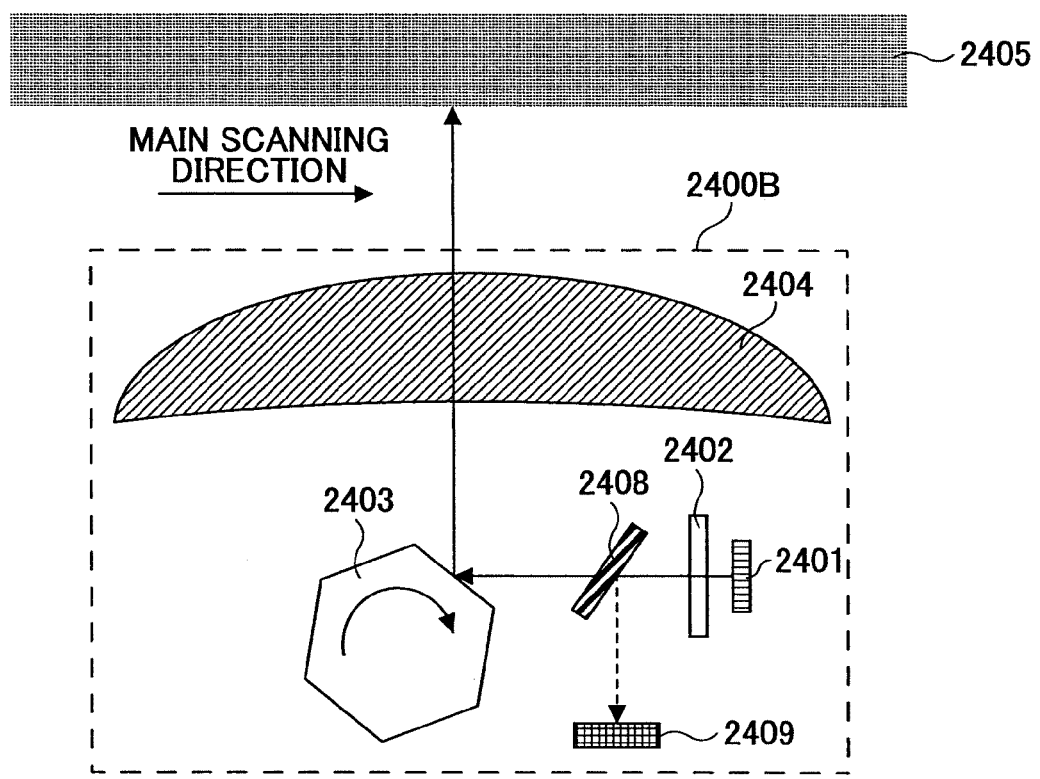
FIG. 51 is a schematic diagram showing an optical scanner according to a 21st embodiment of the present invention.

FIG. 51 is a schematic diagram showing an optical scanner 2400B according to a 21$^{st}$ embodiment of the present invention. Referring to FIG. 51, the optical scanner 2400B is the same as the optical scanner 2400 shown in FIG. 49 except that the optical scanner 2400B additionally includes a half mirror 2408 (light guide part) and a light-receiving element 2409.

The half mirror is disposed on the optical path between the collimator lens 2402 and the polygon mirror 2403. The half mirror 2408 transmits part of laser light from the collimator lens 2402 to the polygon mirror 2403, and reflects part of the laser light toward the light-receiving element 2409. The light-receiving element 2409 receives the light from the half mirror 2408.

By reflecting part of laser light with the half mirror 2408 and detecting the reflected light with the light-receiving element 2409, it is possible to measure the outputs of multiple laser beams emitted from the surface-emitting laser array 2401 without providing any moving part. Further, by controlling currents injected into the multiple surface-emitting laser devices of the surface-emitting laser array 2401 based on the measurements so that the outputs of the multiple laser beams are kept substantially the same, it is possible to form an image of uniform density on the photosensitive body 2405. Otherwise, the same description as for FIG. 49 applies.

22$^{nd}$ Embodiment

Figure 52:
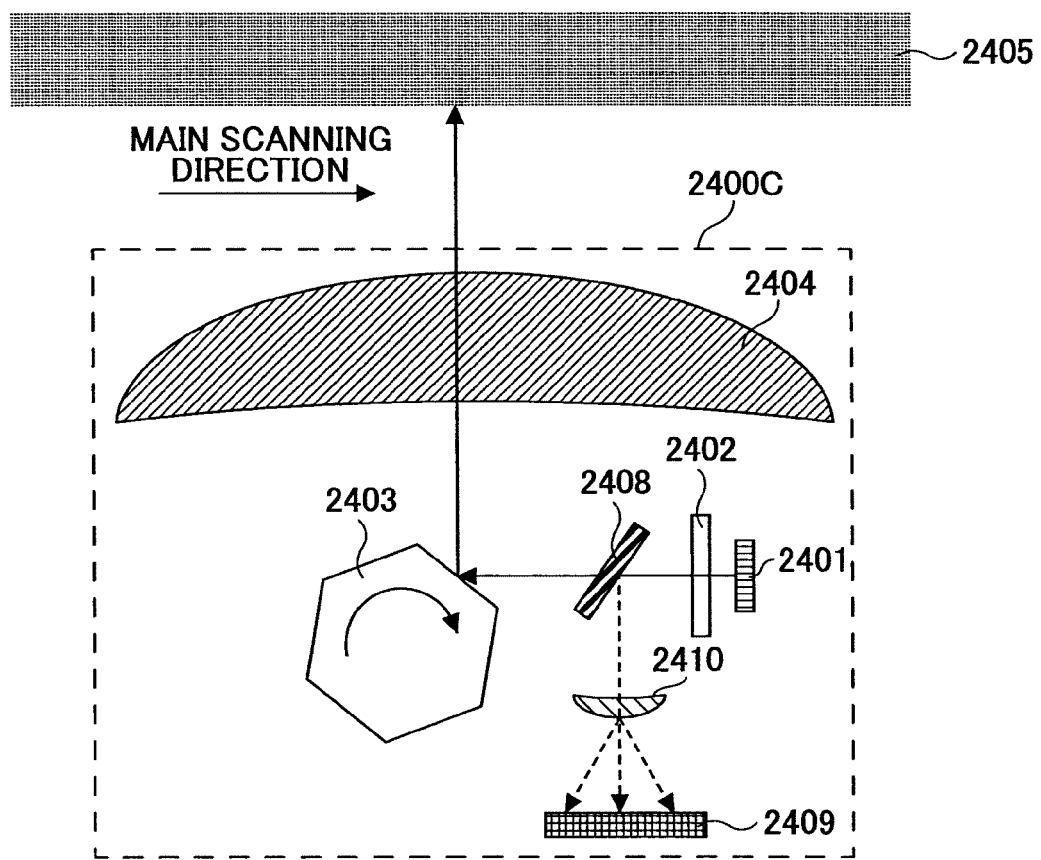
FIG. 52 is a schematic diagram showing an optical scanner according to a 22nd embodiment of the present invention.

FIG. 52 is a schematic diagram showing an optical scanner 2400C according to a 22$^{nd}$ embodiment of the present invention. Referring to FIG. 52, the optical scanner 2400C is the same as the optical scanner 2400B shown in FIG. 51 except that the optical scanner 2400C additionally includes a magnifier 2410 (magnifying part). The magnifier 2410 may be a magnifying lens.

The magnifier 2410 is disposed between the half mirror 2408 and the light-receiving element 2409. The magnifier 2410 magnifies multiple laser beams from the half mirror 2408 at a predetermined magnification and guides the magnified laser beams to the light-receiving element 2409.

Since the multiple laser beams emitted from the surface-emitting laser array 2401 are narrowly spaced, it is difficult to detect the laser beams by separating one light beam from another.

Accordingly, by guiding the multiple laser beams to the light-receiving element 2409 with their beam pitch being magnified by the magnifier 2410, it is possible to measure the outputs of the multiple laser beams with accuracy. As a result, currents injected into the multiple surface-emitting laser devices of the surface-emitting laser array 2401 can be controlled with accuracy based on the accurate measurements so that the outputs of the multiple laser beams are kept substantially the same, so that it is possible to form an image of uniform density on the photosensitive body 2405 with accuracy.

The magnifier 2410 may be added to the optical scanner 2400A shown in FIG. 50. In this case, the movement part 2407 moves the magnifier 2410 to the position a or b simultaneously with the light-receiving element 2406. Otherwise, the same description as for FIGS. 49 and 51 applies.

23$^{rd}$ Embodiment

Figure 53:
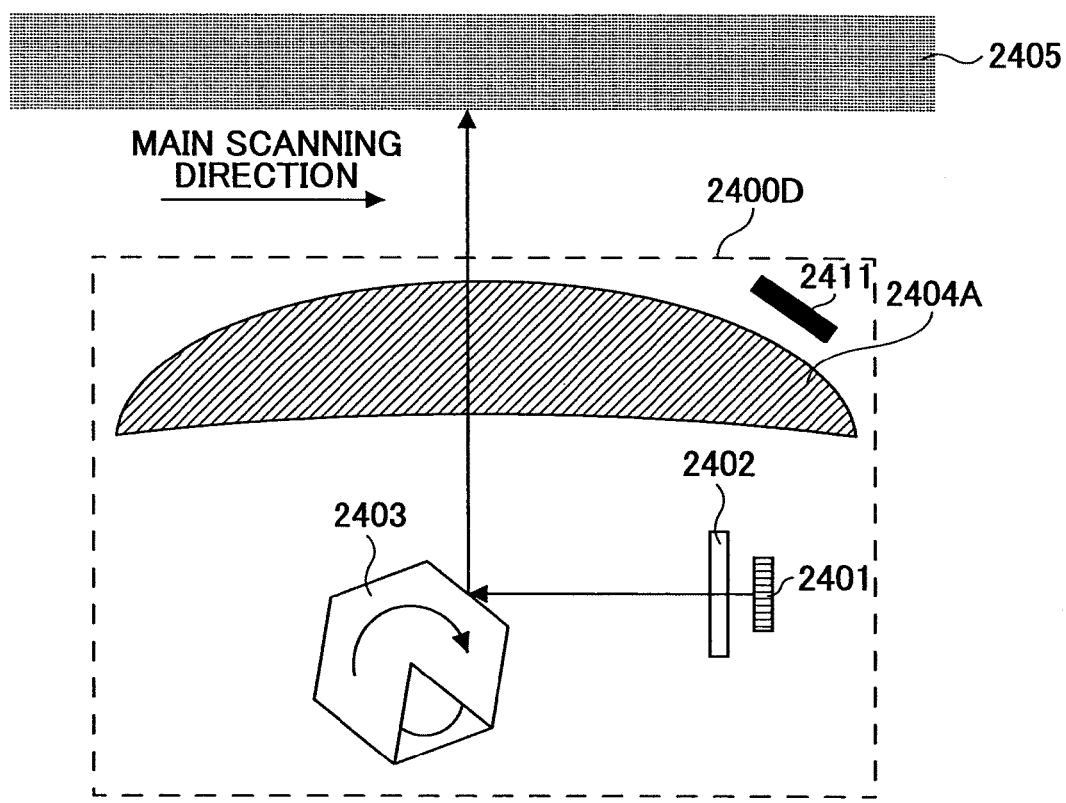
FIG. 53 is a schematic diagram showing an optical scanner according to a 23rd embodiment of the present invention.

FIG. 53 is a schematic diagram showing an optical scanner 2400D according to a 23$^{rd}$ embodiment of the present invention. Referring to FIG. 53, the optical scanner 2400D is the same as the optical scanner 2400 shown in FIG. 49 except that the optical scanner 2400D additionally includes a light-receiving element 2411.

The light-receiving element 2411 is disposed at a terminal end in the main scanning direction of laser light on the side of an exit surface 2404A (the exit surface 2404A side) of the fθ lens 2404.

In electrophotography, an image is formed by repeating the operation of performing main scanning by the polygon mirror 2403 in FIG. 53 and scanning the photosensitive body drum 2405 by a predetermined amount in the sub scanning direction after completion of the main scanning. Accordingly, main scanning and sub scanning are performed with predetermined timing. However, offsets caused by rotational irregularity of the polygon mirror 2403 may be accumulated during one image's worth of main scanning so as to prevent formation of a high-quality image.

According to the optical scanner 2400D, the light-receiving element 2411 for detecting scanning laser light is provided at the terminal end in the main scanning direction, and sub scanning is performed in synchronization with a signal indicating completion of two main scans. This makes it possible to prevent degradation of image quality due to rotational irregularity of the polygon mirror 2403, so that it is possible to record a high-quality image.

24$^{th}$ Embodiment

Figure 54:
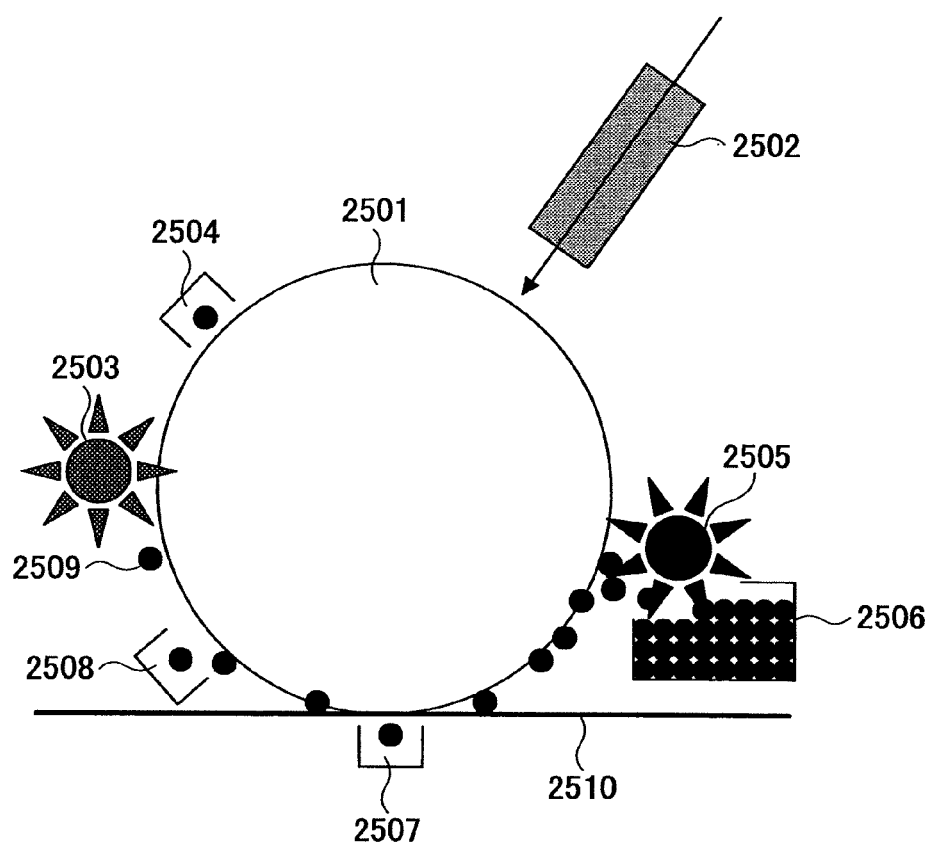
FIG. 54 is a schematic diagram showing an electrophotographic apparatus according to a 24th embodiment of the present invention.

FIG. 54 is a schematic diagram showing an electrophotographic apparatus according to a 24$^{th}$ embodiment of the present invention. Referring to FIG. 54, the electrophotographic apparatus 2500 includes a photosensitive body drum 2501, an optical scanner 2502, a cleaning unit 2503, a charging unit 2504, a development unit 2505, toner 2506, a transfer unit 2507, and a discharge unit 2508.

The optical scanner 2502, the cleaning unit 2503, the development unit 2505, the toner 2506, the transfer unit 2507, and the discharge unit 2508 are provided around the photosensitive body drum 2501.

The optical scanner 2502 is formed of the optical scanner 2400 shown in FIG. 49, and forms a latent image on the photosensitive body drum 2501 using multiple laser beams according to the above-described method. The cleaning unit 2503 removes toner 2509 remaining on the photosensitive body drum 2501.

The charging unit 2504 charges the surface of the photosensitive body drum 2501. The development unit 2505 guides the toner 2506 onto the surface of the photosensitive body drum 2501, and develops the latent image formed by the optical scanner 2502 with the toner 2506.

The transfer unit 2507 transfers a toner image. The discharge unit 2508 erases the latent image on the photosensitive body drum 2501.

When a series of operations starts in the electrophotographic apparatus 2500, the charging unit 2504 charges the surface of the photosensitive body drum 2501, and the optical scanner 2502 forms a latent image on the photosensitive body drum 2501 with multiple laser beams. The development unit 2505 develops the latent image formed by the optical scanner 2502 with the toner 2506, and the transfer unit 2507 transfers the toner image. Thereby, the toner image is transferred onto recording paper 2510. Thereafter, the toner image is subjected to heat fixing by a fixation unit (not graphically illustrated), so that an electrophotographic image is formed.

On the other hand, the discharge unit 2508 erases the latent image on the photosensitive body drum 2501, and the cleaning unit 2503 removes the toner 2509 remaining on the photosensitive body drum 2501. Thereby, the series of operations ends. By repeating the above-described operations, it is possible to successively output electrophotographic images at high speed.

In the electrophotographic apparatus 2500, the optical scanner 2502 may also be formed of any of the optical scanners 2400A, 2400B, 2400C, and 2400D.

The present invention may be applied to a surface-emitting laser device capable of having high output. The present invention may be applied to a surface-emitting laser array including a surface-emitting laser device capable of having high output. Further, the present invention may be applied to an image forming apparatus including a surface-emitting laser device capable of having high output. Further, the present invention may be applied to an optical pickup unit including a surface-emitting laser device capable of having high output or a surface-emitting laser array using the same. Further, the present invention may be applied to an optical transmitter module including a surface-emitting laser device capable of having high output or a surface-emitting laser array using the same. Further, the present invention may be applied to an optical transmitter receiver module including a surface-emitting laser device capable of having high output or a surface-emitting laser array using the same. Further, the present invention may be applied to an optical communication system including a surface-emitting laser device capable of having high output or a surface-emitting laser array using the same. Further, the present invention may be applied to an optical scanner including a surface-emitting laser array formed of surface-emitting laser devices capable of having high output. Further, the present invention may be applied to an electrophotographic apparatus using a surface-emitting laser array including surface-emitting laser devices capable of having high output.

According to one embodiment of the present invention, there is provided a surface-emitting laser device including a substrate connected to a heat sink; a first reflective layer formed of a semiconductor distributed Bragg reflector on the substrate; a first cavity spacer layer formed in contact with the first reflective layer; an active layer formed in contact with the first cavity spacer layer; a second cavity spacer layer formed in contact with the active layer; and a second reflective layer formed of a semiconductor distributed Bragg reflector in contact with the second cavity spacer layer, wherein the first cavity spacer layer includes a semiconductor material having a thermal conductivity greater than a thermal conductivity of a semiconductor material forming the second cavity spacer layer (Configuration 1).

Additionally, in the surface-emitting laser device as set forth in Configuration 1, the semiconductor material forming the first cavity spacer layer and the semiconductor material forming the second cavity spacer layer may be asymmetrical with respect to the active layer (Configuration 2).

Additionally, in the surface-emitting laser device as set forth in Configuration 1, the semiconductor material forming the second cavity spacer layer may include $(Al_dGa_{1-d})_fIn_{1-f}P$ ($0<d\leq1$, $0\leq f\leq1$) (Configuration 3).

Additionally, in the surface-emitting laser device as set forth in Configuration 3, the semiconductor material forming the first cavity spacer layer may have the thermal conductivity greater than the thermal conductivity of said $(Al_dGa_{1-d})_fIn_{1-f}P$ (Configuration 4).

Additionally, in the surface-emitting laser device as set forth in Configuration 4, the first cavity spacer layer may include $(Al_gGa_{1-g})_hIn_{1-h}P$ ($0\leq g\leq1$, $0\leq h\leq1$) having a band gap smaller than a band gap of said $(Al_dGa_{1-d})_fIn_{1-f}P$ (Configuration 5).

Additionally, in the surface-emitting laser device as set forth in Configuration 1, the first cavity spacer layer may include $Al_zGa_{1-z}As$ ($0\leq z\leq1$) (Configuration 6).

Additionally, in the surface-emitting laser device as set forth in Configuration 1, the first cavity spacer layer may include a first spacer layer formed in contact with the first reflective layer and having a first thermal conductivity; and a second spacer layer formed in contact with the first spacer layer and the active layer and having a second thermal conductivity smaller than the first thermal conductivity (Configuration 7).

Additionally, in the surface-emitting laser device as set forth in Configuration 1, a thermal conductivity of one of semiconductor materials of the first reflective layer which one is disposed closest to the active layer may be greater than a thermal conductivity of one of semiconductor materials of the second reflective layer which one is disposed closest to the active layer (Configuration 8).

Additionally, in the surface-emitting laser device as set forth in Configuration 1, the first reflective layer may include at least a layer formed of $Al_xGa_{1-x}As$ ($0<x\leq1$); and the second reflective layer may include a layer formed of $(Al_dGa_{1-d})_fIn_{1-f}P$ ($0<d\leq1$, $0\leq f\leq1$) and disposed at a symmetric position of the layer formed of said $Al_xGa_{1-x}As$ with respect to the active layer (Configuration 9).

Additionally, in the surface-emitting laser device as set forth in Configuration 9, $Al_xGa_{1-x}As$ may be AlAs (Configuration 10)

Additionally, in the surface-emitting laser device as set forth in Configuration 1, the first reflective layer may include multiple low refractive index layers each formed of AlAs (Configuration 11).

Additionally, in the surface-emitting laser device as set forth in Configuration 1, the second reflective layer may include a current confinement part; and the first reflective layer may include a first reflective part formed in contact with the substrate and including a low refractive index layer formed of AlAs; and a second reflective part formed on an active layer side of the first reflective part and including a low refractive index layer formed of $Al_jGa_{1-j}As$ (0<j<1) (Configuration 12).

According to one embodiment of the present invention, there is provided a surface-emitting laser array including multiple surface-emitting laser devices, wherein each of the surface-emitting laser devices is formed of the surface-emitting laser device as set forth in Configuration 1 (Configuration 13).

According to one embodiment of the present invention, there is provided an image forming apparatus including a surface-emitting laser array as a light source for writing, the surface-emitting laser array including multiple surface-emitting laser devices, wherein each of the surface-emitting laser devices is formed of the surface-emitting laser device as set forth in Configuration 1 (Configuration 14).

According to one embodiment of the present invention, there is provided an optical pickup unit including the surface-emitting laser device as set forth in Configuration 1 as a light source (Configuration 15).

According to one embodiment of the present invention, there is provided an optical pickup unit including a surface-emitting laser array as a light source, the surface-emitting laser array including multiple surface-emitting laser devices, wherein each of the surface-emitting laser devices is formed of the surface-emitting laser device as set forth in Configuration 1 (Configuration 16).

According to one embodiment of the present invention, there is provided an optical transmitter module including the surface-emitting laser device as set forth in Configuration 1 as a light source (Configuration 17).

According to one embodiment of the present invention, there is provided an optical transmitter module including a surface-emitting laser array as a light source, the surface-emitting laser array including multiple surface-emitting laser devices, wherein each of the surface-emitting laser devices is formed of the surface-emitting laser device as set forth in Configuration 1 (Configuration 18).

According to one embodiment of the present invention, there is provided an optical transmitter receiver module including the surface-emitting laser device as set forth in Configuration 1 as a light source (Configuration 19).

According to one embodiment of the present invention, there is provided an optical transmitter receiver module including a surface-emitting laser array as a light source, the surface-emitting laser array including multiple surface-emitting laser devices, wherein each of the surface-emitting laser devices is formed of the surface-emitting laser device as set forth in Configuration 1 (Configuration 20).

According to one embodiment of the present invention, there is provided an optical communication system including the surface-emitting laser device as set forth in Configuration 1 as a light source (Configuration 21).

According to one embodiment of the present invention, there is provided an optical communication system including a surface-emitting laser array as a light source, the surface-emitting laser array including multiple surface-emitting laser devices, wherein each of the surface-emitting laser devices is formed of the surface-emitting laser device as set forth in Configuration 1 (Configuration 22).

According to one embodiment of the present invention, there is provided a surface-emitting laser device including a substrate connected to a heat sink; a first reflective layer formed of a semiconductor distributed Bragg reflector on the substrate; a first cavity spacer layer formed in contact with the first reflective layer; an active layer formed in contact with the first cavity spacer layer; a second cavity spacer layer formed in contact with the active layer; and a second reflective layer formed of a semiconductor distributed Bragg reflector in contact with the second cavity spacer layer, wherein the active layer includes a well layer formed of $Ga_aIn_{1-a}P_bAs_{1-b}$ (0≦a≦1, 0≦b≦1); and a barrier layer formed of $(Ga_cIn_{1-c})_dP_{1-d}As$ (0≦c≦1, 0≦d≦1) having a band gap greater than a band gap of the well layer; the first reflective layer includes multiple low refractive index layers formed of $Al_xGa_{1-x}As$ (0<x≦1); and multiple high refractive index layers formed of $Al_yGa_{1-y}As$ (0<y<x≦1); a part of at least one of the first and second cavity spacer layers is formed of AlGaInP; one of the low refractive index layers forming the second reflective layer which one is disposed closest to the active layer is formed of $(Al_eGa_{1-e})_fIn_{1-f}P$ (0<e≦1, 0≦f≦1); and one of the low refractive index layers forming the first reflective layer which one is disposed closest to the active layer is formed of $Al_xGa_{1-x}As$ (0<x≦1) having a thermal conductivity greater than the thermal conductivity of $(Al_eGa_{1-e})_fIn_{1-f}P$ (Configuration 23).

Additionally, in the surface-emitting laser device as set forth in Configuration 23, each of the low refractive index layers included in the first reflective layer may include AlAs (Configuration 24).

Additionally, in the surface-emitting laser device as set forth in Configuration 23, the second reflective layer may include a current confinement part; and the first reflective layer may include a first reflective part formed in contact with the substrate and including one of the low refractive index layers which one is formed of AlAs; and a second reflective part formed on an active layer side of the first reflective part and including one of the low refractive index layers which one is formed of $Al_jGa_{1-j}As$ (0<j<1) (Configuration 25).

According to one embodiment of the present invention, there is provided a surface-emitting laser array including multiple surface-emitting laser devices, wherein each of the surface-emitting laser devices is formed of the surface-emitting laser device as set forth in Configuration 23 (Configuration 26).

According to one embodiment of the present invention, there is provided an image forming apparatus including a surface-emitting laser array as a light source for writing, the surface-emitting laser array including multiple surface-emitting laser devices, wherein each of the surface-emitting laser devices is formed of the surface-emitting laser device as set forth in Configuration 23 (Configuration 27).

According to one embodiment of the present invention, there is provided an optical pickup unit including the surface-emitting laser device as set forth in Configuration 23 as a light source (Configuration 28).

According to one embodiment of the present invention, there is provided an optical pickup unit including a surface-emitting laser array as a light source, the surface-emitting laser array including multiple surface-emitting laser devices, wherein each of the surface-emitting laser devices is formed of the surface-emitting laser device as set forth in Configuration 23 (Configuration 29).

According to one embodiment of the present invention, there is provided an optical transmitter module including the surface-emitting laser device as set forth in Configuration 23 as a light source (Configuration 30).

According to one embodiment of the present invention, there is provided an optical transmitter module including a surface-emitting laser array as a light source, the surface-emitting laser array including multiple surface-emitting laser devices, wherein each of the surface-emitting laser devices is formed of the surface-emitting laser device as set forth in Configuration 23 (Configuration 31).

According to one embodiment of the present invention, there is provided an optical transmitter receiver module including the surface-emitting laser device as set forth in Configuration 23 as a light source (Configuration 32).

According to one embodiment of the present invention, there is provided an optical transmitter receiver module including a surface-emitting laser array as a light source, the surface-emitting laser array including multiple surface-emitting laser devices, wherein each of the surface-emitting laser devices is formed of the surface-emitting laser device as set forth in Configuration 23 (Configuration 33).

According to one embodiment of the present invention, there is provided an optical communication system including the surface-emitting laser device as set forth in Configuration 23 as a light source (Configuration 34).

According to one embodiment of the present invention, there is provided an optical communication system including a surface-emitting laser array as a light source, the surface-emitting laser array including multiple surface-emitting laser devices, wherein each of the surface-emitting laser devices is formed of the surface-emitting laser device as set forth in Configuration 23 (Configuration 35).

According to one embodiment of the present invention, there is provided a surface-emitting laser device including a substrate connected to a heat sink; a first reflective layer formed of a semiconductor distributed Bragg reflector on the substrate; a first cavity spacer layer formed in contact with the first reflective layer; an active layer formed in contact with the first cavity spacer layer; a second cavity spacer layer formed in contact with the active layer; and a second reflective layer formed of a semiconductor distributed Bragg reflector in contact with the second cavity spacer layer, wherein the active layer includes a well layer formed of $Ga_aIn_{1-a}P_bAs_{1-b}$ ($0 \leq a \leq 1$, $0 \leq b \leq 1$); and a barrier layer formed of $(Ga_cIn_{1-c})_d P_{1-d}As$ ($0 \leq c \leq 1$, $0 \leq d \leq 1$) having a band gap greater than a band gap of the well layer; the first reflective layer includes multiple low refractive index layers formed of $Al_xGa_{1-x}As$ ($0 < x \leq 1$); and multiple high refractive index layers formed of $Al_yGa_{1-y}As$ ($0 \leq y < x \leq 1$); a part of the second cavity spacer layer is formed of $(Al_eGa_{1-e})_fIn_{1-f}P$ ($0 < e \leq 1$, $0 \leq f \leq 1$); and the first cavity spacer layer includes a semiconductor material at a symmetric position of a position at which the second cavity spacer layer includes $(Al_eGa_{1-e})_fIn_{1-f}P$ with respect to the active layer, the semiconductor material having a thermal conductivity greater than the thermal conductivity of $(Al_eGa_{1-e})_fIn_{1-f}P$ (Configuration 36).

Additionally, in the surface-emitting laser device as set forth in Configuration 36, each of the low refractive index layers included in the first reflective layer may include AlAs (Configuration 37).

Additionally, in the surface-emitting laser device as set forth in Configuration 36, the second reflective layer may include a current confinement part; and the first reflective layer may include a first reflective part formed in contact with the substrate and including one of the low refractive index layers which one is formed of AlAs; and a second reflective part formed on an active layer side of the first reflective part and including one of the low refractive index layers which one is formed of $Al_jGa_{1-j}As$ ($0 < j < 1$) (Configuration 38).

According to one embodiment of the present invention, there is provided a surface-emitting laser array including multiple surface-emitting laser devices, wherein each of the surface-emitting laser devices is formed of the surface-emitting laser device as set forth in Configuration 36 (Configuration 39).

According to one embodiment of the present invention, there is provided an image forming apparatus including a surface-emitting laser array as a light source for writing, the surface-emitting laser array including multiple surface-emitting laser devices, wherein each of the surface-emitting laser devices is formed of the surface-emitting laser device as set forth in Configuration 36 (Configuration 40).

According to one embodiment of the present invention, there is provided an optical pickup unit including the surface-emitting laser device as set forth in Configuration 36 as a light source (Configuration 41).

According to one embodiment of the present invention, there is provided an optical pickup unit including a surface-emitting laser array as a light source, the surface-emitting laser array including multiple surface-emitting laser devices, wherein each of the surface-emitting laser devices is formed of the surface-emitting laser device as set forth in Configuration 36 (Configuration 42).

According to one embodiment of the present invention, there is provided an optical transmitter module including the surface-emitting laser device as set forth in Configuration 36 as a light source (Configuration 43).

According to one embodiment of the present invention, there is provided an optical transmitter module including a surface-emitting laser array as a light source, the surface-emitting laser array including multiple surface-emitting laser devices, wherein each of the surface-emitting laser devices is formed of the surface-emitting laser device as set forth in Configuration 36 (Configuration 44).

According to one embodiment of the present invention, there is provided an optical transmitter receiver module including the surface-emitting laser device as set forth in Configuration 36 as a light source (Configuration 45).

According to one embodiment of the present invention, there is provided an optical transmitter receiver module including a surface-emitting laser array as a light source, the surface-emitting laser array including multiple surface-emitting laser devices, wherein each of the surface-emitting laser devices is formed of the surface-emitting laser device as set forth in Configuration 36 (Configuration 46).

According to one embodiment of the present invention, there is provided an optical communication system including the surface-emitting laser device as set forth in Configuration 36 as a light source (Configuration 47).

According to one embodiment of the present invention, there is provided an optical communication system including a surface-emitting laser array as a light source, the surface-emitting laser array including multiple surface-emitting laser devices, wherein each of the surface-emitting laser devices is formed of the surface-emitting laser device as set forth in Configuration 36 (Configuration 48).

According to one embodiment of the present invention, there is provided a surface-emitting laser device including a substrate connected to a heat sink; a first reflective layer formed of a semiconductor distributed Bragg reflector on the substrate; a first cavity spacer layer formed in contact with the first reflective layer; an active layer formed in contact with the first cavity spacer layer; a second cavity spacer layer formed in contact with the active layer; and a second reflective layer formed of a semiconductor distributed Bragg reflector in contact with the second cavity spacer layer, wherein the first reflective layer includes multiple low refractive index layers and the second reflective layer includes multiple low refractive index layers; and the thermal conductivity of the semiconductor material of one of the low refractive index layers of the first reflective layer which one is disposed closest to the active layer is greater than the thermal conductivity of the semiconductor material of one of the low refractive index layers of the second reflective layer which one is disposed closest to the active layer (Configuration 49).

Additionally, in the surface-emitting laser device as set forth in Configuration 49, the one of the low refractive index layers of the second reflective layer which one is disposed closest to the active layer may include $(Al_eGa_{1-e})_fIn_{1-f}P$ ($0<e\leq1$, $0\leq f\leq1$); and the one of the low refractive index layers of the first reflective layer which one is disposed closest to the active layer may include $Al_xGa_{1-x}As$ ($0<x\leq1$) having the thermal conductivity greater than the thermal conductivity of said $(Al_eGa_{1-e})_fIn_{1-f}P$ (Configuration 50).

Additionally, in the surface-emitting laser device as set forth in Configuration 50, $Al_xGa_{1-x}As$ may be AlAs (Configuration 51).

Additionally, in the surface-emitting laser device as set forth in Configuration 49, a part of at least one of the first and second cavity spacer layers may be formed of AlGaInP (Configuration 52).

According to one embodiment of the present invention, there is provided a surface-emitting laser array including multiple surface-emitting laser devices, wherein each of the surface-emitting laser devices is formed of the surface-emitting laser device as set forth in Configuration 49 (Configuration 53).

According to one embodiment of the present invention, there is provided an image forming apparatus including a surface-emitting laser array as a light source for writing, the surface-emitting laser array including multiple surface-emitting laser devices, wherein each of the surface-emitting laser devices is formed of the surface-emitting laser device as set forth in Configuration 49 (Configuration 54).

According to one embodiment of the present invention, there is provided an optical pickup unit including the surface-emitting laser device as set forth in Configuration 49 as a light source (Configuration 55).

According to one embodiment of the present invention, there is provided an optical pickup unit including a surface-emitting laser array as a light source, the surface-emitting laser array including multiple surface-emitting laser devices, wherein each of the surface-emitting laser devices is formed of the surface-emitting laser device as set forth in Configuration 49 (Configuration 56).

According to one embodiment of the present invention, there is provided an optical transmitter module including the surface-emitting laser device as set forth in Configuration 49 as a light source (Configuration 57).

According to one embodiment of the present invention, there is provided an optical transmitter module including a surface-emitting laser array as a light source, the surface-emitting laser array including multiple surface-emitting laser devices, wherein each of the surface-emitting laser devices is formed of the surface-emitting laser device as set forth in Configuration 49 (Configuration 58).

According to one embodiment of the present invention, there is provided an optical transmitter receiver module including the surface-emitting laser device as set forth in Configuration 49 as a light source (Configuration 59).

According to one embodiment of the present invention, there is provided an optical transmitter receiver module including a surface-emitting laser array as a light source, the surface-emitting laser array including multiple surface-emitting laser devices, wherein each of the surface-emitting laser devices is formed of the surface-emitting laser device as set forth in Configuration 49 (Configuration 60).

According to one embodiment of the present invention, there is provided an optical communication system including the surface-emitting laser device as set forth in Configuration 49 as a light source (Configuration 61).

According to one embodiment of the present invention, there is provided an optical communication system including a surface-emitting laser array as a light source, the surface-emitting laser array including multiple surface-emitting laser devices, wherein each of the surface-emitting laser devices is formed of the surface-emitting laser device as set forth in Configuration 49 (Configuration 62).

Thus, according to one aspect of the present invention, in a surface-emitting laser device, a cavity spacer layer and/or a reflective layer disposed on the substrate side of an active layer is formed of a semiconductor material higher in thermal conductivity than the semiconductor materials of a cavity spacer layer and a reflective layer disposed on the light output side of the active layer. Accordingly, heat generated in the active layer is transferred to the substrate, so that an increase in the temperature of the active layer is suppressed.

Accordingly, the temperature characteristics of the surface-emitting laser device are improved so that the surface-emitting laser device can have high output.

According to one embodiment of the present invention, there is provided a surface-emitting laser array including a surface-emitting laser device according to the present invention.

Since the surface-emitting laser array includes one or more surface-emitting laser devices according to the present invention, it is possible to reduce the intervals at which the surface-emitting laser devices are disposed, so that it is possible to dispose the surface-emitting laser devices at high density.

According to one embodiment of the present invention, there is provided an image forming apparatus including a surface-emitting laser array as a light source for writing, the surface-emitting laser array including multiple surface-emitting laser devices according to the present invention.

Since the image forming apparatus includes surface-emitting laser devices or a surface-emitting laser array according to the present invention, the image forming apparatus can perform writing onto a photosensitive body with an increased number of surface-emitting laser devices. That is, the image forming apparatus can perform writing onto a photosensitive body with increased dot density.

According to one embodiment of the present invention, there is provided an optical pickup unit including a surface-emitting laser device or a surface-emitting laser array according to the present invention as a light source.

Since the optical pickup unit includes one or more surface-emitting laser devices or a surface-emitting laser array according to the present invention as a light source, the optical pickup unit can record information on or reproduce information from an optical disk with multiple laser beams.

According to one embodiment of the present invention, there is provided an optical transmitter module including a surface-emitting laser device or a surface-emitting laser array according to the present invention as a light source.

Since the optical transmitter module includes one or more surface-emitting laser devices or a surface-emitting laser array according to the present invention as a light source, the optical transmitter module can transmit a signal with multiple laser beams. That is, the optical transmitter module can transmit a signal at high transmission rate.

According to one embodiment of the present invention, there is provided an optical transmitter receiver module including a surface-emitting laser device or a surface-emitting laser array according to the present invention as a light source.

Since the optical transmitter receiver module includes one or more surface-emitting laser devices or a surface-emitting laser array according to the present invention as a light source, the optical transmitter receiver module can communicate a signal with multiple laser beams. That is, the optical transmitter receiver module can communicate a signal at high rate.

According to one embodiment of the present invention, there is provided an optical communication system including a surface-emitting laser device or a surface-emitting laser array according to the present invention as a light source.

Since the optical communication system includes one or more surface-emitting laser devices or a surface-emitting laser array according to the present invention as a light source, it is possible to increase the speed of the entire system.

According to one embodiment of the present invention, there is provided a surface-emitting laser device including a first reflective layer formed of a semiconductor distributed Bragg reflector on a substrate; a second reflective layer formed in contact with the first reflective layer; a cavity including an active layer, the cavity being formed in contact with the second reflective layer; a third reflective layer formed in contact with the cavity; and a fourth reflective layer formed in contact with the third reflective layer, wherein the cavity is formed of an AlGaInPAs-system material; the second reflective layer includes a layered body of N first high refractive index layers and N first low refractive index layers that are alternately stacked, where N is a positive integer; the third reflective layer includes a layered body of M second high refractive index layers and M second low refractive index layers that are alternately stacked, where M is a positive integer; each of the N first low refractive index layers and the M second low refractive index layers is formed of $(Al_xGa_{1-x})_{0.5}In_{0.5}P$ ($0 \leq x \leq 1$); each of the N first high refractive index layers and the M second high refractive index layers is formed of $(Al_yGa_{1-y})_{0.5}In_{0.5}P$ ($0 \leq y < x \leq 1$); one of the N first low refractive index layers is in contact with the cavity, and one of the N first high refractive index layers is in contact with an AlGaAs-system material forming the first reflective layer; and one of the M second low refractive index layers is in contact with the cavity, and one of the M second high refractive index layers is in contact with an AlGaAs-system material forming the fourth reflective layer (Configuration 63).

Additionally, in the surface-emitting laser device as set forth in Configuration 63, the second reflective layer may further include a first intermediate layer provided between one of the N first low refractive index layers and a corresponding one of the N first high refractive index layers, the first intermediate layer having a band gap between the band gap of the N first low refractive index layers and the band gap of the N first high refractive index layers; and the third reflective layer may further include a second intermediate layer provided between one of the M second low refractive index layers and a corresponding one of the M second high refractive index layers, the second intermediate layer having a band gap between the band gap of the M second low refractive index layers and the band gap of the M second high refractive index layers (Configuration 64).

Additionally, in the surface-emitting laser device as set forth in Configuration 64, each of the first and second inter-mediate layers may include multiple semiconductor materials changing stepwise in band gap (Configuration 65).

Additionally, in the surface-emitting laser device as set forth in Configuration 63, the second reflective layer may further include a third intermediate layer formed in contact with the cavity, the third intermediate layer having a band gap between the band gap of the cavity and the band gap of the n first low refractive index layers; and the third reflective layer may further include a fourth intermediate layer formed in contact with the cavity, the fourth intermediate layer having a band gap between the band gap of the cavity and the band gap of the M second low refractive index layers (Configuration 66).

Additionally, in the surface-emitting laser device as set forth in Configuration 67, each of the third and fourth intermediate layers may include multiple semiconductor materials changing stepwise in band gap (Configuration 67).

Additionally, in the surface-emitting laser device as set forth in Configuration 63, the first reflective layer may have an AlAs layer in contact with the second reflective layer (Configuration 68).

Additionally, in the surface-emitting laser device as set forth in Configuration 68, the AlAs layer may have a thickness greater than or equal to the quotient of a resonant wavelength divided by four times the refractive index of AlAs with respect to light of the resonant wavelength (Configuration 69).

According to one embodiment of the present invention, there is provided a surface-emitting laser array including multiple surface-emitting laser devices each being formed of the surface-emitting laser device as set forth in Configuration 63, wherein the surface-emitting laser devices are disposed at corresponding intersection points of multiple equally spaced first baselines and multiple equally spaced second baselines, the second baselines each forming a predetermined angle with the first baselines (Configuration 70).

According to one embodiment of the present invention, there is provided an optical scanner including a surface-emitting laser array including multiple surface-emitting laser devices each being formed of the surface-emitting laser device as set forth in Configuration 63, wherein the surface-emitting laser devices are disposed at corresponding intersection points of multiple equally spaced first baselines and a plurality of equally spaced second baselines, the second baselines each forming a predetermined angle with the first baselines; a light-receiving part configured to receive laser light emitted from the surface-emitting laser array; and a movement part configured to move the light-receiving part onto an optical axis of the emitted laser light at a time other than a time of image recording (Configuration 71).

Additionally, the optical scanner as set forth in Configuration 71 may further include a magnifying part configured to magnify the laser light and guide the magnified laser light to the light-receiving part (Configuration 72).

Additionally, the optical scanner as set forth in Configuration 71 may further include an additional light-receiving element disposed at a terminal end of scanning by the laser light (Configuration 73).

According to one embodiment of the present invention, there is provided an optical scanner including a surface-emitting laser array including multiple surface-emitting laser devices each being formed of the surface-emitting laser device as set forth in Configuration 63, wherein the surface-emitting laser devices are disposed at corresponding intersection points of multiple equally spaced first baselines and multiple equally spaced second baselines, the second baselines each forming a predetermined angle with the first baselines; a light-receiving part configured to receive a part of laser light emitted from the surface-emitting laser array; and a light guide part configured to guide the part of the emitted laser light to the light-receiving part (Configuration 74).

Additionally, the optical scanner as set forth in Configuration 74 may further include a magnifying part configured to magnify the part of the laser light and guide the magnified part of the laser light to the light-receiving part (Configuration 75).

Additionally, in the optical scanner as set forth in Configuration 74, the light-receiving part may be disposed at a terminal end of scanning by the part of the laser light (Configuration 76).

According to one embodiment of the present invention, there is provided an electrophotographic apparatus including an optical scanner, the optical scanner including a surface-emitting laser array including multiple surface-emitting laser devices each being formed of the surface-emitting laser device as set forth in Configuration 63, wherein the surface-emitting laser devices are disposed at corresponding intersection points of multiple equally spaced first baselines and multiple equally spaced second baselines, the second baselines each forming a predetermined angle with the first baselines; a light-receiving part configured to receive laser light emitted from the surface-emitting laser array; and a movement part configured to move the light-receiving part onto an optical axis of the emitted laser light at a time other than a time of image recording (Configuration 77).

According to one embodiment of the present invention, there is provided an electrophotographic apparatus including an optical scanner, the optical scanner including a surface-emitting laser array including multiple surface-emitting laser devices each being formed of the surface-emitting laser device as set forth in Configuration 63, wherein the surface-emitting laser devices are disposed at corresponding intersection points of multiple equally spaced first baselines and multiple equally spaced second baselines, the second baselines each forming a predetermined angle with the first baselines; a light-receiving part configured to receive a part of laser light emitted from the surface-emitting laser array; and a light guide part configured to guide the part of the emitted laser light to the light-receiving part (Configuration 78).

According to one embodiment of the present invention, there is provided a surface-emitting laser device including a first reflective layer stacked on a substrate; a cavity stacked on the first reflective layer, the cavity being formed of an AlGaInPAs-system material; a second reflective layer stacked on the cavity, the second reflective layer including a layered body of N stacked pairs of a high refractive index layer and a low refractive index layer, where N is a positive integer; and a third reflective layer stacked on the second reflective layer, the third reflective layer including a layer formed of an AlGaAs-system material, wherein the N low refractive index layers are formed of $(Al_xGa_{1-x})_{0.5}In_{0.5}P$ ($0 \leq x \leq 1$), the N high refractive index layers are formed of $(Al_yGa_{1-y})_{0.5}In_{0.5}P$ ($0 \leq y < x \leq 1$), and the layered body has one of the N high refractive index layers thereof in contact with the layer of the third reflective layer formed of the AlGaAs-system material (Configuration 79).

Additionally, in the surface-emitting laser device as set forth in Configuration 79, the second reflective layer may further include an intermediate layer provided between one of the N low refractive index layers and a corresponding one of the N high refractive index layers, the intermediate layer having a band gap between the band gap of the N low refractive index layers and the band gap of the N high refractive index layers (Configuration 80).

Additionally, in the surface-emitting laser device as set forth in Configuration 80, the intermediate layer may include multiple semiconductor layers changing stepwise in band gap (Configuration 81).

Additionally, in the surface-emitting laser device as set forth in Configuration 79, the second reflective layer may further include a joining layer having a band gap between the band gap of the cavity and the band gap of the N low refractive index layers, and the second reflective layer may be in contact with the cavity through the joining layer (Configuration 82).

Additionally, in the surface-emitting laser device as set forth in Configuration 82, the joining layer may include multiple semiconductor layers changing stepwise in band gap (Configuration 83).

Additionally, in the surface-emitting laser device as set forth in Configuration 79, wherein the first reflective layer may include an AlAs layer in contact with the cavity (Configuration 84).

Additionally, in the surface-emitting laser device as set forth in Configuration 84, the AlAs layer may have a thickness greater than or equal to the quotient of a resonant wavelength divided by four times the refractive index of AlAs with respect to light of the resonant wavelength (Configuration 85).

According to one embodiment of the present invention, there is provided a surface-emitting laser array including multiple surface-emitting laser devices each being formed of the surface-emitting laser device as set forth in Configuration 79, wherein the surface-emitting laser devices are disposed at corresponding intersection points of multiple equally spaced first baselines and multiple equally spaced second baselines, the second baselines each forming a predetermined angle with the first baselines (Configuration 86).

According to one embodiment of the present invention, there is provided an optical scanner including a surface-emitting laser array including multiple surface-emitting laser devices each being formed of the surface-emitting laser device as set forth in Configuration 79, wherein the surface-emitting laser devices are disposed at corresponding intersection points of multiple equally spaced first baselines and multiple equally spaced second baselines, the second baselines each forming a predetermined angle with the first baselines; a light-receiving part configured to receive laser light emitted from the surface-emitting laser array; and a movement part configured to move the light-receiving part onto an optical axis of the emitted laser light at a time other than a time of image recording (Configuration 87).

Additionally, the optical scanner as set forth in Configuration 87 may further include a magnifying part configured to magnify the laser light and guide the magnified laser light to the light-receiving part (Configuration 88).

Additionally, the optical scanner as set forth in Configuration 87 may further include an additional light-receiving element disposed at a terminal end of scanning by the laser light (Configuration 89).

According to one embodiment of the present invention, there is provided an optical scanner including a surface-emitting laser array including multiple surface-emitting laser devices each being formed of the surface-emitting laser device as set forth in Configuration 79, wherein the surface-emitting laser devices are disposed at corresponding intersection points of multiple equally spaced first baselines and multiple equally spaced second baselines, the second baselines each forming a predetermined angle with the first baselines; a light-receiving part configured to receive a part of laser light emitted from the surface-emitting laser array; and a light guide part configured to guide the part of the emitted laser light to the light-receiving part (Configuration 90).

Additionally, the optical scanner as set forth in Configuration 90 may further include a magnifying part configured to magnify the part of the laser light and guide the magnified part of the laser light to the light-receiving part (Configuration 91).

Additionally, in the optical scanner as set forth in Configuration 90, the light-receiving part may be disposed at a terminal end of scanning by the part of the laser light (Configuration 92).

According to one embodiment of the present invention, there is provided an electrophotographic apparatus including an optical scanner, the optical scanner including a surface-emitting laser array including multiple surface-emitting laser devices each being formed of the surface-emitting laser device as set forth in Configuration 79, wherein the surface-emitting laser devices are disposed at corresponding intersection points of multiple equally spaced first baselines and multiple equally spaced second baselines, the second baselines each forming a predetermined angle with the first baselines; a light-receiving part configured to receive laser light emitted from the surface-emitting laser array; and a movement part configured to move the light-receiving part onto an optical axis of the emitted laser light at a time other than a time of image recording (Configuration 93).

According to one embodiment of the present invention, there is provided an electrophotographic apparatus including an optical scanner, the optical scanner including a surface-emitting laser array including multiple surface-emitting laser devices each being formed of the surface-emitting laser device as set forth in Configuration 79, wherein the surface-emitting laser devices are disposed at corresponding intersection points of multiple equally spaced first baselines and multiple equally spaced second baselines, the second baselines each forming a predetermined angle with the first baselines; a light-receiving part configured to receive a part of laser light emitted from the surface-emitting laser array; and a light guide part configured to guide the part of the emitted laser light to the light-receiving part (Configuration 94).

In a surface-emitting laser device according to one embodiment of the present invention, the low refractive index layers of reflective layers formed in contact with a cavity are formed of $(Al_xGa_{1-x})_{0.5}In_{0.5}P$ ($0 \leq x \leq 1$), the high refractive index layers of the reflective layers formed in contact with the cavity are formed of $(Al_yGa_{1-y})_{0.5}In_{0.5}P$ ($0 \leq y < x \leq 1$), and the cavity is formed of an AlGaInPAs-system material. As a result, it is possible to confine carriers in an active layer, and to reduce the resistances of the reflective layers formed in contact with the cavity. Accordingly, the surface-emitting laser device can have high output.

The present invention is not limited to the specifically disclosed embodiments, and variations and modifications may be made without departing from the scope of the present invention.

The invention claimed is:

1. A surface-emitting laser device, comprising:
   a first reflective layer formed of a semiconductor distributed Bragg reflector on a substrate;
   a first cavity spacer layer formed in contact with the first reflective layer;
   an active layer formed in contact with the first cavity spacer layer;
   a second cavity spacer layer formed in contact with the active layer; and
   a second reflective layer formed of a semiconductor distributed Bragg reflector in contact with the second cavity spacer layer
   wherein the first reflective layer includes a plurality of low refractive index layers and the second reflective layer includes a first part formed of an AlGaInP-based material in contact with the second cavity spacer layer and a second part formed of an AlGaAs-based material in contact with the first part, the first part including one or more low refractive index layers; and
   a thermal conductivity of a semiconductor material of one of the low refractive index layers of the first reflective layer which one is disposed closest to the active layer is greater than a thermal conductivity of a semiconductor material of one of the one or more low refractive index layers of the second reflective layer which one is disposed closest to the active layer; wherein:
   the one of the one or more low refractive index layers of the second reflective layer which one is disposed closest to the active layer includes $(Al_eGa_{1-e})_fIn_{1-f}P$ ($0 < e \leq 1$, $0 \leq f \leq 1$);
   the one of the one or more low refractive index layers of the first reflective layer which one is disposed closest to the active layer includes $Al_xGa_{1-x}As$ ($0 < x \leq 1$) having the thermal conductivity greater than the thermal conductivity of said $(Al_eGa_{1-e})_fIn_{1-f}P$; and
   the substrate is connected to a heat sink.

2. The surface-emitting laser device as claimed in claim 1, wherein said $Al_xGa_{1-x}As$ is AlAs.

3. The surface-emitting laser device as claimed in claim 1, wherein a part of at least one of the first and second cavity spacer layers is formed of AlGaInP.

4. The surface-emitting laser device as claimed in claim 1, wherein:
   the active layer includes
   a well layer formed of $Ga_aIn_{1-a}P_bAs_{1-b}$, ($0 \leq a \leq 1$, $0 \leq b \leq 1$); and
   a barrier layer formed of $(Ga_cIn_{1-c})_dP_{1-d}As$ ($0 \leq c \leq 1$, $0 \leq d \leq 1$) having a band gap greater than a band gap of the well layer;
   the plurality of low refractive index layers of the first reflective layer are formed of $Al_xGa_{1-x}As$ ($0 < x \leq 1$);
   the first reflective layer further includes a plurality of high refractive index layers formed of $Al_yGa_{1-y}As$ ($0 < y < x \leq 1$); and
   a part of at least one of the first and second cavity spacer layers is formed of AlGaInP.

5. The surface-emitting laser device as claimed in claim 4, wherein each of the low refractive index layers included in the first reflective layer includes AlAs.

6. A surface-emitting laser device as claimed in claim 1, wherein the first cavity spacer layer includes a semiconductor material having a thermal conductivity greater than a thermal conductivity of a semiconductor material forming the second cavity spacer layer.

7. The surface-emitting laser device as claimed in claim 6, wherein the semiconductor material forming the second cavity spacer layer includes $(Al_dGa_{1-d})_kIn_{1-k}P$ ($0 < d \leq 1$, $0 \leq k \leq 1$).

8. The surface-emitting laser device as claimed in claim 7, wherein the semiconductor material forming the first cavity spacer layer has the thermal conductivity greater than the thermal conductivity of said $(Al_dGa_{1-d})_kIn_{1-k}P$.

9. The surface-emitting laser device as claimed in claim 8, wherein the first cavity spacer layer includes $(Al_gGa_{1-g})_hIn_{1-h}P$ ($0 \leq g \leq 1$, $0 \leq h \leq 1$) having a band gap smaller than a band gap of said $(Al_dGa_{1-d})_kIn_{1-k}P$.

10. The surface-emitting laser device as claimed in claim 1, whenein
the second reflective layer includes a layered body of m low reflective index layers formed of $(Al_xGa_{1-x})_{0.5}In_{0.5}P$ ($0 \leq x \leq 1$) and m high refractive index layers formed of $(Al_yGa_{1-y})_{0.5}In_{0.5}P$ ($0 \leq y < x \leq 1$).

11. A surface-emitting laser array, comprising:
a plurality of surface-emitting laser devices,
wherein each of the surface-emitting laser devices is formed of the surface-emitting laser device as set forth in claim 1.

12. An image forming apparatus, comprising:
a surface-emitting laser array as a light source for writing, the surface-emitting laser array including a plurality of surface-emitting laser devices,
wherein each of the surface-emitting laser devices, is formed of the surface-emitting laser device as set forth in claim 1.

13. An optical pickup unit, comprising:
the surface-emitting laser device as set forth in claim 1 as a light source.

14. An optical pickup unit, comprising:
a surface-emitting laser array as a light source, the surface-emitting laser array including a plurality of surface-emitting laser devices,
wherein each of the surface-emitting laser devices is formed of the surface-emitting laser device as set forth in claim 1.

15. An optical transmitter module, comprising;
the surface-emitting laser device as set forth in claim 1 as a light source.

16. An optical transmitter module, comprising;
a surface-emitting laser array as a light source, the surface-emitting laser array including a plurality of surface-emitting laser devices,
wherein each of the surface-emitting laser devices is formed of the surface-emitting laser device as set forth in claim 1.

17. An optical transmitter receiver module, comprising:
the surface-emitting laser device as set forth in claim 1 as a light source.

18. An optical transmitter receiver module, comprising:
a surface-emitting laser array as a light source, the surface-emitting laser array including a plurality of surface-emitting laser devices,
wherein each of the surface-emitting laser devices is formed of the surface-emitting laser device as set forth in claim 1.

19. An optical communication system, comprising:
the surface-emitting laser device as set forth in claim 1 as a light source.

20. An optical communication system, comprising:
a surface-emitting laser array as a light source, the surface-emitting laser array including a plurality of surface-emitting laser devices,
wherein each of the surface-emitting laser devices is formed of the surface-emitting laser device as set forth in claim 1.

21. The surface-emitting laser device as claimed in claim 1, wherein the first part of the second reflective layer consists of 0.5 pairs of the one of the one or more low refractive index layers.

22. The surface-emitting laser device as claimed in claim 1, wherein the first part of the second reflective layer comprises a semiconductor distributed Bragg reflector consisting of one pair of the one of the one or more low refractive index layers and one high refractive index layer.

23. The surface-emitting laser device as claimed in claim 1, wherein the second part of the second reflective layer comprises a semiconductor distributed Bragg reflector including one or more pairs of a high refractive index layer and a low refractive index layer.

* * * * *